(12) United States Patent
Yoshizumi et al.

(10) Patent No.: US 11,043,543 B2
(45) Date of Patent: Jun. 22, 2021

(54) TOUCH SENSOR AND TOUCH PANEL

(71) Applicant: Semiconductor Energy Laboratory Co., Ltd., Atsugi (JP)

(72) Inventors: Kensuke Yoshizumi, Isehara (JP); Hideaki Shishido, Atsugi (JP); Kazunori Watanabe, Machida (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 80 days.

(21) Appl. No.: 15/188,462

(22) Filed: Jun. 21, 2016

(65) Prior Publication Data
US 2017/0010712 A1 Jan. 12, 2017

(30) Foreign Application Priority Data
Jul. 7, 2015 (JP) .............................. JP2015-135999

(51) Int. Cl.
*G06F 3/041* (2006.01)
*H01L 27/32* (2006.01)
*G06F 3/044* (2006.01)

(52) U.S. Cl.
CPC ........ *H01L 27/3246* (2013.01); *G06F 3/0412* (2013.01); *G06F 3/0443* (2019.05); *G06F 3/0446* (2019.05); *H01L 27/323* (2013.01); *H01L 27/3276* (2013.01); *G06F 2203/04102* (2013.01); *G06F 2203/04103* (2013.01);
(Continued)

(58) Field of Classification Search
CPC .... G06F 3/0412; G06F 3/0443; G06F 3/0446; G06F 3/04102; G06F 3/04103
See application file for complete search history.

(56) References Cited

U.S. PATENT DOCUMENTS

| 8,305,459 B2 | 11/2012 | Kanemitsu et al. |
| 9,054,058 B2 | 6/2015 | Sugisawa et al. |
| 9,088,006 B2 | 7/2015 | Yamazaki et al. |

(Continued)

FOREIGN PATENT DOCUMENTS

| CN | 101739187 A | 6/2010 |
| CN | 101872273 A | 10/2010 |

(Continued)

OTHER PUBLICATIONS

Chinese Office Action (Application No. 201610533726.0) dated Sep. 2, 2020.

*Primary Examiner* — William Boddie
*Assistant Examiner* — Jeffrey Parker
(74) *Attorney, Agent, or Firm* — Robinson Intellectual Property Law Office; Eric J. Robinson

(57) ABSTRACT

A thin touch panel is provided. A touch panel with a simple structure is provided. The number of components of a touch panel is reduced. Each of a pair of wirings of a touch sensor is positioned closer to a substrate supporting light-emitting elements than a common electrode is, and includes a portion positioned between two adjacent pixel electrodes in a plan view. Furthermore, an island-like structure body with an inverse tapered shape is provided over each of the pair of wirings. A conductive layer in an electrically floating state is provided over the structure body. Each conductive layer has a portion overlapping with one of the pair of wirings. Moreover, the conductive layer and the common electrode are formed using the same conductive film.

9 Claims, 42 Drawing Sheets

(52) U.S. Cl.
CPC ............... *G06F 2203/04112* (2013.01); *H01L 2251/5338* (2013.01)

(56) References Cited

U.S. PATENT DOCUMENTS

| | | | |
|---|---|---|---|
| 9,337,244 B2* | 5/2016 | Hatano | .................. H01L 51/525 |
| 2010/0108409 A1* | 5/2010 | Tanaka | .................... G06F 3/044 |
| | | | 178/18.06 |
| 2010/0271328 A1 | 10/2010 | Sekiguchi et al. | |
| 2010/0316790 A1* | 12/2010 | Li | ......................... G02F 1/1339 |
| | | | 427/68 |
| 2012/0217516 A1* | 8/2012 | Hatano | ............... H01L 27/3246 |
| | | | 257/88 |
| 2013/0314123 A1 | 11/2013 | Takemura | |
| 2014/0247239 A1* | 9/2014 | Jamshidi-Roudbari | ...................... |
| | | | G06F 3/0414 |
| | | | 345/174 |
| 2014/0285732 A1 | 9/2014 | Tanabe et al. | |
| 2014/0313434 A1* | 10/2014 | Kim | .................... G02F 1/13338 |
| | | | 349/12 |
| 2015/0091629 A1 | 4/2015 | Ishizu et al. | |
| 2015/0372026 A1 | 12/2015 | Sato | |

FOREIGN PATENT DOCUMENTS

| | | |
|---|---|---|
| EP | 2187294 A | 5/2010 |
| EP | 2244171 A | 10/2010 |
| JP | 2010-272105 A | 12/2010 |
| JP | 2012-190794 A | 10/2012 |
| JP | 2014-197522 A | 10/2014 |
| WO | WO-2012/115016 | 8/2012 |

\* cited by examiner

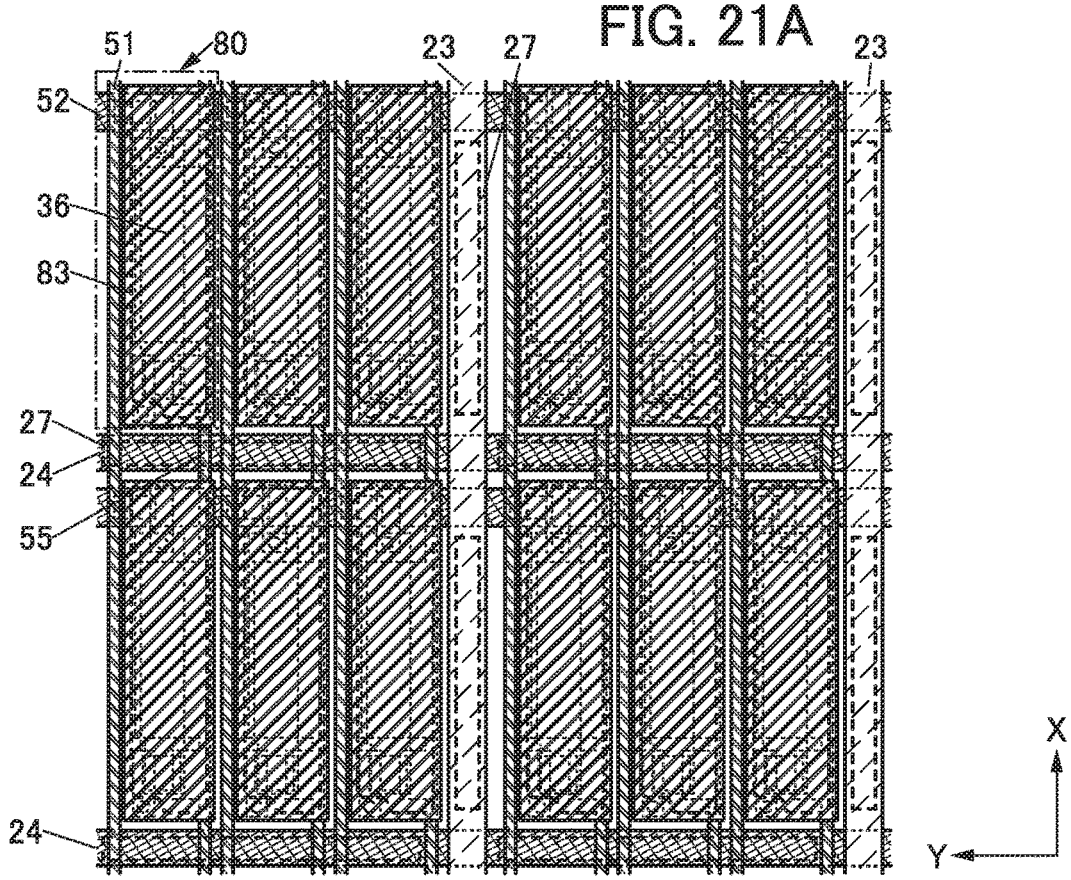
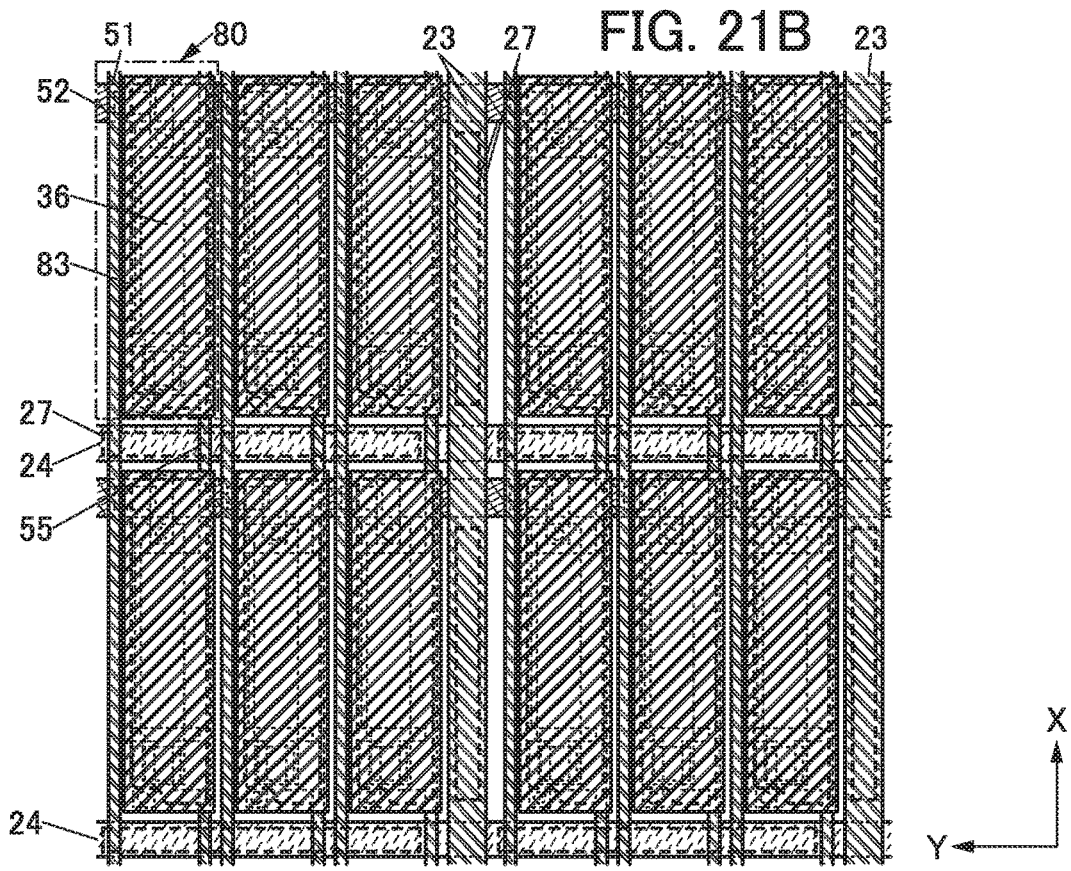

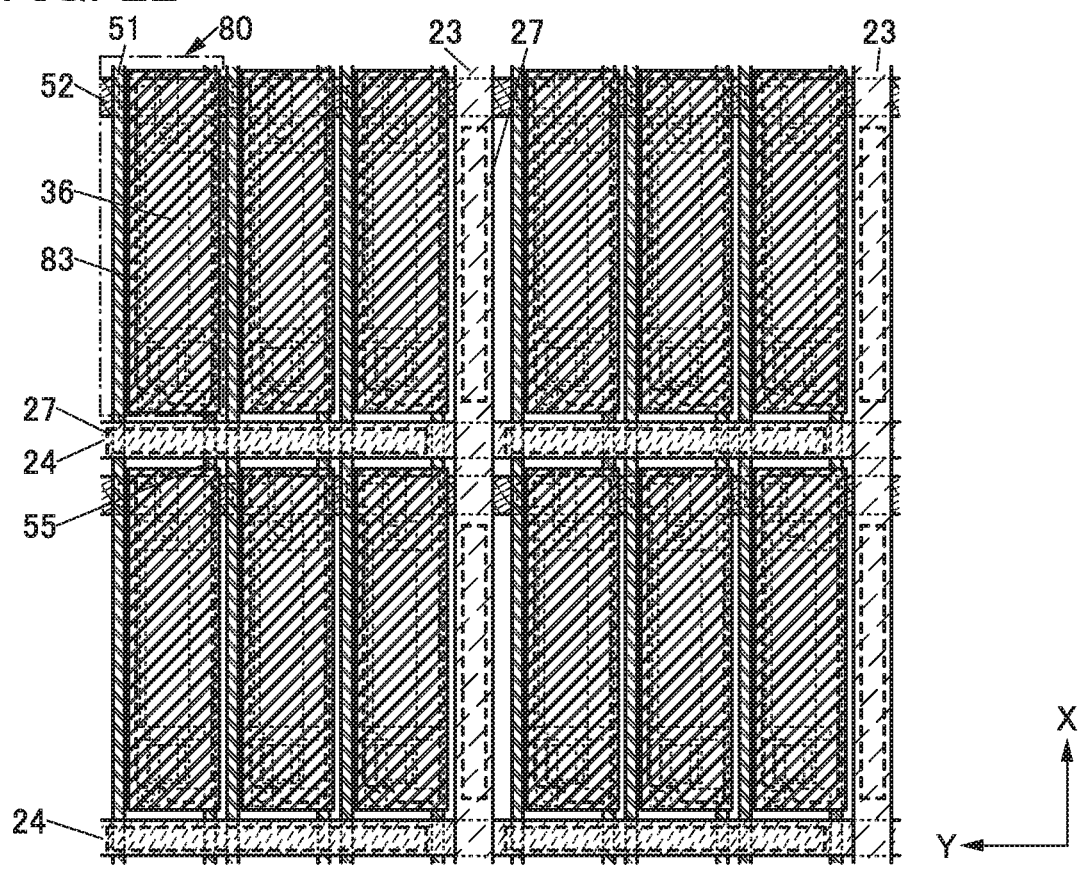

FIG. 32A1
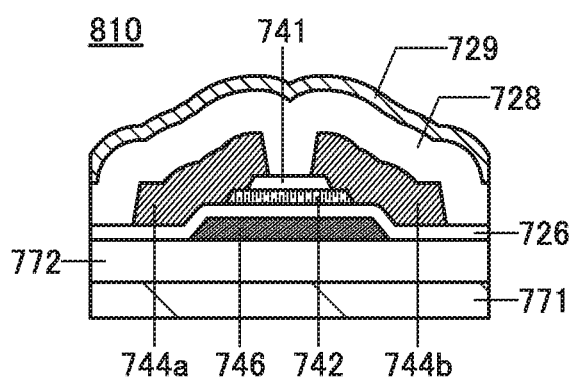
FIG. 32A2
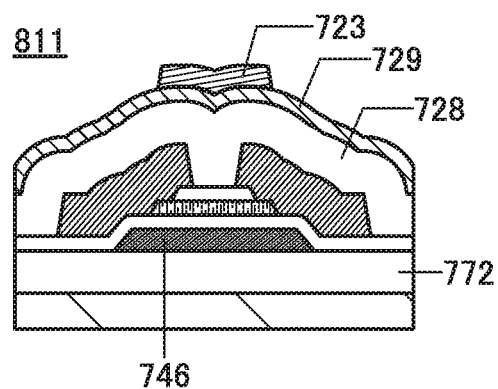
FIG. 32B1
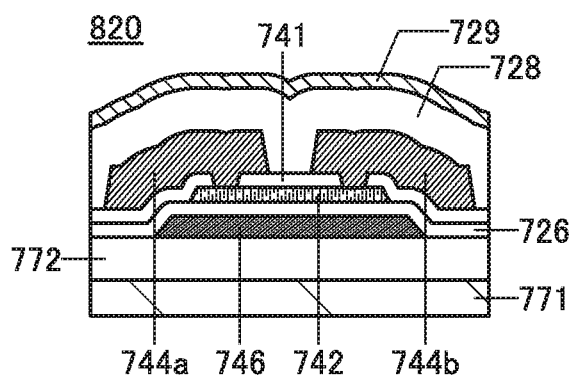
FIG. 32B2
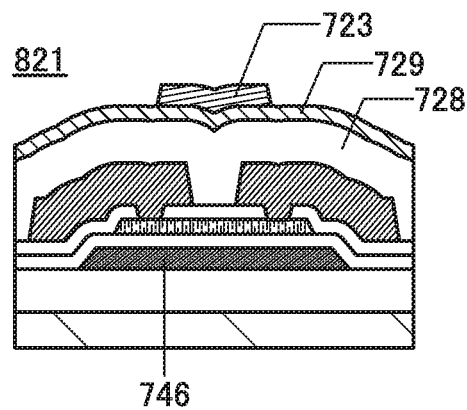
FIG. 32C1
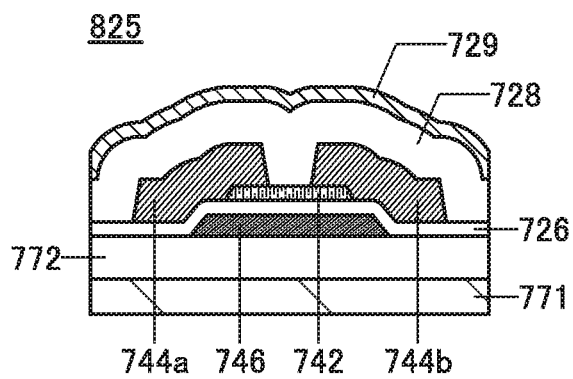
FIG. 32C2
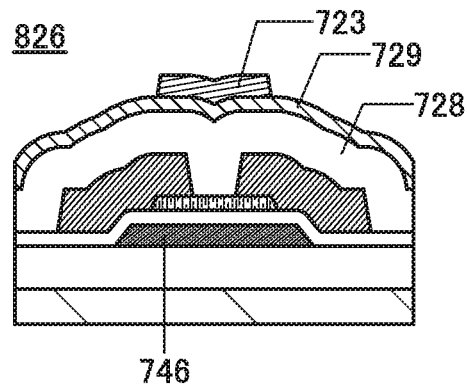

FIG. 33A1
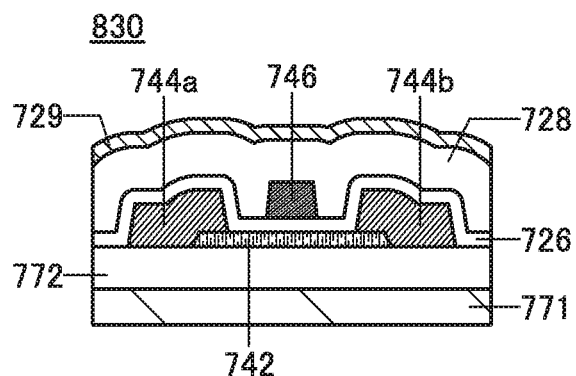
FIG. 33A2
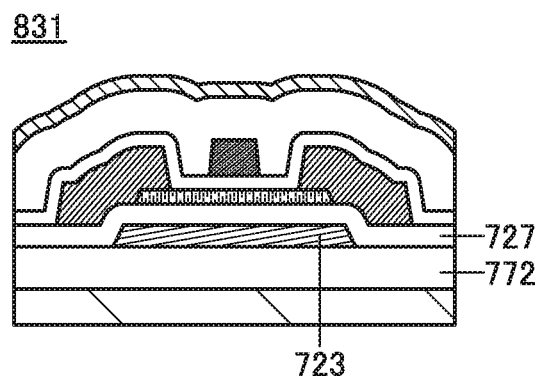
FIG. 33A3
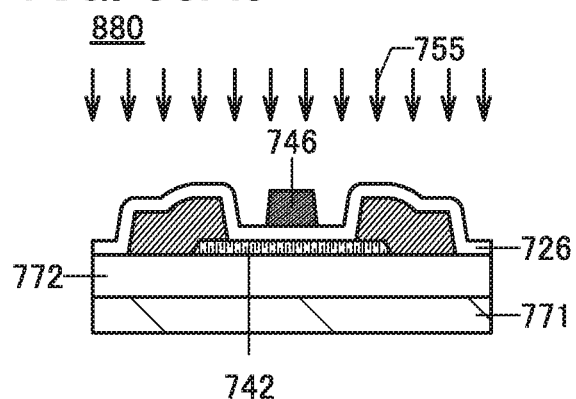
FIG. 33B1
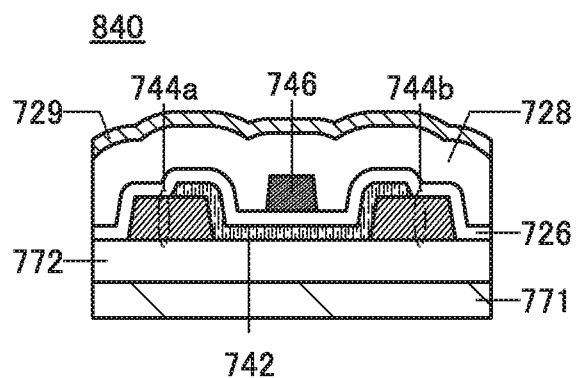
FIG. 33B2
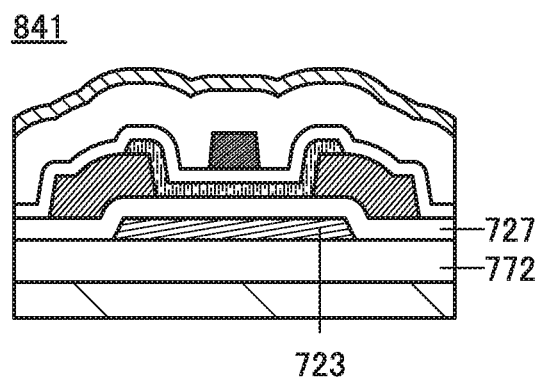

FIG. 34A1
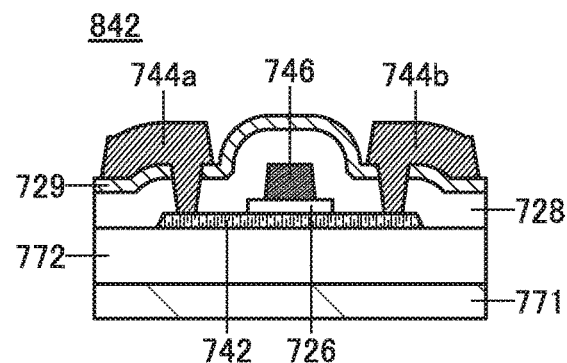
FIG. 34A2
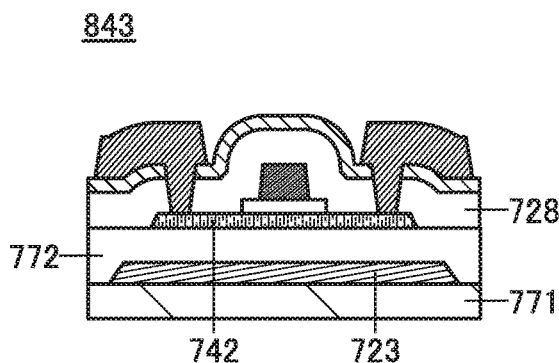
FIG. 34A3
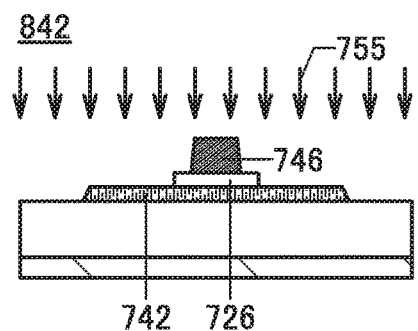
FIG. 34B1
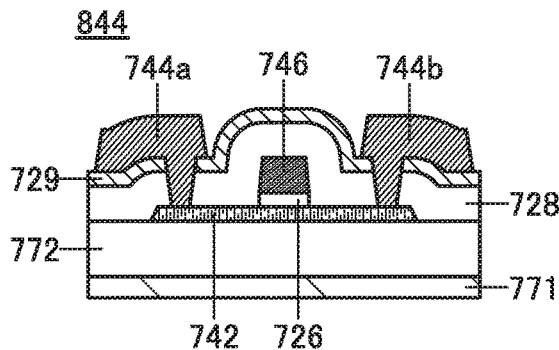
FIG. 34B2
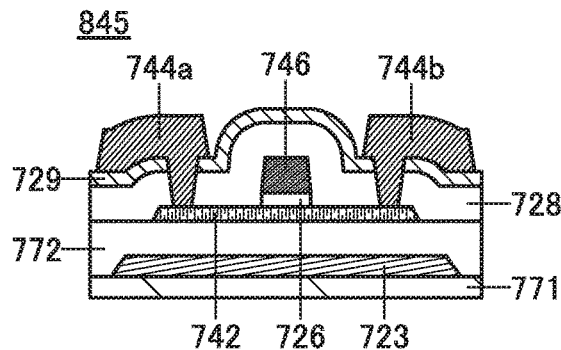
FIG. 34C1
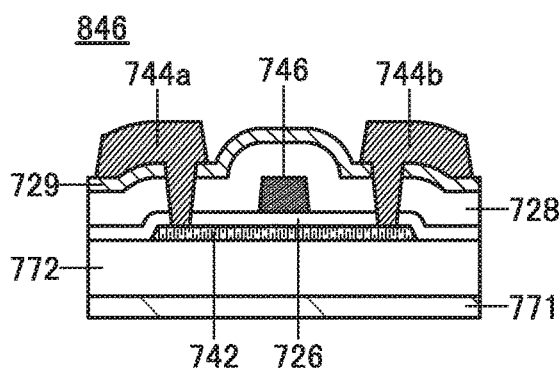
FIG. 34C2
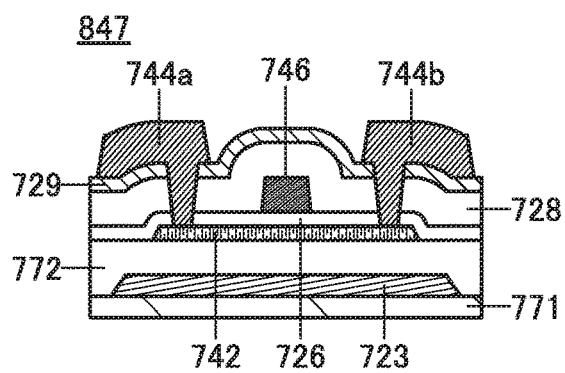

FIG. 40A
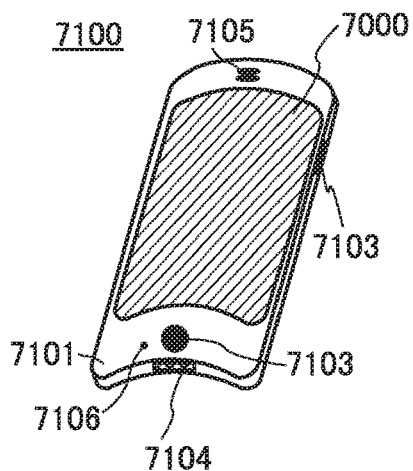
FIG. 40B
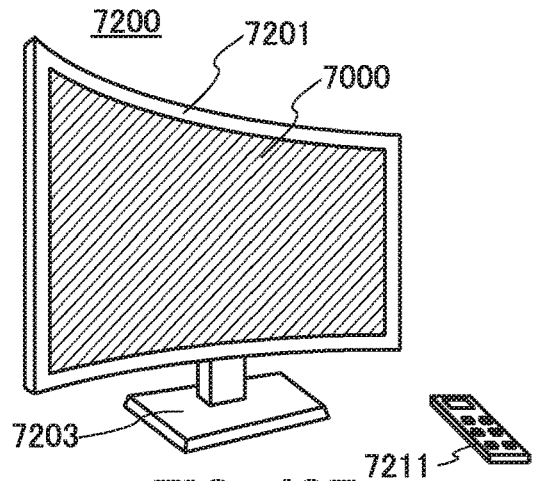
FIG. 40C1
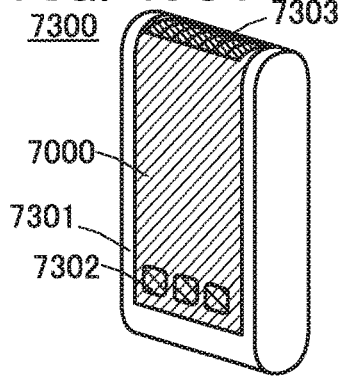
FIG. 40D
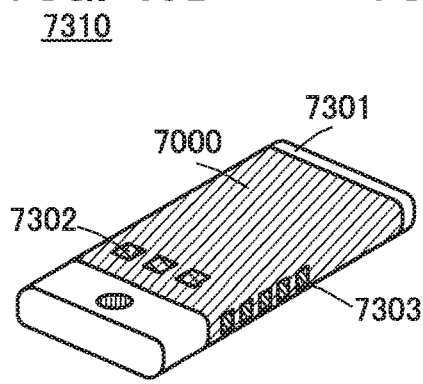
FIG. 40E
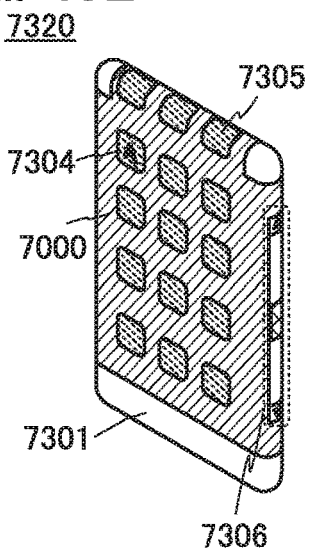
FIG. 40C2
FIG. 40F
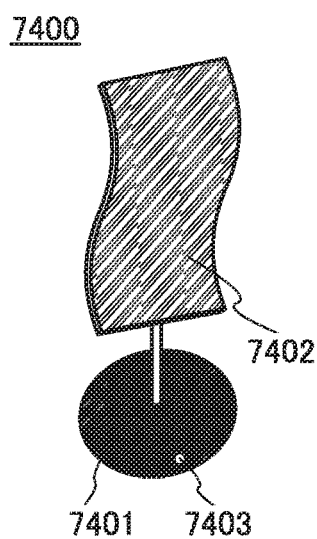
FIG. 40G
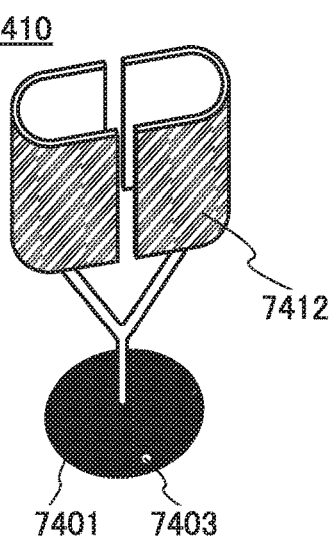
FIG. 40H
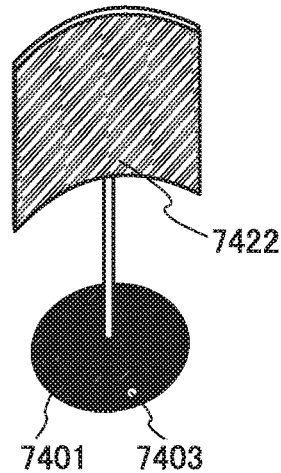

FIG. 41A1
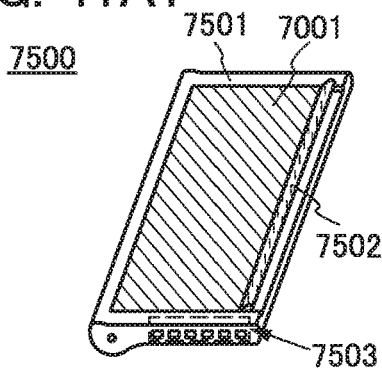
FIG. 41B
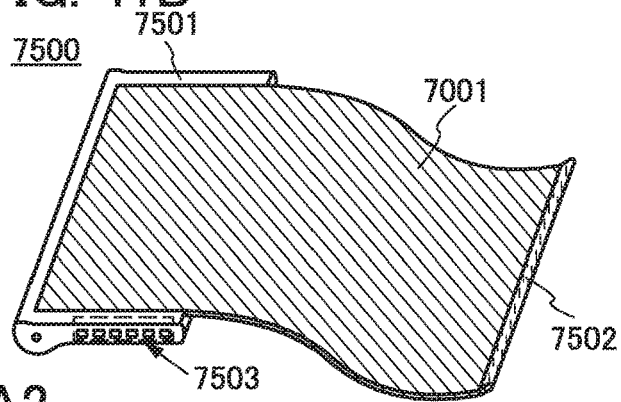
FIG. 41A2
FIG. 41C
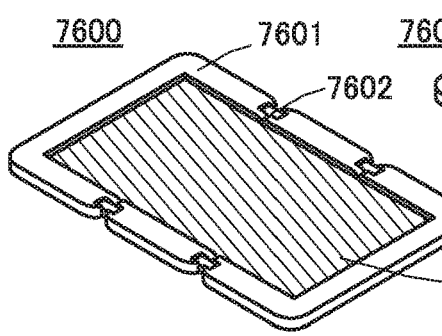
FIG. 41D
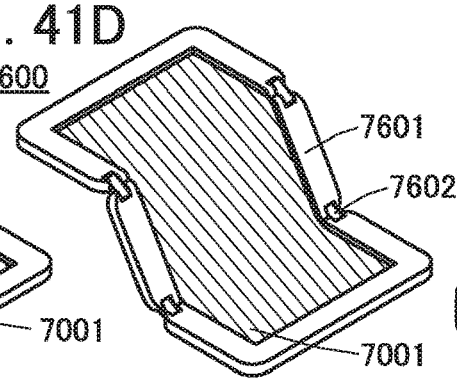
FIG. 41E
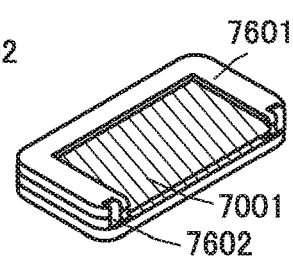
FIG. 41F
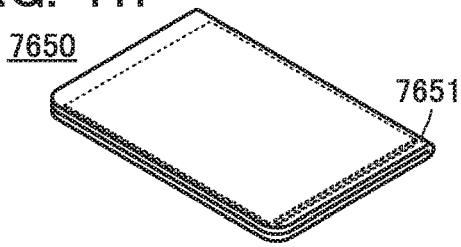
FIG. 41G
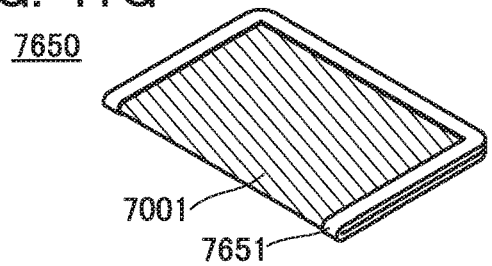
FIG. 41H
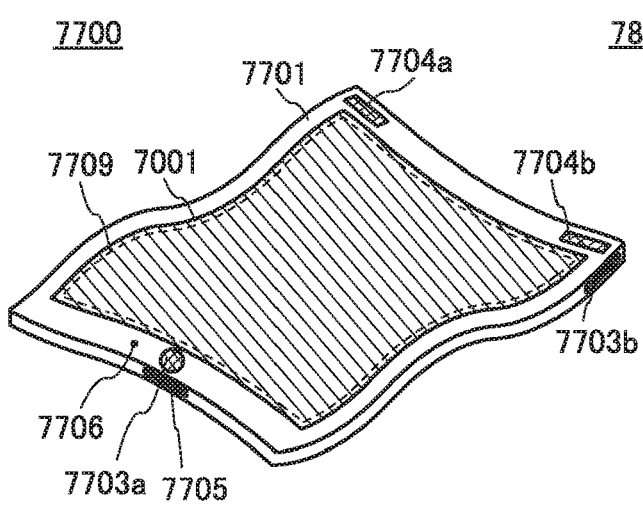
FIG. 41I
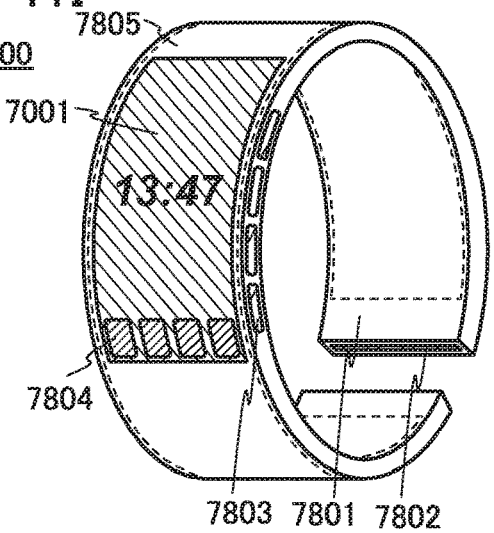

TOUCH SENSOR AND TOUCH PANEL

BACKGROUND OF THE INVENTION

1. Field of the Invention

One embodiment of the present invention relates to an input device. One embodiment of the present invention relates to a display device. One embodiment of the present invention relates to an input/output device. One embodiment of the present invention relates to a touch panel.

Note that one embodiment of the present invention is not limited to the above technical field. Examples of the technical field of one embodiment of the present invention disclosed in this specification include a semiconductor device, a display device, a light-emitting device, a power storage device, a memory device, an electronic device, a lighting device, an input device, an input/output device, a driving method thereof, and a manufacturing method thereof.

Note that in this specification and the like, a semiconductor device refers to any device that can function by utilizing semiconductor characteristics. Not only a semiconductor element such as a transistor, but also a semiconductor circuit, an arithmetic device, and a memory device are each an embodiment of a semiconductor device. An imaging device, a display device, a liquid crystal display device, a light-emitting device, an input device, an input/output device, an electro-optical device, a power generation device (including a thin film solar cell, an organic thin film solar cell, and the like), and an electronic device each include a semiconductor device in some cases.

2. Description of the Related Art

In recent years, display devices provided with touch sensors as position-input devices have been in practical use. A display device provided with a touch sensor is called, for example, a touch panel or a touch screen. Examples of a portable information terminal provided with a touch panel include a smartphone and a tablet terminal.

An example of a display device is the one including a light-emitting element such as an organic electroluminescent (EL) element. For example, Patent Document 1 discloses a flexible light-emitting device using an organic EL element.

REFERENCE

Patent Document

[Patent Document 1] Japanese Published Patent Application No. 2014-197522

SUMMARY OF THE INVENTION

A touch panel that has been required includes a display panel and additionally has a function, as a user interface, that enables data input when a finger, a stylus, or the like touches a screen.

The display quality of the touch panel needs to be improved; for example, the contrast, luminance, and color reproducibility are necessary to increase.

As an example of the structure of the touch panel, a substrate provided with a touch sensor can be attached to a display surface of a display panel. However, this structure causes problems of an inevitable increase in the thickness of the touch panel, an increased number of components, and the like.

An object of one embodiment of the present invention is to provide a thin touch panel. Another object is to provide a touch panel having a simple structure. Another object is to reduce the number of components of a touch panel. Another object is to provide a touch panel with high display quality. Another object is to provide an in-cell touch panel using an organic EL element. Another object is to provide a bendable touch panel. Another object is to provide a lightweight touch panel. Another object is to provide a touch panel with high detection sensitivity.

Another object is to provide a novel input device, a novel output device, a novel input/output device, or the like. Note that the description of these objects does not exclude the existence of other objects. In one embodiment of the present invention, there is no need to achieve all the objects. Other objects can be derived from the description of the specification, the drawings, the claims, and the like.

One embodiment of the present invention is a touch sensor including a wiring, a structure body, and a conductive layer. The structure body is provided over the wiring and has a portion overlapping with the wiring. The conductive layer is provided over the structure body, has a portion overlapping with the wiring, and is in a floating state. The conductive layer and the wiring have capacitive coupling.

Another embodiment of the present invention is a touch sensor including a first wiring, a second wiring, a first structure body, a second structure body, a first conductive layer, and a second conductive layer. The first structure body is provided over the first wiring, has a portion overlapping with the first wiring, and has an inverse tapered shape. The first conductive layer is provided over the first structure body, has a portion overlapping with the first wiring, and is in a floating state. The second structure body is provided over the second wiring, has a portion overlapping with the second wiring, and has an inverse tapered shape. The second conductive layer is provided over the second structure body, has a portion overlapping with the second wiring, and is in a floating state. The first conductive layer and the first wiring have capacitive coupling, the second conductive layer and the second wiring have capacitive coupling, and the first conductive layer and the second conductive layer have capacitive coupling.

Another embodiment of the present invention is a touch panel including a plurality of light-emitting elements, a first wiring, a second wiring, a first structure body, and a first conductive layer. The light-emitting elements are arranged in a matrix and each include a first electrode, a second electrode, and an EL layer positioned between the first electrode and the second electrode. The first structure body is provided over the first wiring, has a portion overlapping with the first wiring, and has an inverse tapered shape. The first conductive layer is provided over the first structure body and has a portion overlapping with the first wiring. The second electrode and the first conductive layer are formed using the same conductive film. The first conductive layer is in a floating state. The first wiring and the second wiring have an intersection portion. One of the first wiring and the second wiring is configured to receive a sensor signal. The other of the first wiring and the second wiring is configured to supply a signal to a detection circuit.

In the above structure, a second structure body and a second conductive layer are preferably provided. The second structure body is provided over the second wiring, has a portion overlapping with the second wiring, and has an inverse tapered shape. The second conductive layer is provided over the second structure body and has a portion overlapping with the second wiring. The second electrode and the second conductive layer are formed using the same conductive film, and the second conductive layer is in a floating state.

In the above structure, a signal line and a scan line are preferably provided. The first wiring preferably includes a portion that is formed by processing the same conductive film as the signal line, the scan line, or the first electrode. Alternatively, in the above structure, each of the first wiring and the second wiring preferably includes a portion that is formed by processing the same conductive film as the signal line, the scan line, or the first electrode.

In the above structure, a third conductive layer is preferably provided over the first conductive layer. The third conductive layer has conductivity and an island-like top surface, and is in a floating state. In that case, preferably, the third conductive layer is configured to block visible light and has a portion positioned between two adjacent light-emitting elements in a plan view.

In the above structure, preferably, a third conductive layer is provided over the first conductive layer and a fourth conductive layer is provided over the second conductive layer. Preferably, the third conductive layer and the fourth conductive layer have conductivity and an island-like top surface, and are in a floating state. In that case, preferably, the third conductive layer and the fourth conductive layer are configured to block visible light, the third conductive layer has a portion positioned between two adjacent light-emitting elements in a plan view, and the fourth conductive layer has a portion positioned between other two adjacent light-emitting elements in a plan view.

In the above structure, the plurality of light-emitting elements are preferably arranged in a matrix in a first direction and a second direction crossing the first direction. Preferably, the first wiring has a portion positioned between two light-emitting elements adjacent in the second direction in a plan view, and the second wiring has a portion positioned between two light-emitting elements adjacent in the first direction in a plan view.

In the above structure, preferably, the first wiring has a mesh shape that surrounds at least one light-emitting element in a plan view, and the second wiring has a mesh shape that surrounds at least another light-emitting element in a plan view.

In the above structure, preferably, each of the plurality of light-emitting elements is a white-light-emitting element and a coloring layer is provided over the light-emitting elements.

Note that in this specification and the like, a display panel has a function of displaying (outputting) an image or the like on (to) a display surface; hence, the display panel is one embodiment of an output device.

In this specification and the like, a structure in which a connector such as a flexible printed circuit (FPC) or a tape carrier package (TCP) is attached to a substrate of a display panel, or a structure in which an integrated circuit (IC) is mounted on a substrate by a chip on glass (COG) method or the like is referred to as a display panel module or a display module, or simply referred to as a display panel or the like in some cases.

In this specification and the like, a touch sensor has a function of sensing contact or approach of an object such as a finger or a stylus; hence, the touch sensor is one embodiment of an output device.

In this specification and the like, a substrate provided with a touch sensor is referred to as a touch sensor panel or simply referred to as a touch sensor or the like in some cases. Furthermore, in this specification and the like, a structure in which a connector such as an FPC or a TCP is attached to a substrate of a touch sensor panel, or a structure in which an integrated circuit (IC) is mounted on a substrate by a COG method or the like is referred to as a touch sensor panel module, a touch sensor module, or a sensor module, or simply referred to as a touch sensor or the like in some cases.

Note that in this specification and the like, a touch panel has a function of displaying (outputting) an image or the like on (to) a display surface and a function as a touch sensor capable of sensing contact or approach of an object such as a finger or a stylus on or to the display surface. Therefore, the touch panel is one embodiment of an input/output device.

A touch panel can be referred to, for example, a display panel (or a display device) with a touch sensor or a display panel (or a display device) having a touch sensor function.

A touch panel can include a display panel and a touch sensor panel. Alternatively, a touch panel can have a function of a touch sensor inside a display panel.

In this specification and the like, a structure in which a connector such as an FPC or a TCP is attached to a substrate of a touch panel, or a structure in which an integrated circuit (IC) is mounted on a substrate by a COG method or the like is referred to as a touch panel module or a display module, or simply referred to as a touch panel or the like in some cases.

According to one embodiment of the present invention, a thin touch panel can be provided. Alternatively, a touch panel with a simple structure can be provided. Alternatively, the number of components of a touch panel can be reduced. Alternatively, a touch panel with high display quality can be provided. Alternatively, an in-cell touch panel using an organic EL element can be provided. Alternatively, a bendable touch panel can be provided. Alternatively, a lightweight touch panel can be provided. Alternatively, a touch panel with high detection sensitivity can be provided.

Note that one embodiment of the present invention does not necessarily achieve all the effects listed above. Other effects can be derived from the description of the specification, the drawings, the claims, and the like.

BRIEF DESCRIPTION OF THE DRAWINGS

In the accompanying drawings:

FIGS. 21A and 21B illustrate structure examples of a touch panel module of an embodiment;

FIG. 22 illustrates a structure example of a touch panel module of an embodiment;

FIGS. 32A1, 32A2, 32B1, 32B2, 32C1, and 32C2 are cross-sectional views each illustrating one mode of a transistor;

FIGS. 33A1, 33A2, 33A3, 33B1, and 33B2 are cross-sectional views each illustrating one mode of a transistor;

FIGS. 34A1, 34A2, 34A3, 34B1, 34B2, 34C1 and 34C2 are cross-sectional views each illustrating one mode of a transistor;

FIGS. 40A to 40H illustrate electronic devices of an embodiment;

FIGS. 41A to 41I illustrate electronic devices of an embodiment; and

DETAILED DESCRIPTION OF THE INVENTION

Figure 1A:
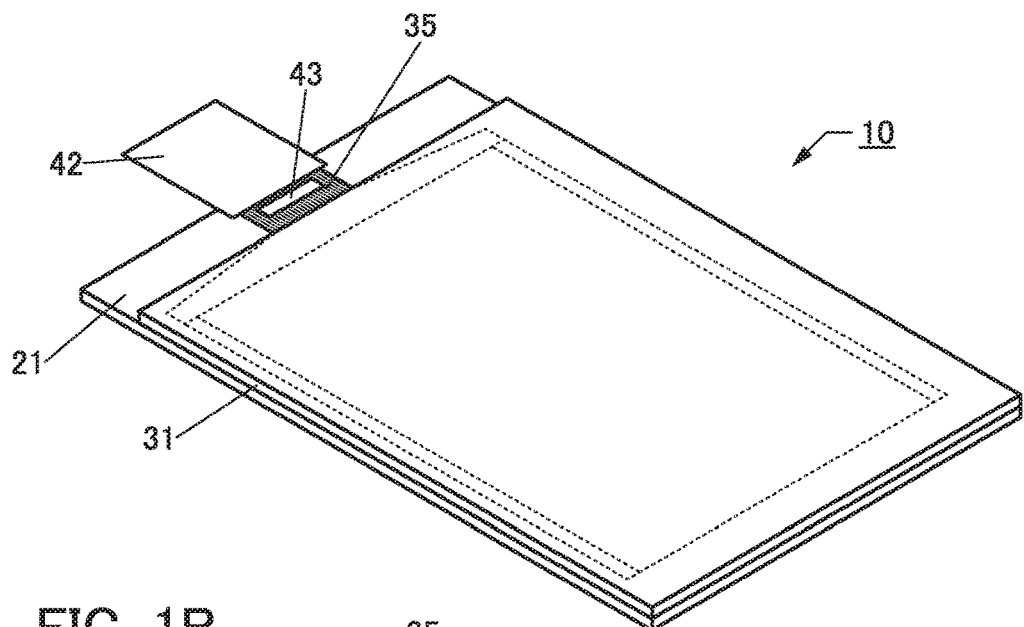
FIGS. 1A and 1B illustrate structure examples of a touch panel module of an embodiment.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and the description of such portions is not repeated. Furthermore, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, the ordinal numbers such as "first" and "second" are used in order to avoid confusion among components, and the terms do not limit the components numerically.

Embodiment 1

In this embodiment, a structure example of a touch panel of one embodiment of the present invention will be described. In particular, an example of using a capacitive touch sensor for the touch panel of one embodiment of the present invention will be described below.

Examples of the capacitive touch sensor include a surface capacitive touch sensor and a projected capacitive touch sensor. Examples of the projected capacitive touch sensor include a self-capacitive touch sensor and a mutual capacitive touch sensor. The mutual capacitive touch sensor is preferably used because multiple points can be sensed simultaneously.

The touch panel of one embodiment of the present invention includes a plurality of light-emitting elements arranged in a matrix. Each light-emitting element includes a first electrode (hereinafter referred to as a pixel electrode) serving as a pixel electrode, an EL layer, and a second electrode (hereinafter referred to as a common electrode) serving as a common electrode. The EL layer is interposed between the pixel electrode and the common electrode.

Each pixel includes at least one pixel electrode. In contrast, a common electrode is shared with a plurality of light-emitting elements. At least one EL layer may be formed in each pixel or an EL layer may be shared with a plurality of light-emitting elements.

A touch sensor that can be used for the touch panel of one embodiment of the present invention includes a pair of wirings. Capacitive coupling is formed between the pair of wirings. The capacitance between the pair of wirings changes when an object touches or approaches a surface of the touch panel (also referred to as touching or touch operation), which enables sensing.

Each of the pair of wirings includes a portion positioned between two adjacent pixel electrodes in a plan view. Note that part of the wiring may include a portion overlapping with the pixel electrode. In addition, each of the pair of wirings is positioned closer to the substrate supporting the light-emitting elements than the aforementioned common electrode is.

Furthermore, an island-like structure body with an inverse tapered shape is provided over each of the pair of wirings. A conductive layer in an electrically floating state is provided over the structure body. Each conductive layer has a portion overlapping with one of the pair of wirings.

For example, the structure body can be formed before the common electrode is formed. When a conductive film serving as the common electrode is formed after the structure body is formed, a conductive layer that is electrically isolated from the common electrode and is in an electrically floating state can be formed simultaneously on a top surface of the structure body.

With this structure, capacitive coupling is formed between one of the pair of wirings and the conductive layer over the structure body, and touch operation can be sensed through the conductive layer.

In the case where the structure body with an inverse tapered shape is not provided, a common electrode is formed between the pair of wirings and a display surface (a touch surface). Accordingly, a signal indicating touch operation is blocked by the common electrode so as not to reach the wirings, making it difficult to sense the touch operation.

Alternatively, part of the common electrode may be removed by etching and an opening may be provided in a portion overlapping with the wiring. In that case, however, a light-emitting element might be damaged in the etching step. In one embodiment of the present invention, the structure body can be provided before the light-emitting element is formed. Furthermore, the conductive layer in an electrically floating state can be formed over the structure body in a self-aligned manner without going through the step of removing part of the common electrode as described above. As a result, a touch panel with high touch sensitivity can be achieved.

The touch panel of one embodiment of the present invention can be preferably used particularly when a side opposite to the side of the substrate supporting the light-emitting element is used as a display and a touch surface. Typically, the touch panel can be preferably used for a display device using a top-emission light-emitting element. Furthermore, according to one embodiment of the present invention, an in-cell touch panel can be achieved even in a top-emission display device that includes a white-light-emitting EL layer shared with pixels of different colors and achieves a full-color display with use of a color filter.

A more specific structure example of one embodiment of the present invention will be described below with reference to drawings.

[Structure Example]

FIG. 1A is a schematic perspective view of a touch panel module 10 of one embodiment of the present invention. In the touch panel module 10, a substrate 21 and a substrate 31 are attached to each other.

Figure 1B:
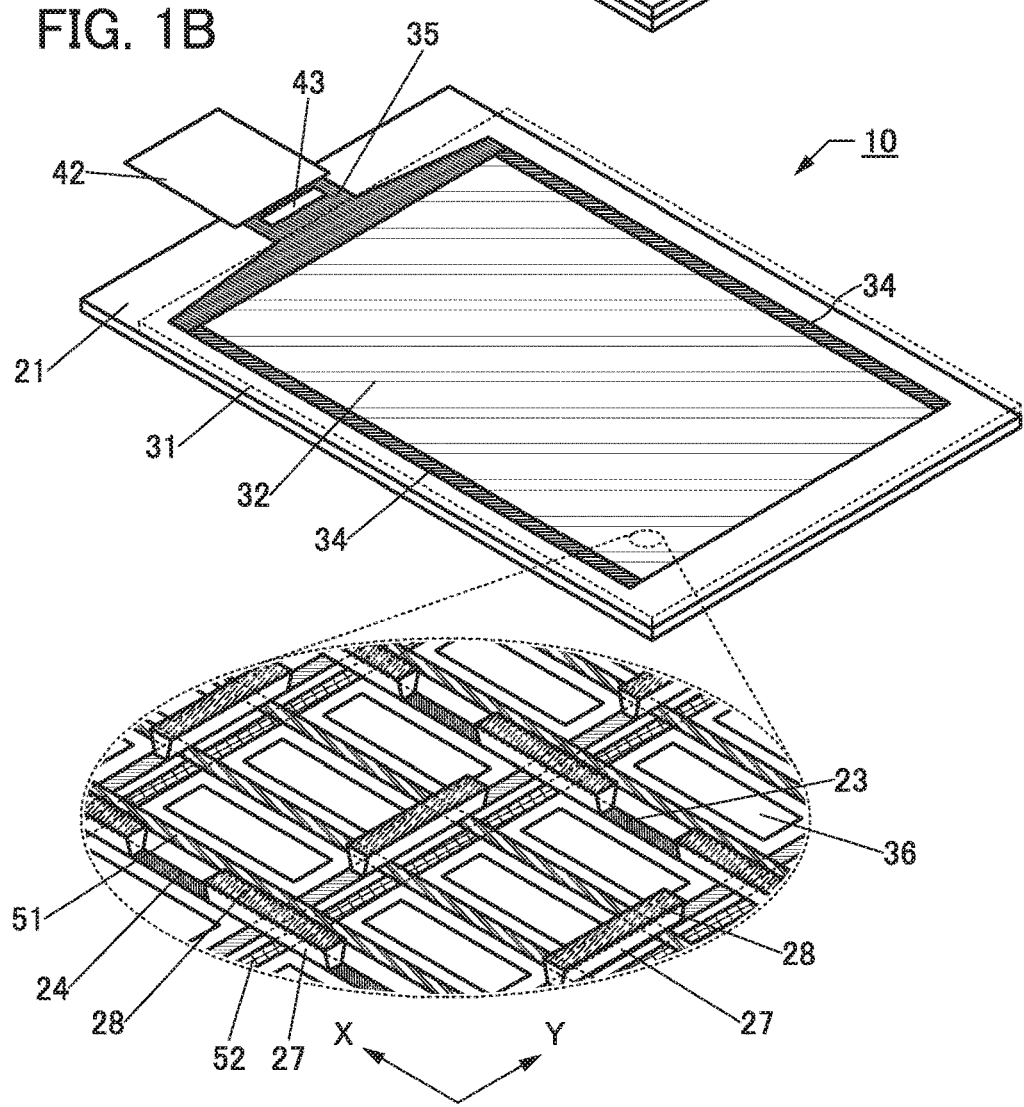

FIG. 1B illustrates a structure of the substrate 21, and the substrate 31 is denoted by a broken line. A display portion 32 including a plurality of pixel circuits, a circuit 34, a wiring 35, and the like are provided over the substrate 21. An IC 43 and an FPC 42 are mounted over the substrate 31.

FIG. 1B is an enlarged view of part of the display portion 32. The display portion 32 includes a plurality of signal lines 51 extending in the X direction, a plurality of scan lines 52 extending in the Y direction, and a plurality of pixel electrodes 36 arranged in a matrix in the X direction and the Y direction. Furthermore, a plurality of wirings 23 extending in the X direction and a plurality of wirings 24 extending in the Y direction are provided in the display portion 32. The wiring 23 includes a portion parallel to the signal line 51 and the wiring 24 includes a portion parallel to the scan line 52.

In addition, a plurality of island-like structure bodies 27 are provided over the wiring 23 and the wiring 24. The structure bodies 27 each have an inverse tapered shape and overlap with the wiring 23 or the wiring 24. A conductive layer 28 is provided over the island-like structure bodies 27. The conductive layer 28 is preferably in an electrically floating state.

The wiring 23 and the wiring 24 function as a pair of electrodes of the touch sensor.

Capacitive coupling is formed between the conductive layer 28, which is in an electrically floating state, and one of the wirings 23 and 24. The conductive layer 28 is closer to a touch surface than the wirings 23 and 24 are. Hence, a signal can be transmitted from the wiring 23 to the wiring 24 or from an object to the wiring 23 or 24 through the conductive layer 28. That is, the conductive layer 28 can have a function of an electrode of the touch sensor.

As described above, in the touch panel module of one embodiment of the present invention, the pair of wirings functioning as electrodes of the touch sensor and the conductive layer 28 are provided over a substrate over which the pixel electrode 36, the signal line 51, the scan line 52, and the like are provided. Thus, the pair of wirings of the touch sensor can be formed through the same steps as the pixel electrode 36, the signal line 51, the scan line 52, and the like which are used to display an image, reducing the manufacturing costs.

For example, in the case of employing a projected mutual-capacitive driving method, one of the wirings 23 and 24 can be used as a transmission-side wiring (electrode), and the other thereof can be used as a reception-side wiring (electrode). In the case of employing a projected self-capacitive driving method, each of the wirings 23 and 24 can serve as both a transmission wiring and a reception wiring. For example, the transmission-side wiring is configured to receive a sensor signal from a sensor driver circuit or the like. In contrast, the reception-side wiring is configured to supply a signal to a detection circuit. The detection circuit may include, for example, an amplifier circuit, a comparator circuit, an analog to digital converter circuit, or an arithmetic circuit.

In the case of employing a projected mutual-capacitive driving method, it is possible to utilize the capacitive coupling between the conductive layer 28 over the wiring 23 and the conductive layer 28 over the wiring 24. In other words, a plurality of capacitors are connected in series between the wirings 23 and 24, which enables signal transmission and reception between the wirings 23 and 24.

For example, a low-resistance material is preferably used for the wirings 23 and 24. As an example, metal such as silver, copper, or aluminum may be used. Alternatively, a metal nanowire including a number of conductors with an extremely small width (for example, a diameter of several nanometers) may be used. Examples of such a metal nanowire include an Ag nanowire, a Cu nanowire, and an Al nanowire. In the case of using an Ag nanowire, a light transmittance of 89% or more and a sheet resistance of 40 ohm/square or more and 100 ohm/square or less can be achieved. Note that because such a metal nanowire provides high transmittance, the metal nanowire may be used for an electrode of the display element, e.g., a pixel electrode or a common electrode.

Alternatively, conductive oxide can be used for at least one of the wirings 23 and 24. For example, a conductive material containing indium oxide, tin oxide, or zinc oxide may be used.

When a thin film is deposited over the structure body 27, the obtained layer is physically separated from a layer formed over another surface by the structure body 27. Accordingly, when a conductive thin film is deposited over the island-like structure body 27, the island-like conductive layer 28 is formed in a self-aligned manner over the structure body 27.

The structure body 27 typically has, but is not limited to, an inverse tapered shape. The structure body 27 may have, for example, a T-shaped cross section, a side surface partly narrowed, or a side surface partly protruding in a direction parallel to a formation surface. For example, the taper angle of the side surface of the structure body 27 can be greater than 90°. Note that the taper angle refers to an angle formed by the side surface and the bottom surface of a layer or the like having a tapered shape when observed from a direction perpendicular to a cross section (a surface perpendicular to the surface of the substrate). Alternatively, the angle formed by at least part of the side surface of the structure body 27 and the formation surface can be, for example, less than 90°. Further alternatively, the angle formed by the normal vector of at least part of the side surface of the structure body 27 and the normal vector of the formation surface can be, for example, less than 90°. Note that even in the case where the side surface of the structure body 27 is perpendicular to the formation surface, a thin film formed over the structure body 27 can be physically separated when the structure body 27 is sufficiently high.

The structure body 27 can be formed using an insulating or a conductive material.

In the case where the structure body 27 has an insulating property, the structure body 27 can serve as a dielectric of a capacitor formed between the conductive layer 28 and the wiring 23 or 24. In that case, when the structure body 27 is formed using a material having a higher dielectric constant than the material for an insulating layer supporting the structure body 27 or an insulating layer supporting the pixel electrode 36, the capacitance between the conductive layer 28 and the wiring 23 or 24 can be increased, resulting in improved sensitivity of the touch sensor.

In contrast, the structure body 27 is preferably in an electrically floating state when having conductivity. Capacitive coupling is formed between the structure body 27 and the wiring 23 or 24; thus, a signal can be transmitted between the structure body 27 and the wiring 23 or 24. In that case, when the structure body 27 is in contact with the conductive layer 28 or when the structure body 27 is electrically connected to the conductive layer 28 through a conductive material, a stack of the structure body 27 and the conductive layer 28 (including layers therebetween) can have a function of an electrode of the touch sensor. In the case where an insulating layer is provided between the structure body 27 and the conductive layer 28, capacitive coupling is formed between the structure body 27 and the conductive layer 28; thus, a signal can be transmitted between the structure body 27 and the conductive layer 28. Hence, each of the structure body 27 and the conductive layer 28 can have a function of an electrode of the touch sensor.

A display element using the pixel electrode 36 as an electrode can be applied to the display portion 32. Here, a light-emitting element such as an organic EL element can be preferably used as the display element.

Note that the display element is not limited to the above, and a variety of elements can be used. Examples of the display element include transmissive, reflective, or semi-transmissive liquid crystal elements; display elements (electronic ink) that perform display by an electrophoretic method, an electronic liquid powder (registered trademark) method, or the like; MEMS shutter display elements; and optical interference type MEMS display elements. A pixel included in the display portion 32 may include a pixel circuit in addition to the display element. The pixel circuit may include, for example, a transistor, a capacitor, and a wiring that electrically connects the transistor and the capacitor.

[Cross-Sectional Structure Example 1]
[Cross-Sectional Structure Example 1-1]

Figure 2A:
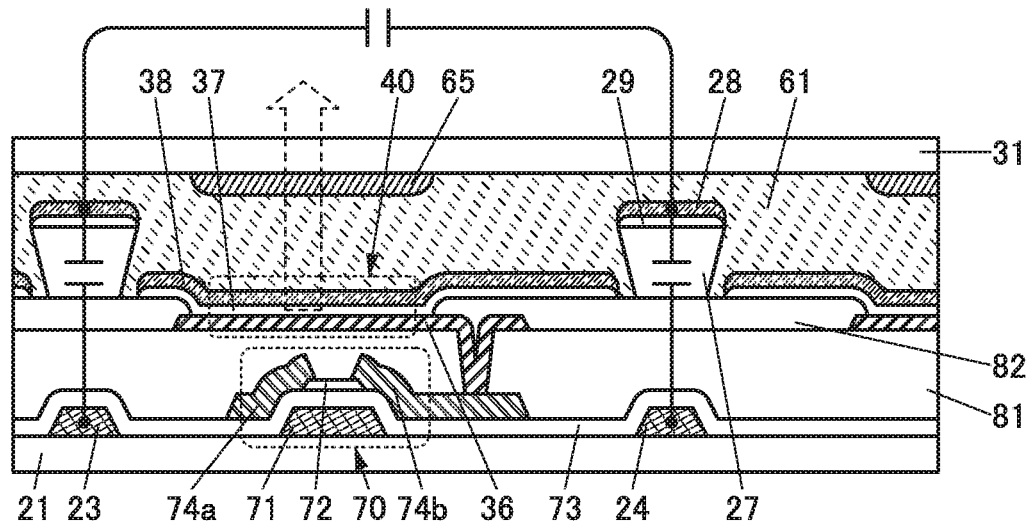
FIGS. 2A to 2C illustrate structure examples of a touch panel module of an embodiment.

FIG. 2A is a schematic cross-sectional view of part of the display portion 32. FIG. 2A illustrates two adjacent pixels (subpixels), the wiring 23, and the wiring 24. Here, as an example, a top-emission light-emitting element is used as a display element provided in the pixel.

In the touch panel module 10, the substrate 21 and the substrate 31 are attached to each other with an adhesive layer 61. In other words, a light-emitting element 40 is sealed with the adhesive layer 61.

A transistor 70, the light-emitting element 40, the wiring 23, the wiring 24, the structure body 27, the conductive layer 28, and the like are provided over the substrate 21. In addition, an insulating layer 73, an insulating layer 81, an insulating layer 82, and the like are provided over the substrate 21. A coloring layer 65 is provided on a surface of the substrate 31 that faces the substrate 21.

The transistor 70 includes a conductive layer 71 serving as a gate, a semiconductor layer 72, the insulating layer 73 serving as a gate insulating layer, a conductive layer 74a serving as one of a source and a drain, a conductive layer 74b serving as the other of the source and the drain, and the like. As an example, the conductive layer 74a is part of the signal line 51 and the conductive layer 71 is part of the scan line 52.

The insulating layer 81 is provided to cover the transistor 70, and the pixel electrode 36 is provided over the insulating layer 81. The pixel electrode 36 is electrically connected to the conductive layer 74b through an opening in the insulating layer 81.

The insulating layer 82 is provided to cover an end portion of the pixel electrode 36. The insulating layer 82 has a tapered end portion.

The structure body 27 is provided over the insulating layer 82. The structure body 27 overlaps with the wiring 23 or 24. The structure body 27 includes a portion positioned between two adjacent pixel electrodes 36 in a plan view.

FIG. 2A shows an example in which an EL layer 37 and a common electrode 38 are shared with a plurality of pixels.

As illustrated in FIG. 2A, a film to be an EL layer is deposited over the insulating layer 82, the pixel electrode 36, and the structure body 27, so that the EL layer 37 over the pixel electrode 36 and the insulating layer 82 and an EL layer 29 over the structure body 27 are formed simultaneously. In that case, the EL layer 37 and the EL layer 29 are physically separated from each other.

Similarly, when a conductive film is deposited over the EL layer 37 and the EL layer 29, the common electrode 38 over the EL layer 37 and the conductive layer 28 over the structure body 27 are formed simultaneously. In that case, the common electrode 38 and the conductive layer 28 are physically separated from each other.

As illustrated in FIG. 2A, capacitive coupling is formed between the wiring 23 and the conductive layer 28 over the wiring 23. Capacitive coupling is also formed between the wiring 24 and the conductive layer 28 over the wiring 24. In the case of a projected mutual-capacitive driving method, signal transmission and reception between the wirings 23 and 24 can be performed by utilizing the two capacitors between the conductive layer 28 and the wirings. The capacitance between the wirings 23 and 24 changes when an object touches, which enables sensing of the touch operation.

The light-emitting element 40 illustrated in FIG. 2A is a top-emission light-emitting element. The pixel electrode 36 can be formed using a conductive material reflecting visible light or a conductive material transmitting visible light. Here, the light-emitting element 40 preferably emits white light.

The coloring layer 65 can also be referred to as a color filter, and converts light from the light-emitting element 40 into light exhibiting a specific color. For example, in the case where a light-emitting element emitting white light is used as the light-emitting element 40, the coloring layer 65 of red, green, or blue is provided as a coloring layer in each pixel (subpixel), whereby full-color display can be performed. Note that a pixel (subpixel) corresponding to yellow, white, or the like in addition to the three colors is preferably provided to reduce power consumption.

Note that in the light-emitting element 40, an optical adjustment layer may be provided between the pixel electrode 36 and the common electrode 38. When a semi-transmissive or semi-reflective material is used for the common electrode 38, a microcavity structure can be achieved, resulting in improved light color purity. In addition, the microcavity structure can prevent external light from being reflected by the pixel electrode 36, allowing higher contrast display. The optical adjustment layer preferably has a different thickness in each pixel corresponding to a different color.

FIG. 2A shows an example in which the wirings 23 and 24 are formed by processing the same conductive film as the conductive layer 71 serving as the gate electrode of the transistor 70. Hence, the wirings 23 and 24 can be formed in the process of fabricating the transistor 70.

Note that in the structure illustrated in FIG. 2A, the conductive layer 28 is provided on and in contact with the EL layer 29. In the case where the EL layer 29 has conductivity, the stack of the conductive layer 28 and the EL layer 29 needs to be in an electrically floating state.

Figure 2B:
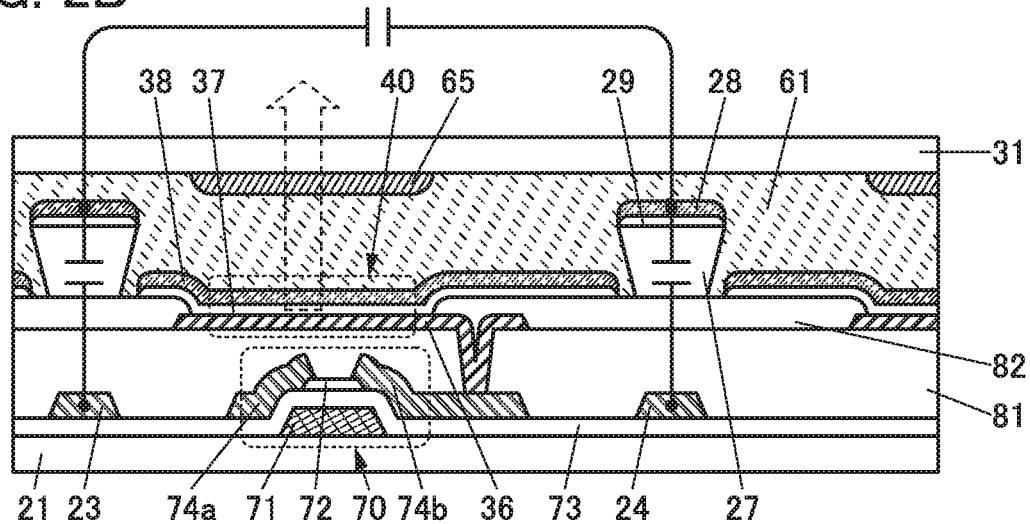

FIG. 2B shows an example in which the wirings 23 and 24 are formed by processing the same conductive film as the conductive layers 74a and 74b.

Figure 2C:
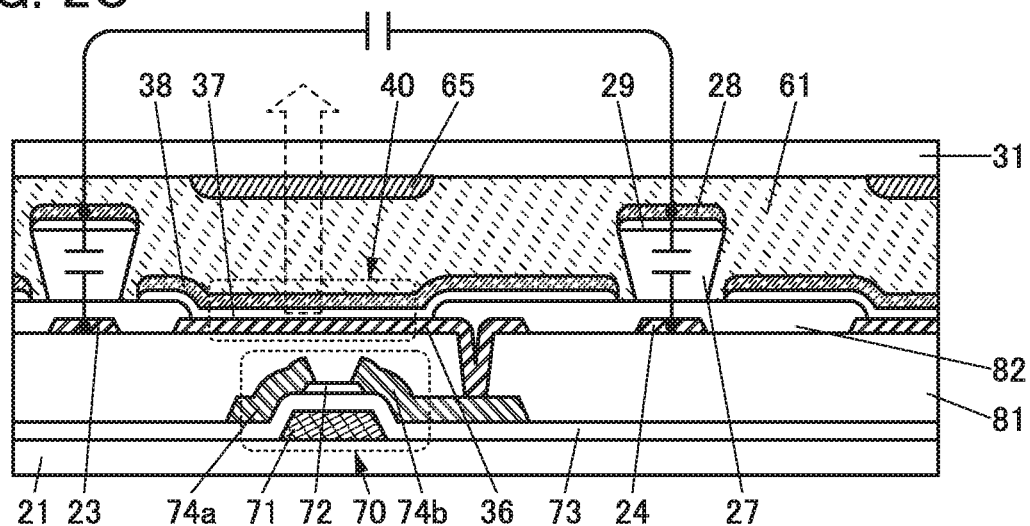

FIG. 2C shows an example in which the wirings 23 and 24 are formed by processing the same conductive film as the pixel electrode 36.

Although FIGS. 2A to 2C show examples in which the wirings 23 and 24 are formed by processing a conductive film, they may be formed by processing different conductive films.

Figure 3A:
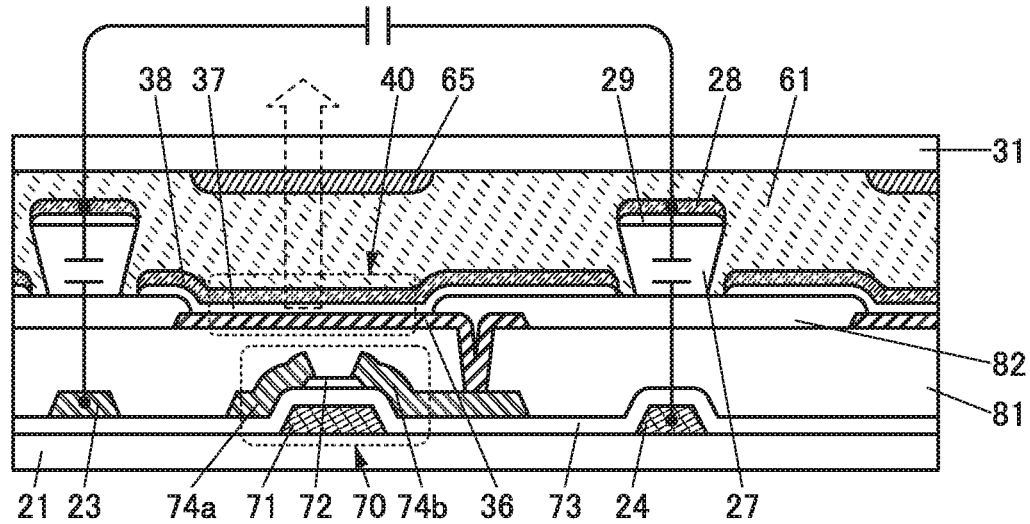
FIGS. 3A to 3C illustrate structure examples of a touch panel module of an embodiment.

FIG. 3A shows an example in which the wiring 23 is formed by processing the same conductive film as the conductive layers 74a and 74b and the wiring 24 is formed by processing the same conductive film as the conductive layer 71.

Figure 3B:
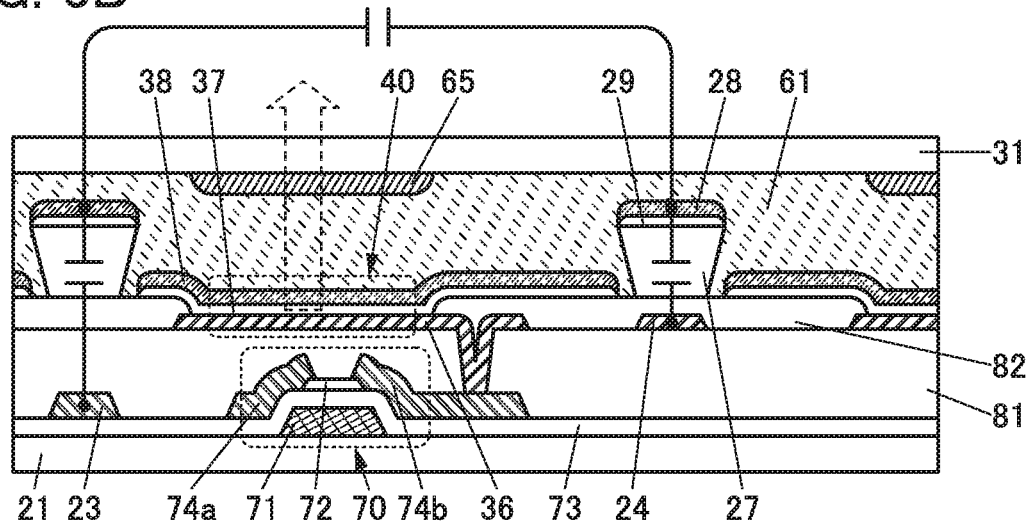

FIG. 3B shows an example in which the wiring 23 is formed by processing the same conductive film as the conductive layers 74a and 74b and the wiring 24 is formed by processing the same conductive film as the pixel electrode 36.

Figure 3C:
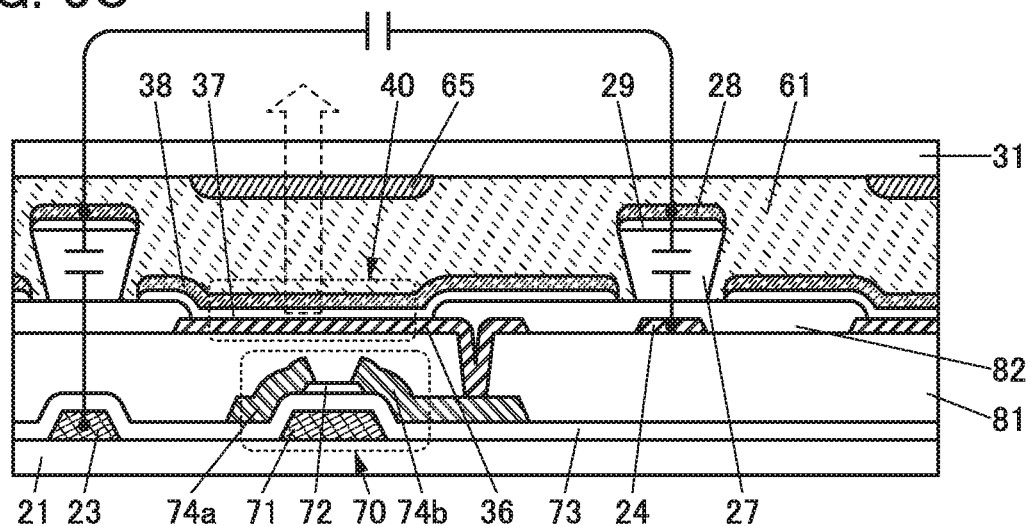

FIG. 3C shows an example in which the wiring 23 is formed by processing the same conductive film as the conductive layer 71 and the wiring 24 is formed by processing the same conductive film as the pixel electrode 36.

[Cross-Sectional Structure Example 1-2]

An electrically floating conductive layer may be provided between the wiring 23 and the conductive layer 28 or between the wiring 24 and the conductive layer 28.

Figure 4A:
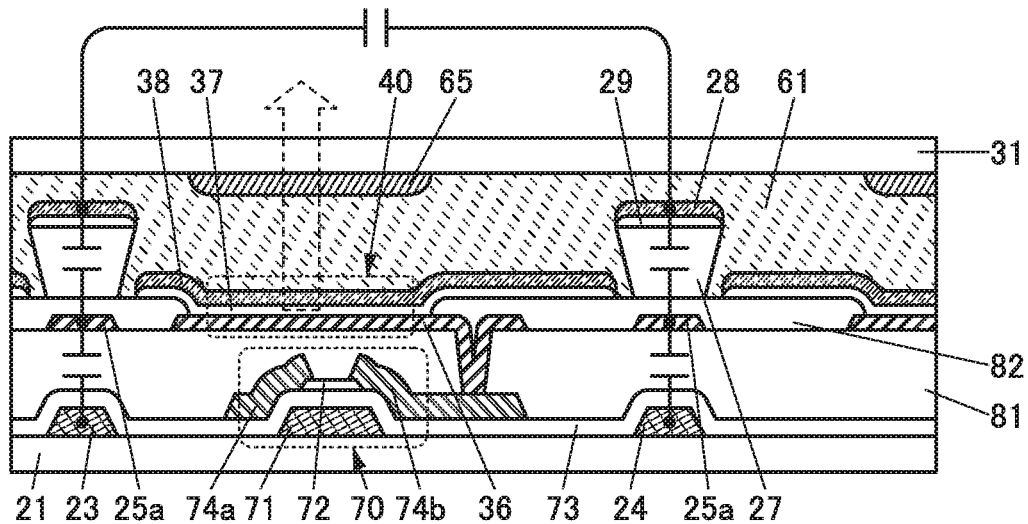
FIGS. 4A to 4C illustrate structure examples of a touch panel module of an embodiment.

FIG. 4A shows an example in which a conductive layer 25a is additionally provided in the structure of FIG. 2A.

The conductive layer 25a is formed by processing the same conductive film as the pixel electrode 36. The conductive layer 25a includes a portion that overlaps with the wiring 23 or 24 in a plan view. The conductive layer 25a includes a portion that overlaps with the conductive layer 28 in a plan view.

As illustrated in FIG. 4A, capacitive coupling is formed between the conductive layer 25a and the wiring 23 or 24. Capacitive coupling is also formed between the conductive layer 25a and the conductive layer 28. Thus, a signal can be transmitted between the conductive layer 28 and the wiring 23 or 24 through the conductive layer 25a.

When a signal is transmitted by utilizing the capacitive coupling between two conductive layers, the transmission efficiency increases as the two conductive layers have a larger area facing each other or a smaller distance from each other. Accordingly, when a signal is transmitted between the conductive layer 28 and the wiring 23 or 24 through the conductive layer 25a, the amplitude of the transmitted signal can be increased as compared with the case where the conductive layer 25a is not provided.

Figure 4B:
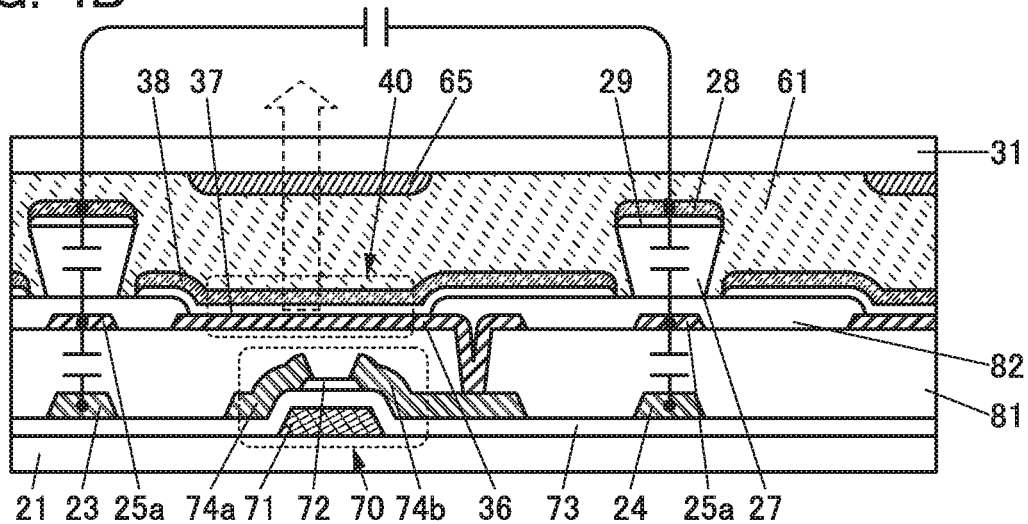

FIG. 4B shows an example in which the wirings 23 and 24 are formed by processing the same conductive film as the conductive layers 74a and 74b.

Figure 4C:
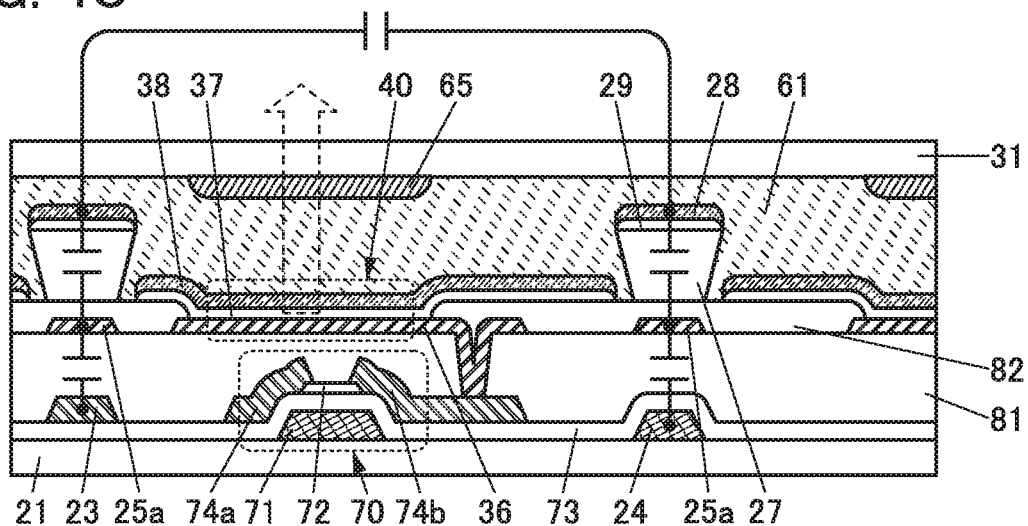

FIG. 4C shows an example in which the wiring 23 is formed by processing the same conductive film as the conductive layers 74a and 74b and the wiring 24 is formed by processing the same conductive film as the conductive layer 71.

[Cross-Sectional Structure Example 1-3]

A light-blocking layer can be provided on the side of the substrate 31 in order to prevent light entering from an adjacent pixel. Furthermore, in the case where a conductive material is used for the light-blocking layer, part of the light-blocking layer may be processed into an island shape so as to be used as a conductive layer serving as an electrode of a touch sensor.

Figure 5A:
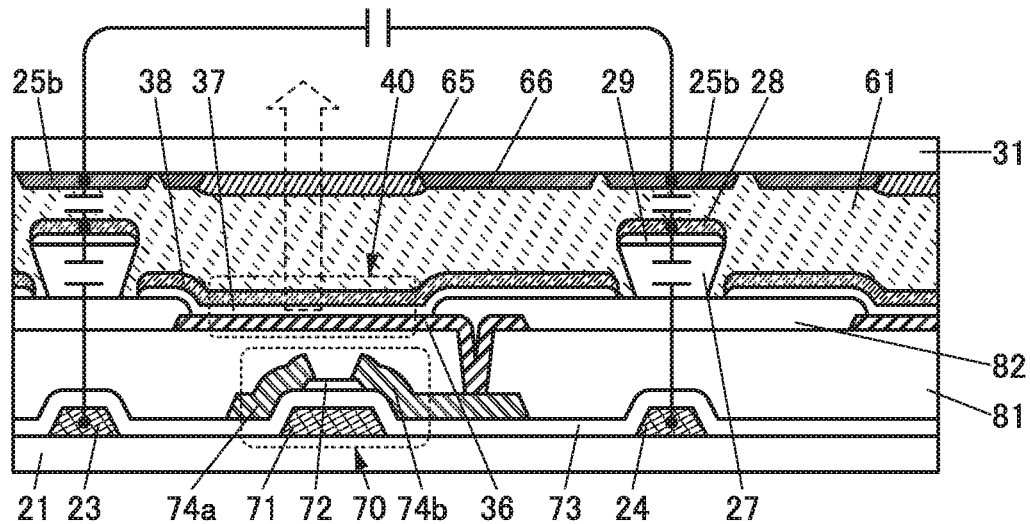
FIGS. 5A to 5C illustrate structure examples of a touch panel module of an embodiment.

FIG. 5A shows an example in which a light-blocking layer 66 and a conductive layer 25b are additionally provided in the structure of FIG. 2A. Note that in the following diagrams, a layer, a wiring, and the like formed by processing the same conductive film are sometimes shown with the same hatching pattern for simplicity.

The light-blocking layer 66 and the conductive layer 25b are provided on a surface of the substrate 31 that faces the substrate 21. The light-blocking layer 66 and the conductive layer 25b are preferably formed by processing the same conductive film. The light-blocking layer 66 and the conductive layer 25b are each provided between adjacent pixel electrodes in a plan view. Moreover, the light-blocking layer 66 and the conductive layer 25b have a function of blocking visible light.

The conductive layer 25b includes a portion overlapping with the conductive layer 28 in a plan view. The conductive layer 25b is preferably processed into an island shape and in an electrically floating state. In that case, capacitive coupling is formed between the conductive layer 28 and the conductive layer 25b, and a signal can be transmitted therebetween. In other words, a signal can be transmitted between the conductive layer 25b and the wiring 23 or 24 through the conductive layer 28.

The conductive layer 25b is provided closer to a touch surface than the conductive layer 28 is; therefore, sensitivity can be improved as compared to the case where the conductive layer 25b is not provided.

As in the case of providing the conductive layer 25a, when a signal is transmitted between the conductive layer 25b and the wiring 23 or 24 through the conductive layer 28, high sensitivity can be achieved as compared to the case where a signal is transmitted directly between the conductive layer 25b and the wiring 23 or 24.

Although each of the island-like conductive layers 25b is provided between the light-blocking layers 66, the island-like conductive layers 25b are not necessarily provided apart from each other, and only the conductive layer 25b may be provided. In that case, the conductive layer 25b overlapping with the wiring 23 and the conductive layer 25b overlapping with the wiring 24 need to be physically separated from each other.

Figure 5B:
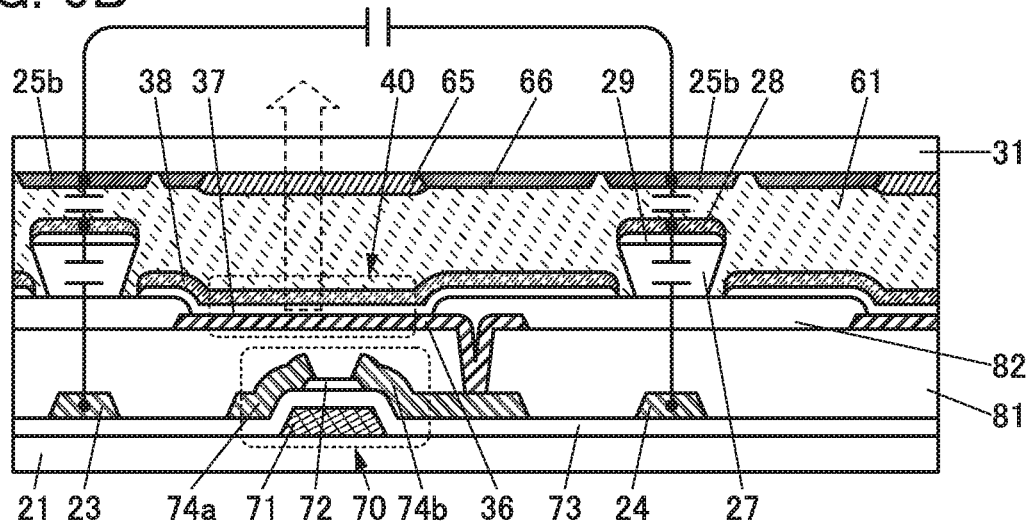

FIG. 5B shows an example in which the wirings 23 and 24 are formed by processing the same conductive film as the conductive layers 74a and 74b.

Figure 5C:
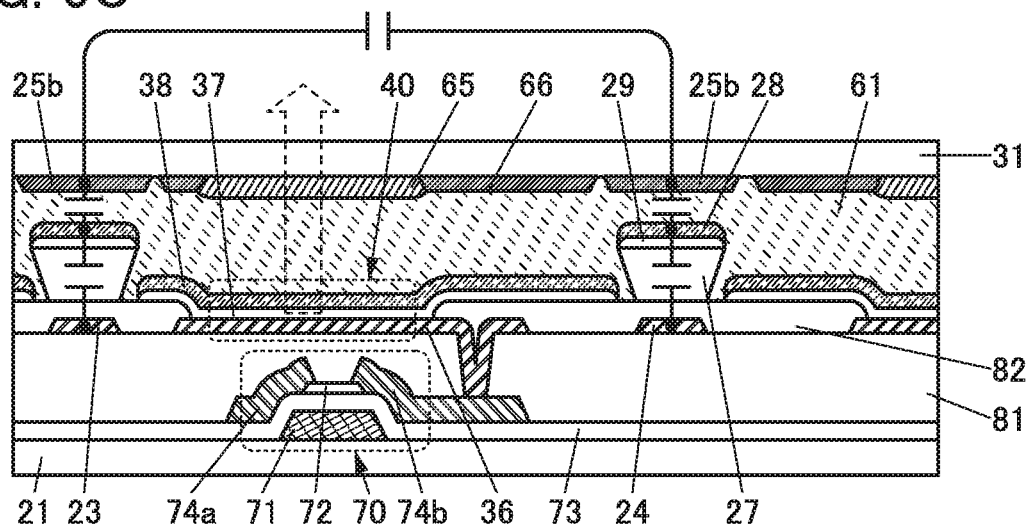

FIG. 5C shows an example in which the wirings 23 and 24 are formed by processing the same conductive film as the pixel electrode 36.

Note that both of the conductive layers 25a and 25b may be provided.

Figure 6A:
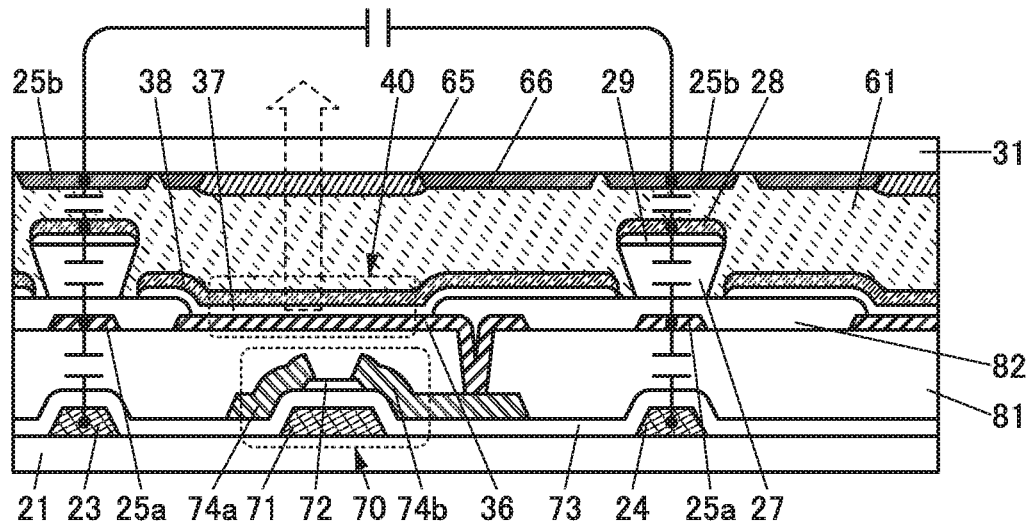
FIGS. 6A to 6C illustrate structure examples of a touch panel module of an embodiment.

FIG. 6A shows an example in which the conductive layer 25a, the conductive layer 25b, and the light-blocking layer 66 are additionally provided in the structure of FIG. 2A. In the structure of FIG. 6A, a signal can be transmitted between the conductive layer 25b and the wiring 23 or 24 through the conductive layer 25a and the conductive layer 28.

Figure 6B:
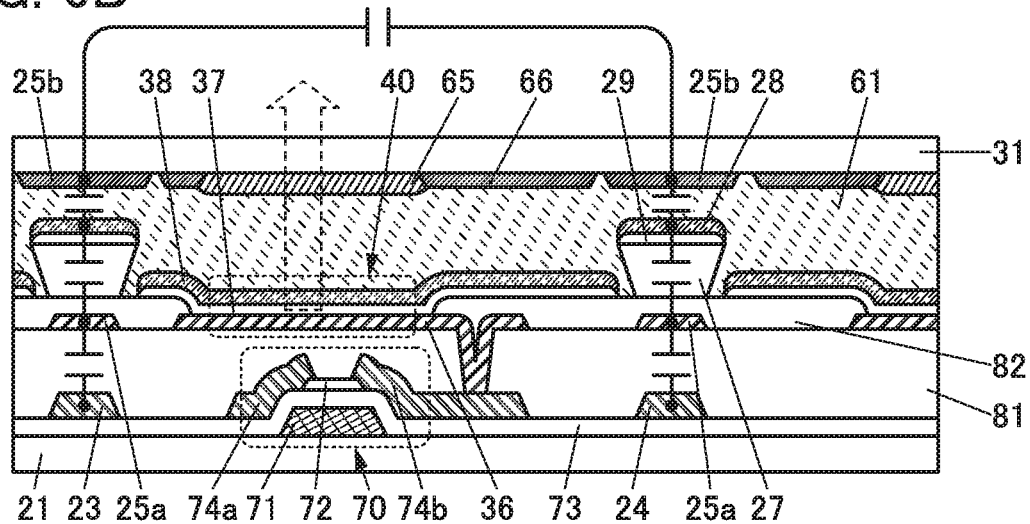

FIG. 6B shows an example in which the wirings 23 and 24 are formed by processing the same conductive film as the conductive layers 74a and 74b.

Figure 6C:
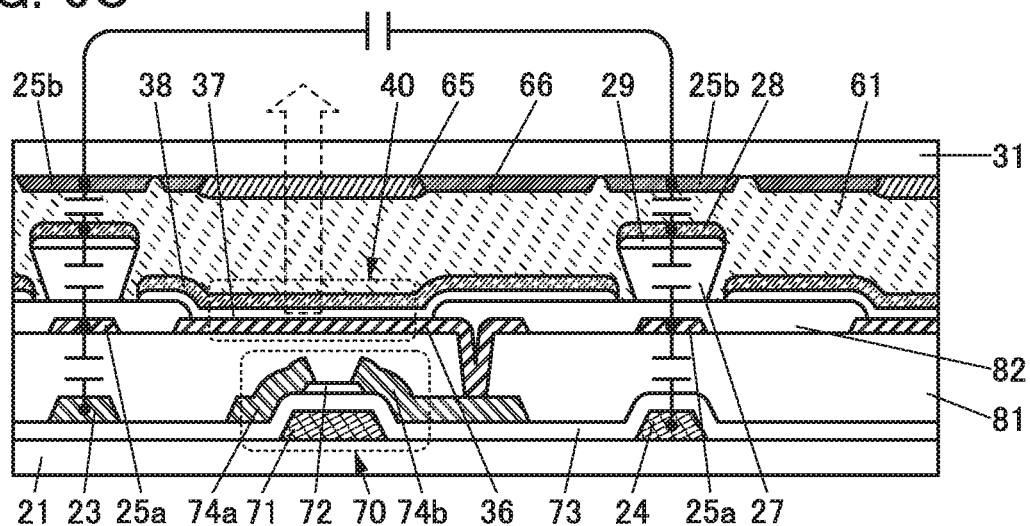

FIG. 6C shows an example in which the wiring 23 is formed by processing the same conductive film as the conductive layers 74a and 74b and the wiring 24 is formed by processing the same conductive film as the conductive layer 71.

[Cross-Sectional Structure Example 1-4]

A conductive layer serving as an electrode of a touch sensor can be provided on a display surface (a touch surface) of the substrate 31.

Figure 7A:
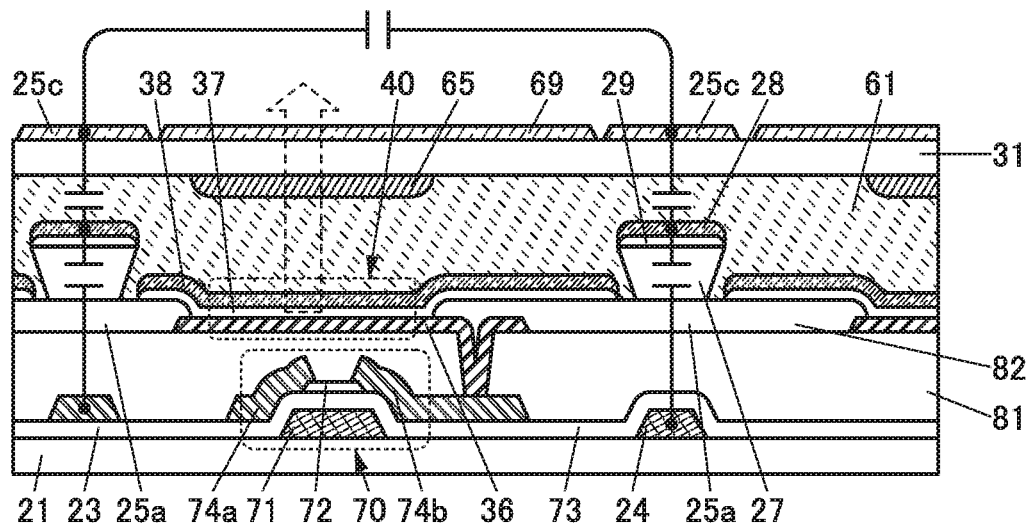
FIGS. 7A to 7C illustrate structure examples of a touch panel module of an embodiment.

FIG. 7A shows an example in which a conductive layer 25c and a conductive layer 69 are additionally provided in the structure of FIG. 2A.

The conductive layer 25c and the conductive layer 69 are provided on a surface of the substrate 31 that is opposite to the surface facing the substrate 21. The conductive layer 25c and the conductive layer 69 are preferably formed by processing the same conductive film. The conductive layer 25c has an island-like shape in a plan view. The conductive layer 69 is provided between two adjacent conductive layers 25c, and may have, for example, a grid-like shape surrounding the conductive layer 25c.

The conductive layer 25c includes a portion overlapping with the conductive layer 28 in a plan view. The conductive layer 25c is preferably processed into an island shape and in an electrically floating state. In that case, capacitive coupling is formed between the conductive layer 28 and the conductive layer 25c, and a signal can be transmitted therebetween. In other words, a signal can be transmitted between the conductive layer 25c and the wiring 23 or 24 through the conductive layer 28.

The conductive layer 25c is provided closer to a touch surface than the conductive layer 28 is; therefore, sensitivity can be improved as compared to the case where the conductive layer 25c is not provided.

As in the case of providing the conductive layer 25a or 25b, when a signal is transmitted between the conductive layer 25c and the wiring 23 or 24 through the conductive layer 28, high sensitivity can be achieved as compared to the case where a signal is transmitted directly between the conductive layer 25c and the wiring 23 or 24.

The conductive layer 25c and the conductive layer 69 preferably transmit visible light. When the conductive layer 69 is provided in a portion where the conductive layer 25c is not provided, it is possible to reduce unevenness of color, luminance, and the like of displayed images, which is caused by a difference in the surface state of a touch panel. Note that in the case where the conductive layer 69 is not provided, a material that blocks visible light can be used for the conductive layer 25c. The conductive layer 25c and the conductive layer 69 are not necessarily provided apart from each other, and only the conductive layer 25c may be provided. In that case, the conductive layer 25c overlapping with the wiring 23 and the conductive layer 25c overlapping with the wiring 24 need to be physically separated from each other.

FIG. 7A shows an example in which the wiring 23 is formed by processing the same conductive film as the conductive layers 74a and 74b and the wiring 24 is formed by processing the same conductive film as the conductive layer 71; however, one embodiment of the present invention is not limited to this example.

Figure 7B:
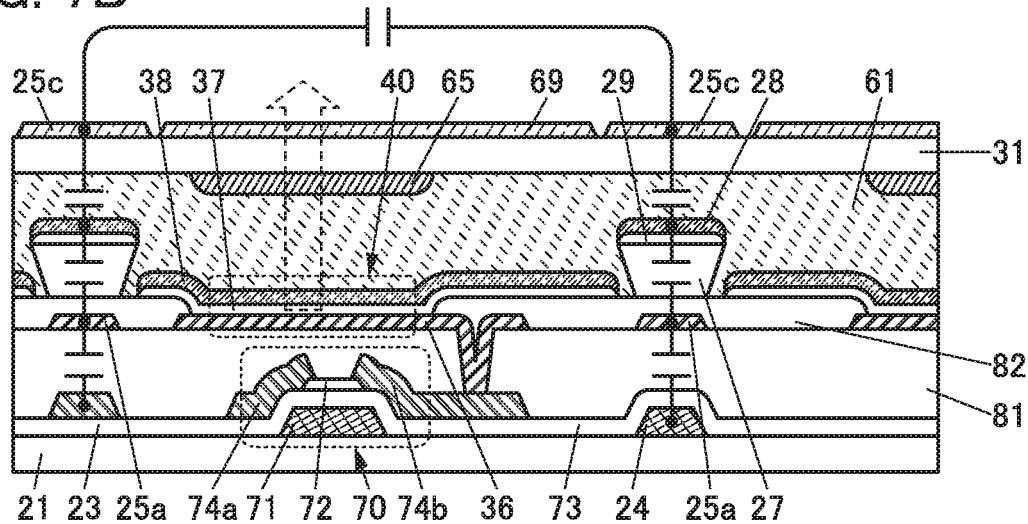

FIG. 7B shows an example in which the conductive layer 25a is additionally provided in the structure of FIG. 7A.

Figure 7C:
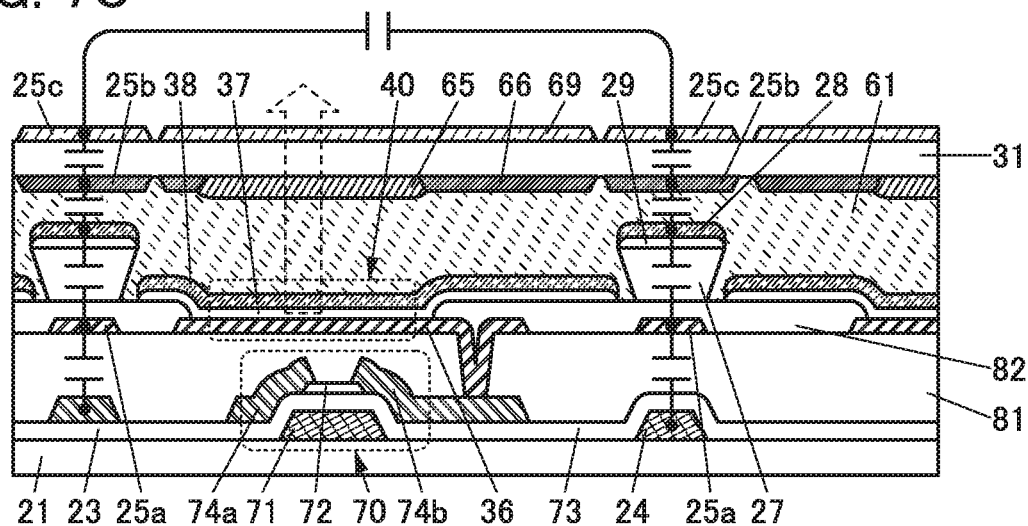

FIG. 7C shows an example in which the conductive layer 25a, the conductive layer 25b, and the light-blocking layer 66 are additionally provided in the structure of FIG. 7A.

[Modification Example 1]

In the above examples, the EL layer 37 is shared with a plurality of pixels. Alternatively, the EL layer 37 may be formed for every pixel emitting the same color, i.e., may be formed by a so-called side-by-side method.

Figure 8A:
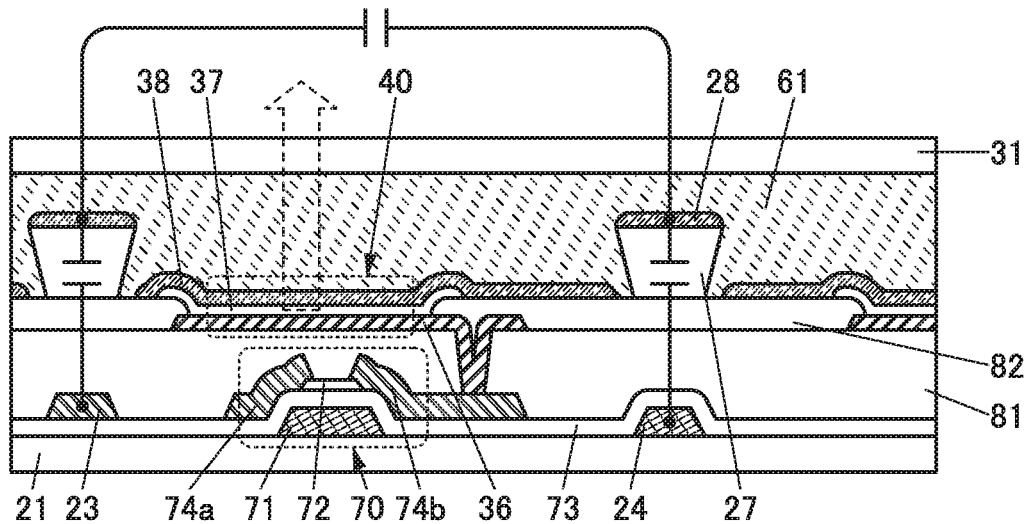
FIGS. 8A to 8C illustrate structure examples of a touch panel module of an embodiment.

FIG. 8A shows an example in which the light-emitting element 40 is formed by a side-by-side method in the structure of FIG. 2A.

In FIG. 8A, the EL layer 37 is provided to cover an exposed portion of the pixel electrode 36. The EL layer 37 is formed in an island shape, and an end portion of the EL layer 37 is covered with the common electrode 38.

In this example, the EL layer 29 is not formed between the structure body 27 and the conductive layer 28.

Since the EL layer 37 emitting a different color light can be formed in each pixel, the coloring layer 65 does not need to be provided as illustrated in FIG. 8A, achieving a simplified structure of the substrate 31.

Figure 8B:
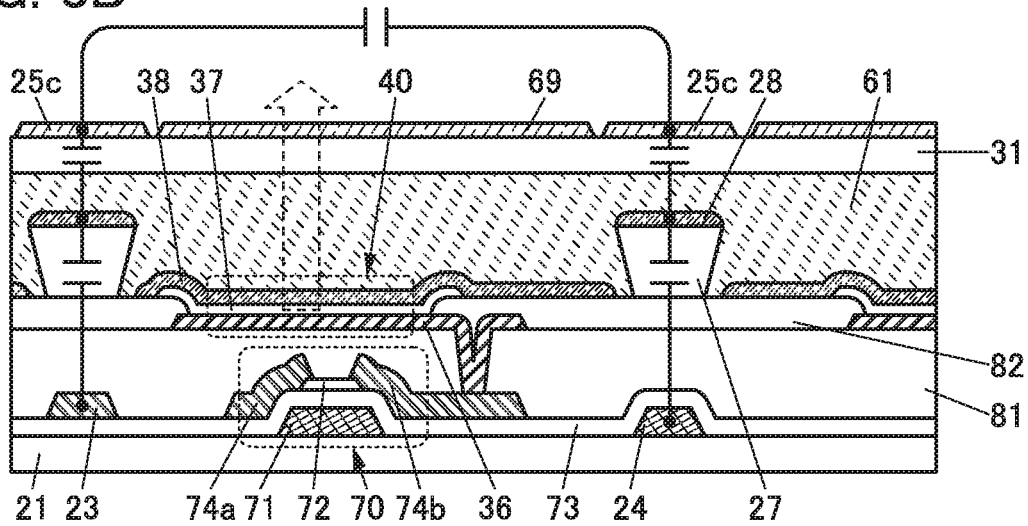

FIG. 8B shows an example in which the conductive layer 25c and the conductive layer 69 are additionally provided in the structure of FIG. 8A.

Figure 8C:
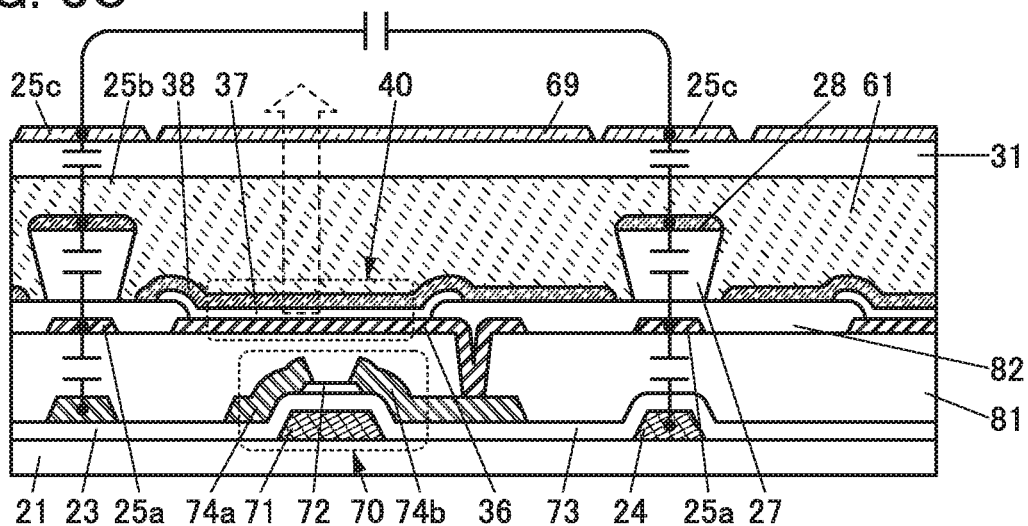

FIG. 8C shows an example in which the conductive layer 25a, the conductive layer 25c, and the conductive layer 69 are additionally provided in the structure of FIG. 8A.

[Cross-Sectional Structure Example 1-5]

As described above, when a signal is transmitted by utilizing the capacitive coupling between two conductive layers, the transmission efficiency increases as the two conductive layers have a smaller distance from each other. Accordingly, the amplitude of a signal transmitted between the conductive layer 28 and the wiring 23 or 24 can be increased as the distance therebetween is reduced.

The distance between the conductive layer 28 and the wiring 23 or 24 can be reduced by, for example, reducing the thickness of the structure body 27. In order that the conductive film to be the common electrode 38 is physically separated, the thickness of the structure body 27 only needs to be larger than the thickness of the common electrode 38 or the total thickness of the common electrode 38 and the EL layer 37.

Alternatively, the distance between the structure body 27 and the wiring 23 or 24 may be reduced. For example, part of the insulating layer between the structure body 27 and the wiring 23 or 24 may be removed by etching or reduced in thickness.

Figure 9A:
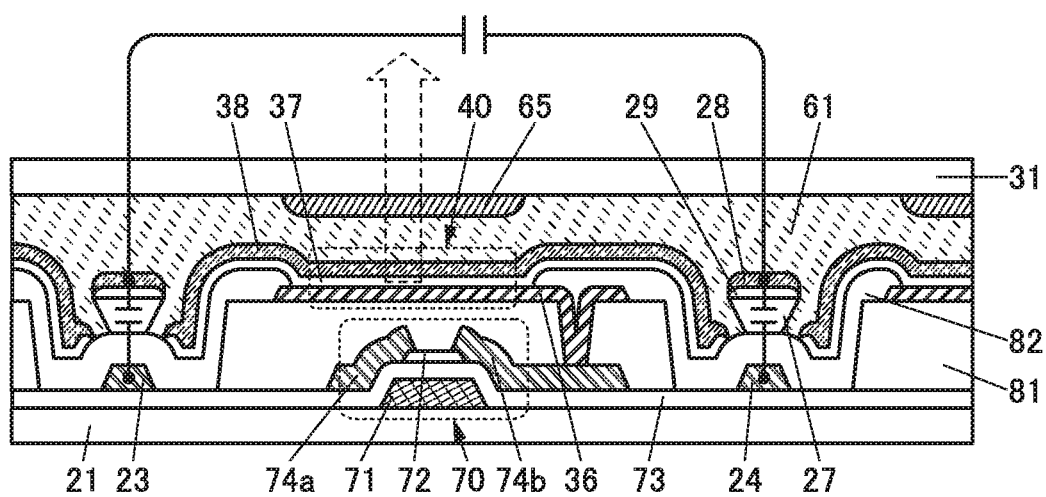
FIGS. 9A and 9B illustrate structure examples of a touch panel module of an embodiment.

FIG. 9A shows an example in which the insulating layer 81 covering the wirings 23 and 24 is partly removed by etching.

Part of the insulating layer 81 is removed by etching to provide openings. The wirings 23 and 24 have portions overlapping with the openings. The insulating layer 82 is provided to cover side surfaces of the insulating layer 81, part of the wirings 23 and 24, and part of the insulating layer 73.

The structure body 27 is provided in a portion overlapping with the opening of the insulating layer 81. End portions of the EL layer 37 and the common electrode 38 overlap with the opening of the insulating layer 81.

For example, the opening of the insulating layer 81 may be formed at the same time as the opening for electrically connecting the conductive layer 74b and the pixel electrode 36.

Figure 9B:
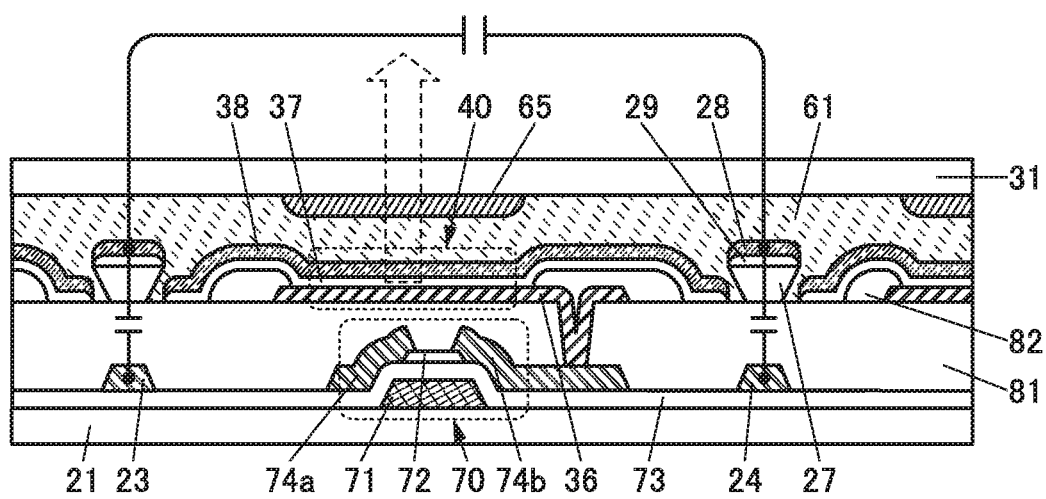

FIG. 9B shows an example in which the insulating layer 82 partly includes an opening.

At least part of the structure body 27 is inside the opening of the insulating layer 82, and at least part of the structure body 27 is provided on a top surface of the insulating layer 81. The end portions of the EL layer 37 and the common electrode 38 overlap with the opening of the insulating layer 82.

For example, the opening of the insulating layer 82 may be formed at the same time as the opening over the pixel electrode 36. The insulating layer 82 is preferably formed using, for example, a photosensitive resin because it can be processed without use of an etching mask.

Note that the structures shown here may be combined with at least one of the conductive layers 25a, 25b, and 25c, and the like described in the above structure examples.

The above is the description of Cross-sectional Structure Example 1.

[Widths of Wiring and Conductive Layer]

Described below is the relative positional relationship and the like between the wirings 23 and 24 and the conductive layers serving as the electrodes of the touch sensor.

FIGS. 10A to 10F are enlarged views of the cross section including the wiring 23 and the structure body 27.

Hereinafter, the wiring 23 is described as an example, and the same applies to the wiring 24. In the following description, the stacked structure is simplified for easy understanding.

Figure 10A:
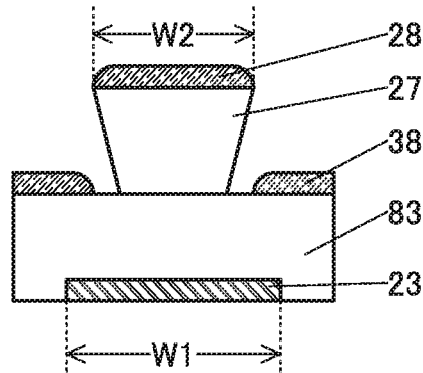
FIGS. 10A to 10F illustrate structure examples of a touch panel module of an embodiment.

FIG. 10A illustrates an insulating layer 83 covering the wiring 23, the common electrode 38 and the structure body 27 over the insulating layer 83, and the conductive layer 28 over the structure body 27. The insulating layer 83 is positioned between the wiring 23 and the structure body 27, and corresponds to, for example, the aforementioned stacked structure of the insulating layers 81 and 82.

As illustrated in FIG. 10A, the width of the wiring 23 and the width of the conductive layer 28 are denoted as W1 and W2, respectively. Note that here, the width refers to a width in a direction crossing the extending direction of the wiring 23, preferably a direction substantially perpendicular to the extending direction of the wiring 23.

The conductive layer 28 and the common electrode 38 can be formed simultaneously by depositing a conductive film after the formation of the structure body 27. Accordingly, the width W2 of the conductive layer 28 is substantially equal to the width of the opening of the common electrode 38. Note that when the conductive film is deposited on part of the top surface of the insulating layer 83, which is covered with the upper part of the structure body 27, the width of the opening of the common electrode 38 is smaller than the width W2 of the conductive layer 28 in some cases.

The capacitance between the wiring 23 and the conductive layer 28 is proportional to the area of the facing surfaces of the wiring 23 and the conductive layer 28. However, since the common electrode 38 exists in this structure example, the area of the facing surfaces of the wiring 23 and the conductive layer 28 is restricted by the opening of the common electrode 38. Hence, the width W1 of the wiring 23 is larger than the width W2 of the conductive layer 28 as illustrated in FIG. 10A, in which case the wiring 23 and the conductive layer 28 can have the largest facing area.

The capacitance between the wiring 23 and the conductive layer 28 is also proportional to the dielectric constant of the insulator existing therebetween. Therefore, a high dielectric constant material is preferably used in the case where an insulating material is used for the structure body 27. Preferably, the dielectric constant of the material for the structure body 27 is at least higher than that of the insulating layer 83. In the case where the insulating layer 83 consists of stacked insulating layers, the material for the structure body 27 preferably has a dielectric constant higher than that of at least one of the insulating layers of the insulating layer 83. For example, in the structure illustrated in FIG. 2A and the like, a material with a dielectric constant higher than that of the insulating layer 81 or 82 may be used for the structure body 27.

Furthermore, the capacitance between the wiring 23 and the conductive layer 28 is inversely proportional to the distance therebetween. Therefore, the thickness (height) of the structure body 27 is preferably as small (low) as possible. In contrast, the height of the structure body 27 is preferably much greater than the thickness of the common electrode 38 in order that the common electrode 38 is surely separated from the conductive layer 28. For example, the thickness of the structure body 27 may be greater than that of the common electrode 38 by the range of 20 nm to 10 μm, preferably 50 nm to 5 μm, further preferably 100 nm to 5 μm, and still further preferably 200 nm to 5 μm. Note that in the case where the EL layer 37 as well as the common electrode 38 is shared with a plurality of pixels as illustrated in FIG. 2A and the like, the height of the structure body 27 may be greater than the total thickness of the common electrode 38 and the EL layer 37 by the above range.

Figure 10B:
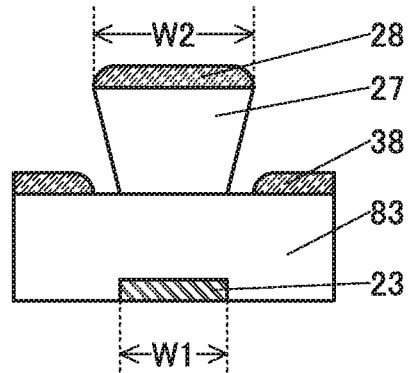

FIG. 10B shows an example in which the width W1 of the wiring 23 is smaller than the width W2 of the conductive layer 28. With this structure, the parasitic capacitance between the wiring 23 and the common electrode 38 can be reduced although the facing area of the conductive layer 28 and the wiring 23 is smaller than that in the example illustrated in FIG. 10A. For example, a large-sized touch panel has a significant effect of parasitic capacitance; in that case, higher detection sensitivity can be sometimes obtained in the structure of FIG. 10B than in the structure of FIG. 10A.

Figure 10C:
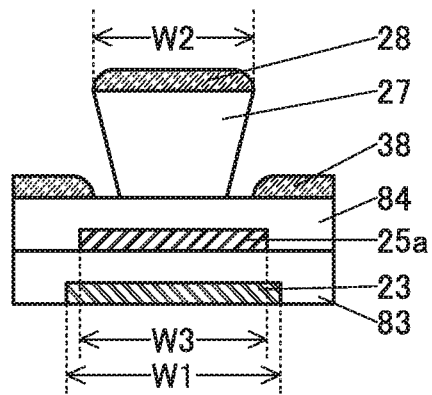
Figure 10D:
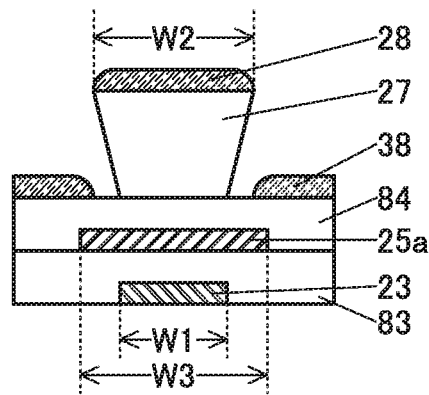

FIGS. 10C and 10D are schematic cross-sectional views including the conductive layer 25a. The conductive layer 25a is provided over the insulating layer 83, an insulating layer 84 is provided to cover the conductive layer 25a, and the structure body 27 and the common electrode 38 are provided over the insulating layer 84. The insulating layer 83 and the insulating layer 84 correspond to, for example, the insulating layer 81 and the insulating layer 82 in FIG. 2A, respectively. The width of the conductive layer 25a is denoted as W3.

The width W3 of the conductive layer 25a may be smaller than the width W1 of the wiring 23 as illustrated in FIG. 10C, or may be larger than the width W1 of the wiring 23 as illustrated in FIG. 10D. In such cases, one of the wiring 23 and the conductive layer 25a that has a smaller width is preferably enclosed in the other that has a larger width in a plan view. This maximizes the capacitance between the wiring 23 and the conductive layer 25a as much as possible.

Note that the relationship between the conductive layer 25a and the conductive layer 28 is similar to that between the wiring 23 and the conductive layer 28, and the above description can be referred to.

Figure 10E:
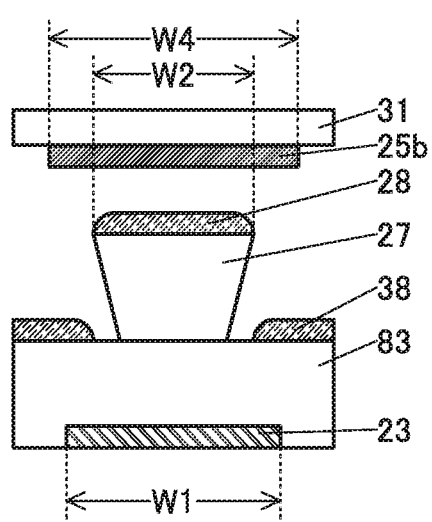

FIG. 10E is a schematic cross-sectional view including the conductive layer 25b. The conductive layer 25b is formed on the surface of the substrate 31 that faces the conductive layer 28. The width of the conductive layer 25b is denoted as W4.

Figure 10F:
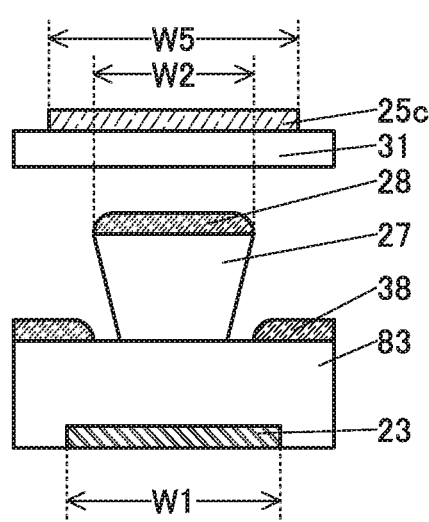

FIG. 10F is a schematic cross-sectional view including the conductive layer 25c. The conductive layer 25c is formed on the surface of the substrate 31 that is opposite to the surface facing the conductive layer 28. The width of the conductive layer 25c is denoted as W5.

As the conductive layers 25b and 25c, which are closer to the touch surface than the conductive layer 28 is, have larger areas, detection sensitivity can be improved because of increased areas facing an object to be sensed. Hence, as illustrated in FIGS. 10E and 10F, the width W4 of the conductive layer 25b and the width W5 of the conductive layer 25c are each preferably larger than the width W2 of the conductive layer 28. Furthermore, the conductive layer 28 is preferably enclosed in the conductive layer 25b or 25c in a plan view.

The above is the description of the widths of the wiring and the conductive layer.

[Wiring Shape]

For example, the wirings 23 and 24 each can have a shape extending in the X direction or the Y direction in the form of stripes. In that case, some of the plurality of wirings 23 are electrically connected to each other in a region outside the display portion that displays an image to form a group. Similarly, some of the plurality of wirings 24 are electrically connected to each other in a region outside the display portion to form a group. With such a structure, an area that contributes to detection in the wirings 23 and 24 is increased, improving the detection sensitivity.

As another example, the wirings 23 and 24 each can have a mesh shape including portions parallel to the X direction and the Y direction. In that case, one or more pixel electrodes can be provided in an opening of the mesh in a plan view. When the wirings 23 and 24 each have a mesh shape, the conductivity in the extending directions can be increased, so that delay of signals can be suppressed, increasing the detection sensitivity.

Here, the wirings 23 and 24 are preferably formed by processing the same film as a wiring, an electrode, a semiconductor, or the like included in the pixel or the display element of the touch panel, a driver circuit, or the like. Thus, a touch panel can be manufactured without providing a special step for adding a function of a touch sensor, which leads to a reduction in manufacturing cost.

Typically, in the case where the wirings 23 and 24 each have a stripe shape as described above, for example, the wiring 23 can be formed by processing the same conductive film as the signal line and the wiring 24 can be formed by processing the same conductive film as the scan line. Thus, the wirings 23 and 24 can be formed over different insulating layers, so that the wirings 23 and 24 can intersect each other without a special contrivance. In that case, the wiring 23 and the scan line are formed over different insulating layers and the wiring 24 and the signal line are formed over different insulating layers; hence, the wiring 23 and the scan line, or the wiring 24 and the signal line can intersect each other without a special contrivance.

For example, in the case where the wirings 23 and 24 each have a mesh shape as described above, the mesh shape can be formed in such a manner that portions parallel to the X direction are formed by processing the same conductive film as the signal line and portions parallel to the Y direction are formed by processing the same conductive film as the scan line and these two types of portions are electrically connected to each other. Thus, arbitrary two of the wiring 23, the wiring 24, the signal line, and the scan line can intersect each other without a special contrivance.

[Example 1 of Wiring Shape]

Figure 11A:
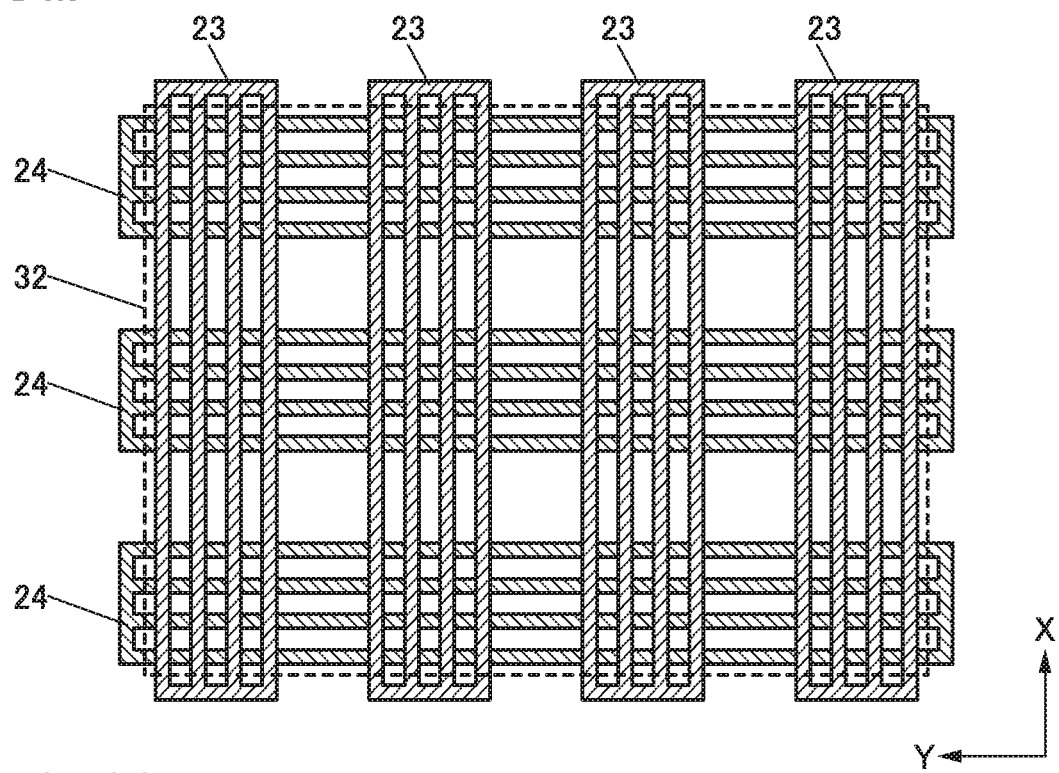
FIGS. 11A and 11B illustrate structure examples of wirings of an embodiment.

FIG. 11A illustrates an example of top surface shapes of the wirings 23 and the wirings 24. The wirings 23 extend in the X direction and the wirings 24 extend in the Y direction. The wirings 23 each include a plurality of stripes extending in the X direction in a region overlapping with the display portion 32, and the plurality of stripes are connected to each other in a region outside the display portion 32.

With such a structure, the wiring 23 only includes portions substantially parallel in the X direction and the wiring 24 only includes portions substantially parallel in the Y direction in a portion overlapping with the display portion 32. In that case, since the wiring 23 can be arranged not to intersect the signal line, they can be formed at the same time by processing the same conductive film. Similarly, the wiring 24 is arranged not to intersect the scan line and they can be formed at the same time by processing the same conductive film.

Figure 11B:
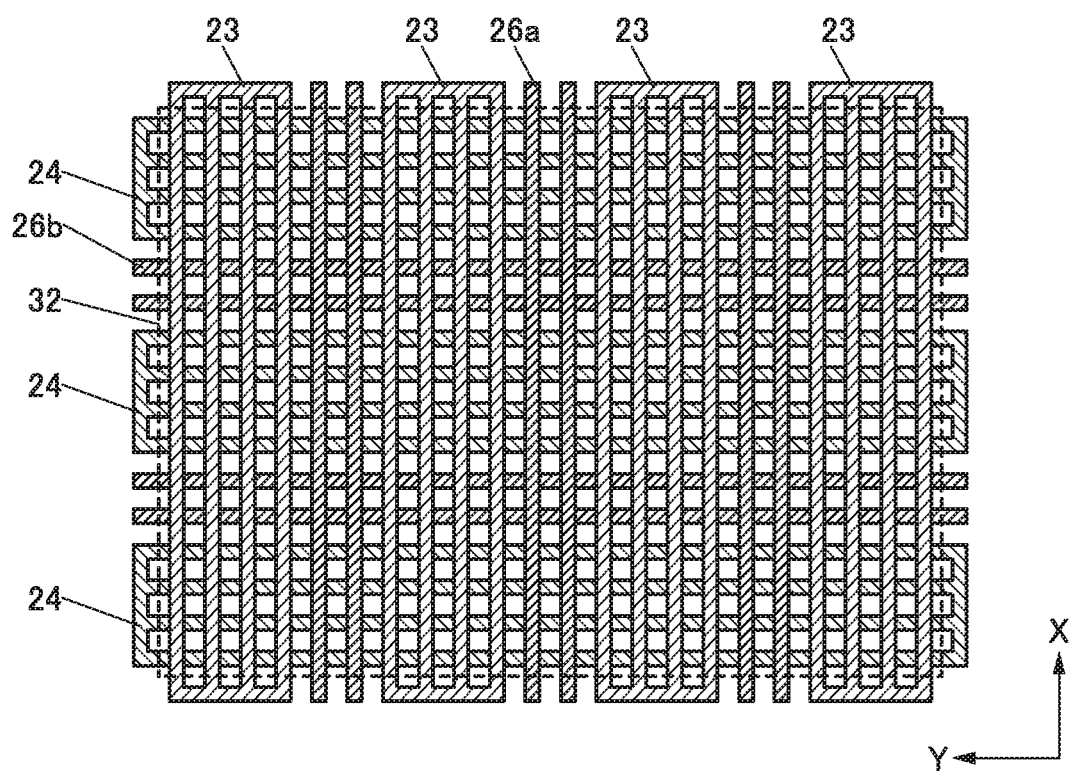

As illustrated in FIG. 11B, a conductive layer 26a extending in the X direction may be provided between the adjacent wirings 23. Similarly, a conductive layer 26b extending in the Y direction may be provided between the adjacent wirings 24. The conductive layer 26a and the conductive layer 26b can be, for example, brought into an electrically floating state or supplied with a predetermined constant potential. In that case, preferably, the wiring 23 and the conductive layer 26a are formed by processing the same conductive film and the wiring 24 and the conductive layer 26b are formed by processing the same conductive film. Thus, in the display portion 32, a regular pattern in layout from a region where the wirings 23 and 24 are provided to a region where they are not provided can be maintained. Therefore, between a pixel close to the wiring 23 or 24 and a pixel far from them, luminance unevenness due to a thickness difference or the like of stacks included in the pixels can be suppressed.

A short-side direction of the display portion 32 is referred to as the X direction and a long-side direction of the display portion 32 is referred to as the Y direction in FIGS. 11A and 11B and the like; however, one embodiment of the present invention is not limited thereto, and the short-side direction and the long-side direction may be referred to as the Y direction and the X direction, respectively.

[Example 2 of Wiring Shape]

Figure 12A:
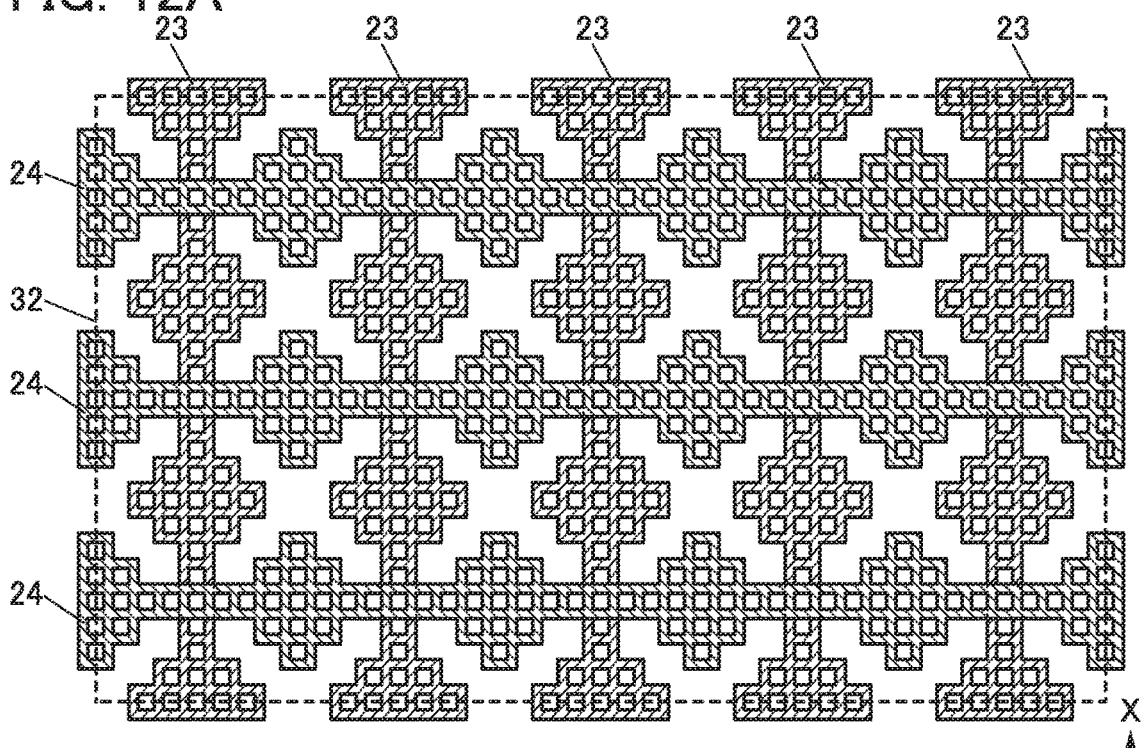
FIGS. 12A and 12B illustrate structure examples of wirings of an embodiment.

FIG. 12A illustrates an example of the wiring 23 and the wiring 24 having shapes different from those in FIG. 11A.

The wirings 23 and 24 each have portions parallel in the X direction and portions parallel in the Y direction, and a mesh-like top surface shape can be formed by these two types of portions. In that case, the wirings 23 and 24 are preferably provided so that one or more pixel electrodes 36 (not illustrated) are included in the opening of the mesh in a plan view.

Figure 12B:
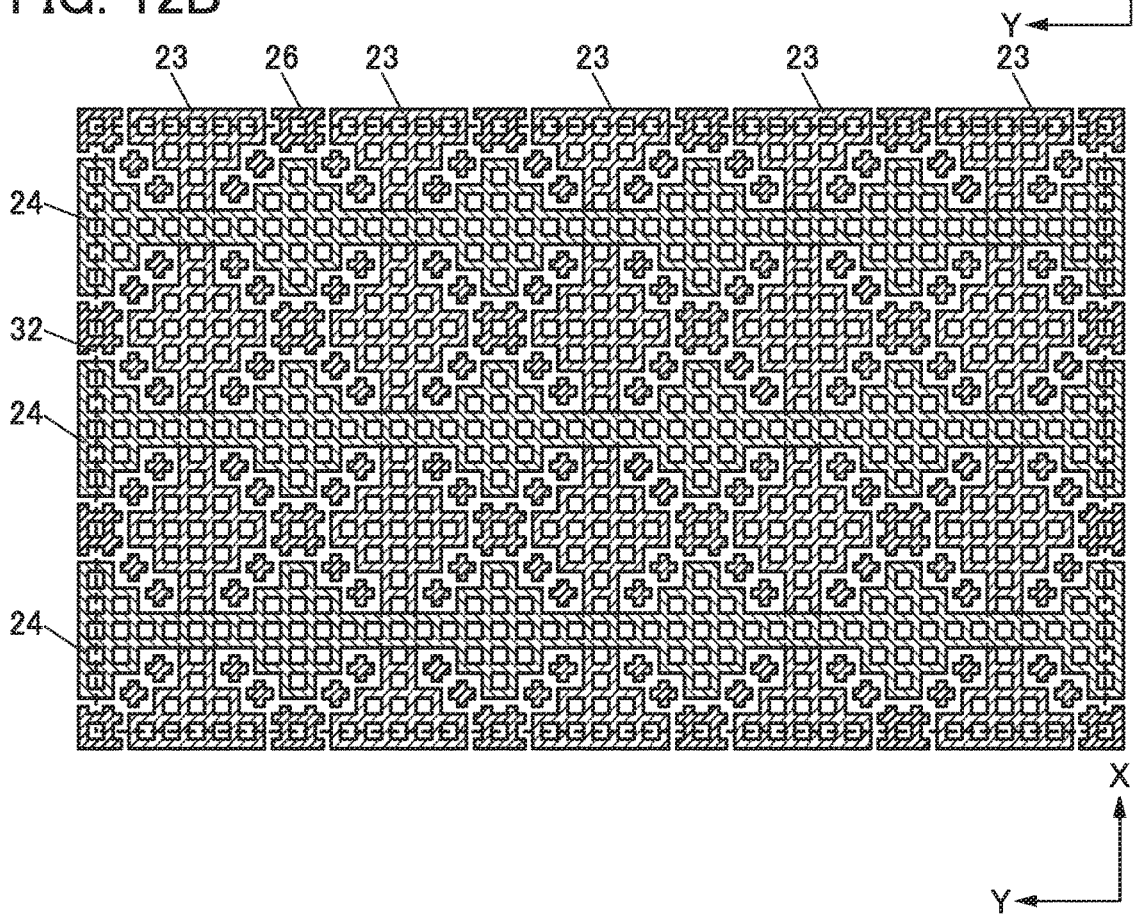

Alternatively, the conductive layer 26 may be provided to fill a space between the wiring 23 and the wiring 24 as illustrated in FIG. 12B. In that case, the conductive layer 26 as well as the wirings 23 and 24 preferably includes portions parallel in the X direction and portions parallel in the Y direction. Moreover, part of the conductive layer 26 preferably has a mesh shape.

When the wirings 23 and 24 are formed by processing different conductive films over different insulating layers, the wirings 23 and 24 can intersect each other without a special contrivance. Alternatively, the wiring 24 may have a structure in which an island-shaped portion formed by processing the same conductive film as the wiring 23 and an island-shaped portion formed by processing a conductive film over an insulating layer that is different from the wiring 23 are connected to each other so that the wirings 23 and 24 intersect each other, for example. Alternatively, the wiring 23 may have a structure in which such two types of island-shaped portions are connected to each other. Alternatively, the wirings 23 and 24 may intersect each other without an electrical short-circuit in such a manner that at least one of the wirings 23 and 24 is formed using portions parallel in the X direction and portions parallel in the Y direction which are formed by processing different conductive films over different insulating layers and the two types of portions are connected to each other.

The above is the description of the wiring shape example.

[Arrangement of Structure Body]

[Arrangement Example 1]

FIGS. 13A to 13D show examples of the arrangement (layout) of the wiring 23, the wiring 24, the pixel electrode 36, the structure body 27, and the like. The examples illustrated in FIGS. 13A to 13D are preferably used in the case where, for example, the wirings 23 and 24 have a stripe shape in a portion overlapping with the display portion 32 as shown in Example 1 of Wiring Shape (FIGS. 11A and 11B and the like).

Figure 13A:
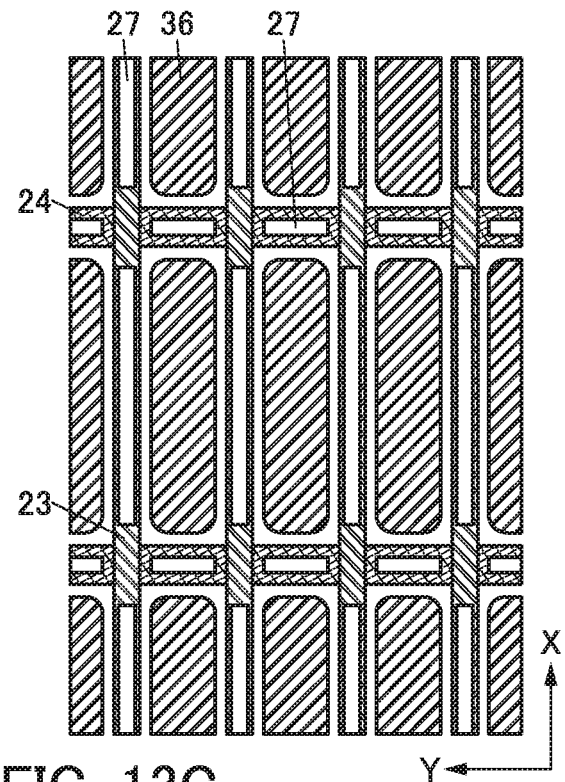
FIGS. 13A to 13D illustrate structure examples of a touch panel module of an embodiment.

As illustrated in FIG. 13A, the wirings 23 extend in the X direction and the wirings 24 extend in the Y direction, and a grid-like shape is formed by these wirings. The pixel electrode 36 is provided inside one of the grids formed by the wirings 23 and 24.

A plurality of island-like structure bodies 27 are provided to overlap with the wirings 23 and 24. The structure bodies 27 are preferably arranged to overlap with either the wiring 23 or the wiring 24 so as not to cross the wirings 23 and 24.

FIG. 13A shows an example in which the structure bodies 27 are not provided in the intersection of the wirings 23 and 24 and in the vicinity thereof. When the structure bodies 27 are not provided partly over the wirings 23 and 24, the common electrode 38 (not illustrated) can be formed so as not to be divided between two adjacent pixels.

Figure 14A:
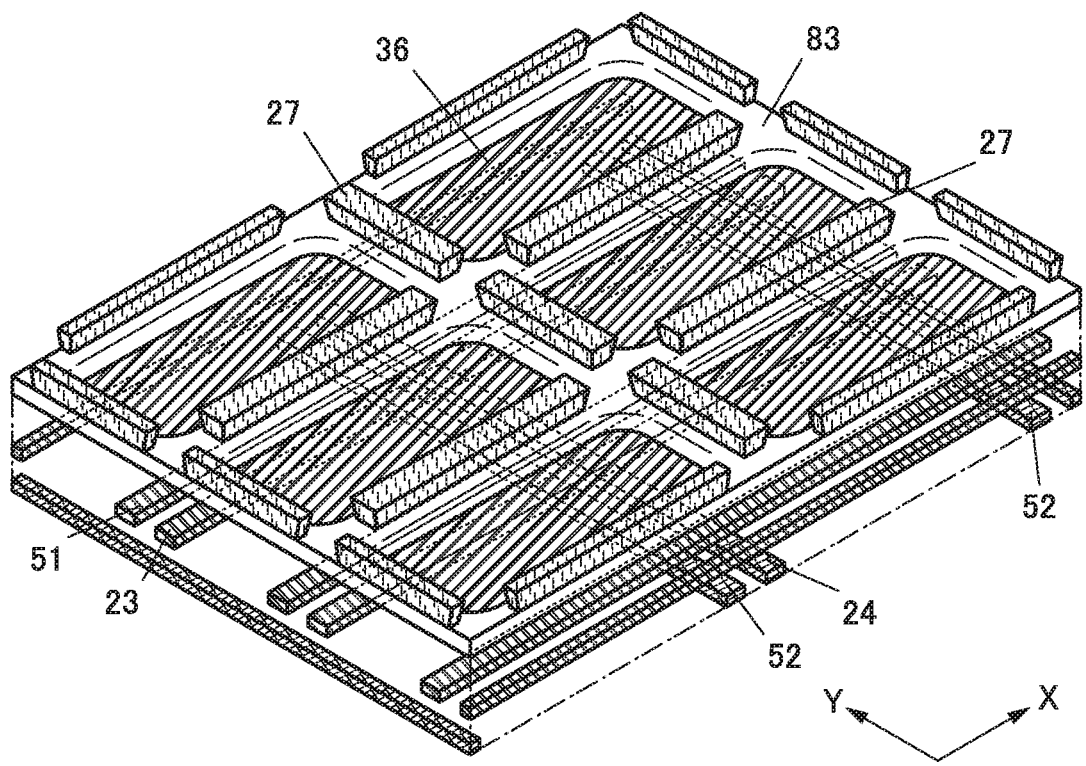
FIGS. 14A and 14B illustrate structure examples of a touch panel module of an embodiment.

FIG. 14A is a schematic perspective view corresponding to FIG. 13A. Note that for clarity, the insulating layers under the insulating layer 83 are not illustrated here.

FIG. 14A shows an example including the signal line 51 formed by processing the same conductive film as the wiring 23 and the scan line 52 formed by processing the same conductive film as the wiring 24.

Figure 14B:
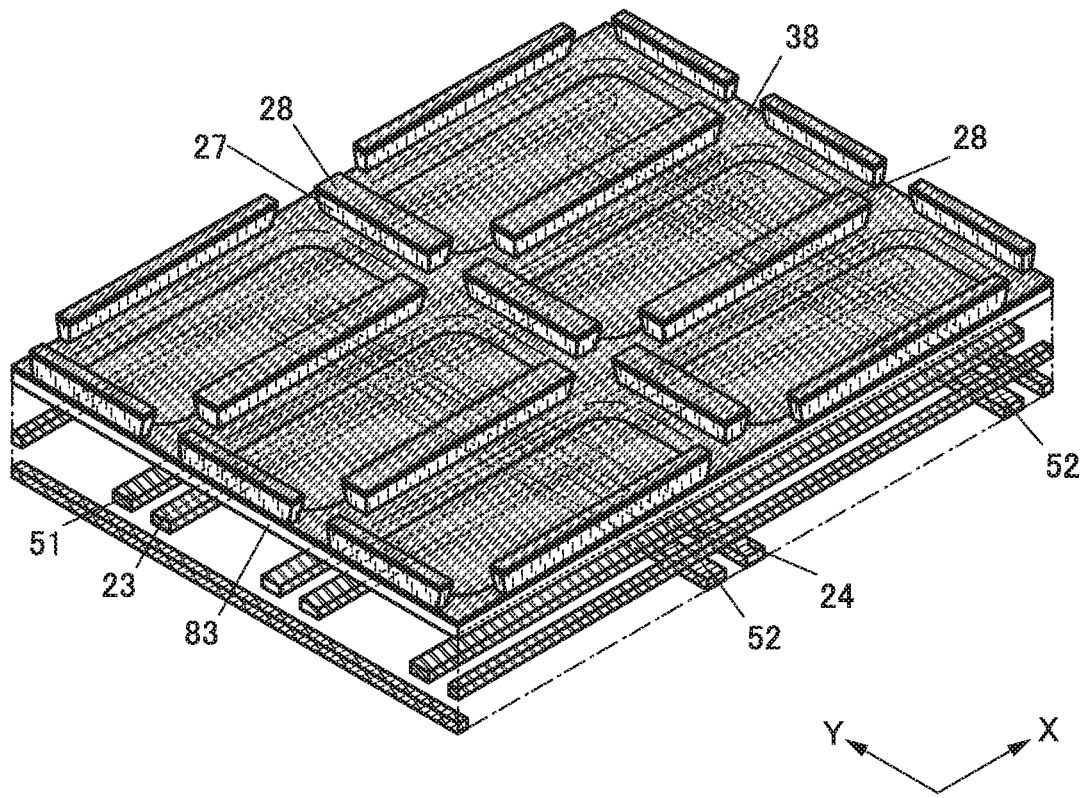

FIG. 14B shows an example of a state after a conductive film to be the common electrode 38 is deposited. The conductive layer 28 is formed on the top surface of the structure body 27. Because the structure bodies 27 are not provided partly, the common electrode 38 is formed to be shared with a plurality of pixel electrodes 36 without being divided.

Figure 13B:
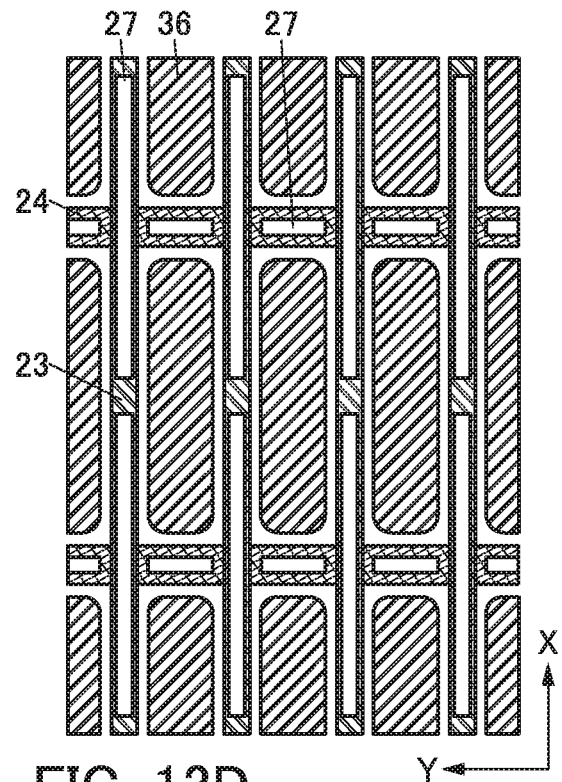

FIG. 13B shows an example in which the structure body 27 over the wiring 23 is also arranged in the intersection of the wirings 23 and 24. In this manner, the structure body 27 over one of the wirings 23 and 24 that is provided above can be arranged in the intersection of the wirings 23 and 24.

Figure 13C:
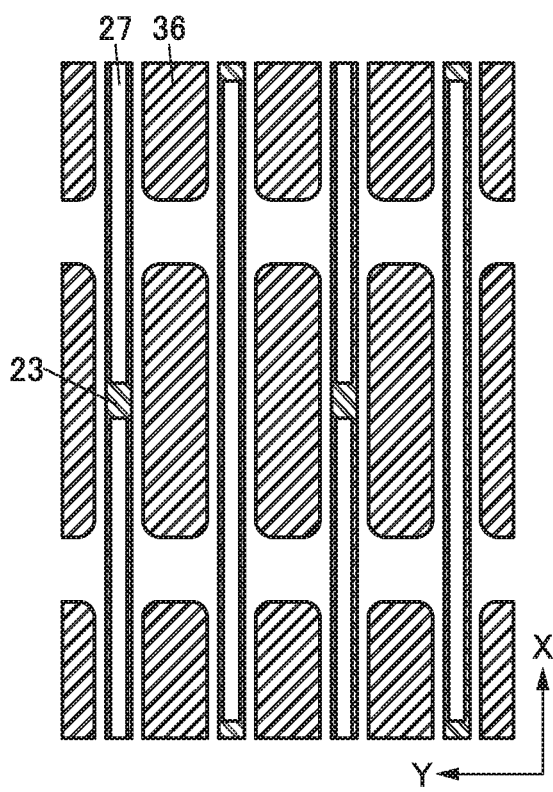
Figure 13D:
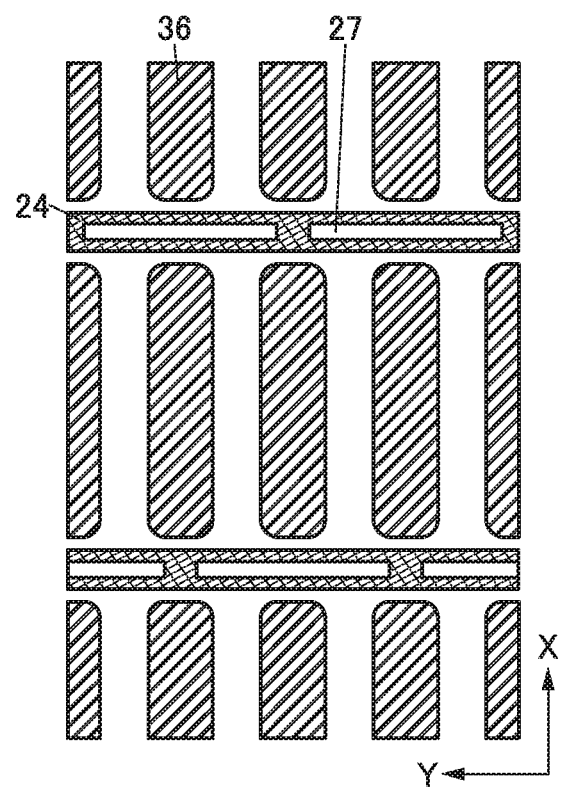

FIG. 13C shows an example of a region where only the wirings 23 are arranged in the display portion 32. FIG. 13D shows an example of a region where only the wirings 24 are arranged in the display portion 32.

As illustrated in FIGS. 13C and 13D, the regularity of the arrangement of the structure bodies 27 is not necessarily the same as that of the pixels. For example, as illustrated in FIG. 13C, part of the wirings 23 over which the structure bodies 27 are not provided may be shifted between the adjacent wirings 23 instead of being aligned in the Y direction. FIG. 13D shows an example in which part of the wirings 24 over which the structure bodies 27 are not provided are shifted between the adjacent wirings 24.

[Arrangement Example 2]

FIGS. 15A to 15D each show an example in which the wiring 23 includes both of portions parallel in the X direction and portions parallel in the Y direction. Although the wiring 23 is used for the description here, the wiring 24, the conductive layers 26, 26a, 26b, and the like can have similar shapes. The examples illustrated in FIGS. 15A to 15D are preferably used in the case where, for example, the wirings 23 and 24 have a mesh shape as shown in Example 2 of Wiring Shape (FIGS. 12A and 12B and the like).

Figure 15A:
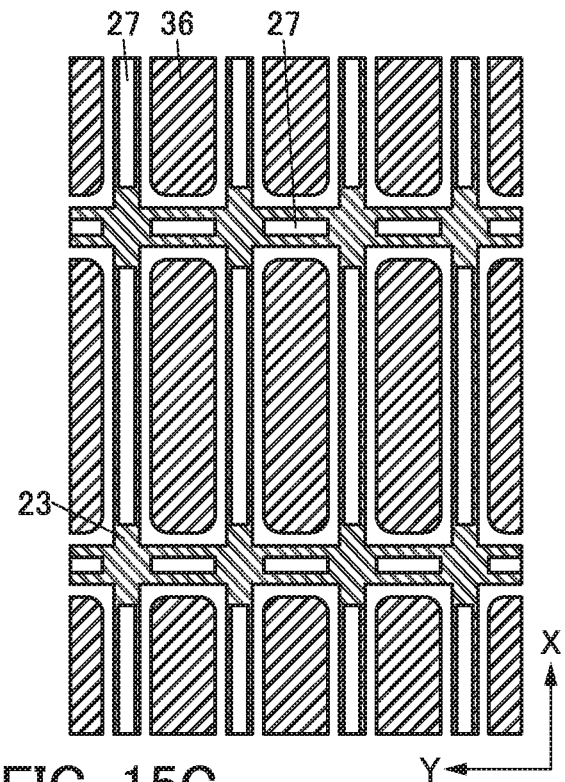
FIGS. 15A to 15D illustrate structure examples of a touch panel module of an embodiment.

FIG. 15A shows an example of arranging two types of rectangular structure bodies 27: one is long in the X direction and the other is long in the Y direction.

Figure 15B:
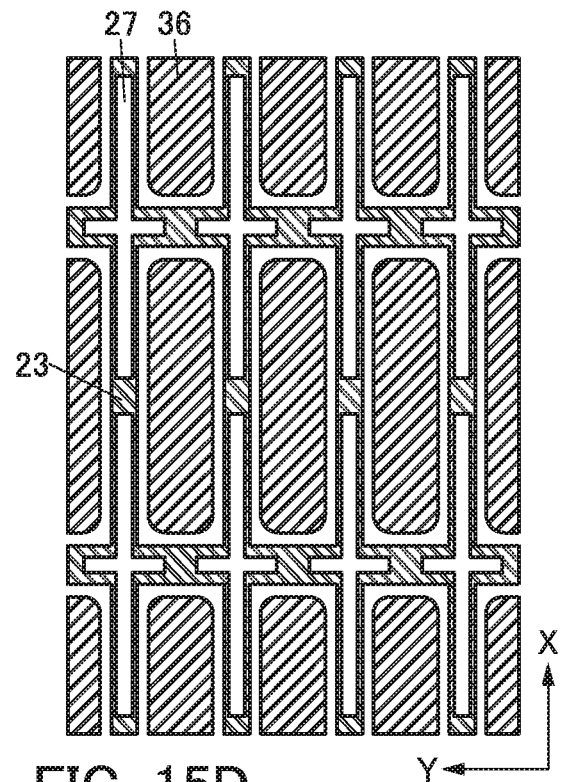

FIG. 15B shows an example of arranging cross-shaped (also referred to as cruciform) structure bodies 27.

Figure 15C:
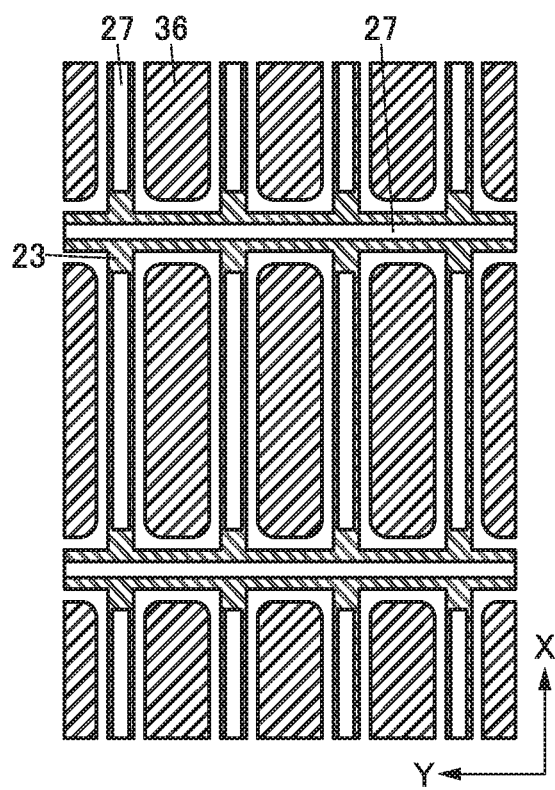

FIG. 15C shows an example of arranging rectangular structure bodies 27 that are continuous in the Y direction. In that case, the common electrode 38 (not illustrated) is divided between the adjacent pixels in the X direction.

Figure 15D:
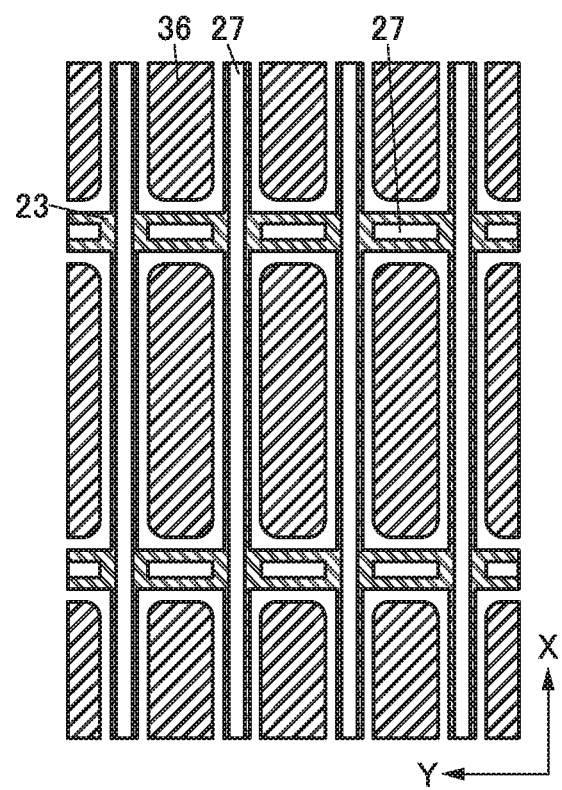

FIG. 15D shows an example of arranging rectangular structure bodies 27 that are continuous in the X direction. In that case, the common electrode 38 (not illustrated) is divided between the adjacent pixels in the Y direction.

The above is the description of the arrangement of structure bodies.

[Structure Example of Pixel]

More specific examples of a pixel which is provided in the display portion 32 and includes a light-emitting element will be described with reference to drawings.

Note that in the following diagrams, a layer, a wiring, and the like formed by processing the same conductive film are sometimes shown with the same hatching pattern for simplicity. In addition, portions similar to those described in Example 1 of Wiring Shape are not described in some cases.

[Structure Example of Pixel]

Figure 16A:
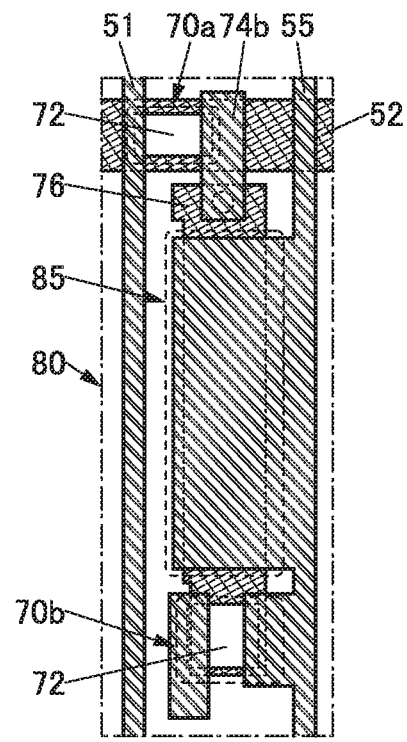
FIGS. 16A to 16D illustrate structure examples of a pixel of an embodiment.
Figure 16B:
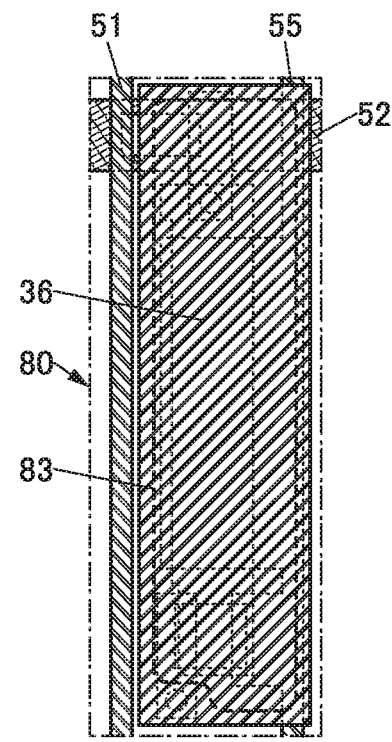
Figure 16C:
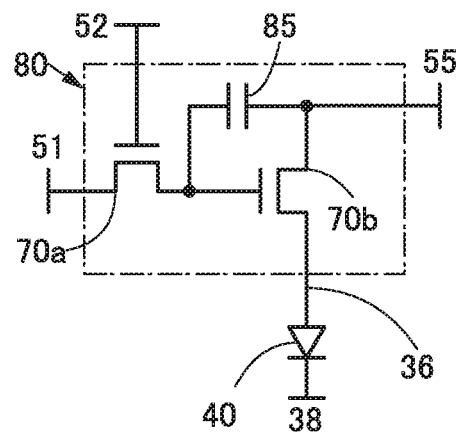

FIGS. 16A and 16B illustrates a layout example of a pixel circuit that can be provided in the display portion 32. The pixel electrode 36 and the insulating layer 83 are not illustrated in FIG. 16A and are illustrated in FIG. 16B. FIG. 16C is a circuit diagram corresponding to the pixel circuit illustrated in FIGS. 16A and 16B.

A pixel circuit 80 includes a transistor 70a, a transistor 70b, a capacitor 85, the pixel electrode 36, and the like. The pixel circuit 80 is connected to the signal line 51, the scan line 52, and a power supply line 55. The pixel electrode 36 serves as an electrode of the light-emitting element 40. The common electrode 38 also serves as the other electrode of the light-emitting element 40.

In the pixel circuit 80, part of the scan line 52 serves as a gate electrode of the transistor 70a. Part of the signal line 51 serves as one of a source electrode and a drain electrode of the transistor 70a. As illustrated in FIG. 16A, the semiconductor layer 72 is provided to overlap with part of the scan line 52, and the signal line 51 is provided to overlap with part of the semiconductor layer 72. Furthermore, the conductive layer 74b serving as the other of the source electrode and the drain electrode of the transistor 70a is provided on a side opposite to the signal line 51 of the semiconductor layer 72. The conductive layer 74b is electrically connected to the conductive layer 76. A portion of the conductive layer 76 serves as a gate electrode of the transistor 70b. Another portion of the conductive layer 76 serves as an electrode of the capacitor 85. A portion of the power supply line 55 functions as the other electrode of the capacitor 85 and another portion of the power supply line 55 functions as one of a source and a drain of the transistor 70b. The other of the source and the drain of the transistor 70b is electrically connected to the pixel electrode 36.

Figure 16D:
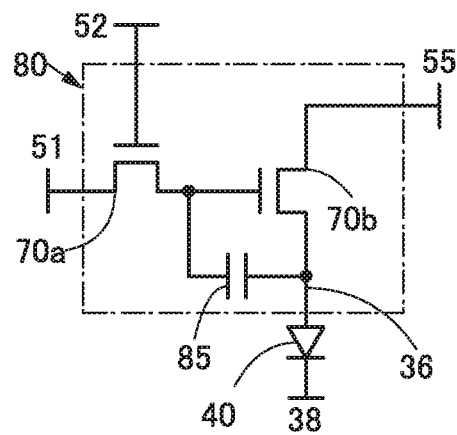

Although the other electrode of the capacitor 85 is electrically connected to the power supply line 55 in FIG. 16C, the other electrode of the capacitor 85 may be electrically connected to an electrode of the light-emitting element 40 as illustrated in FIG. 16D.

The power supply line 55 is configured to supply a constant potential or signal to the capacitor 85 and one of the source and the drain of the transistor 70b.

[Arrangement Example 1-1 of Wiring ]

Figure 17:
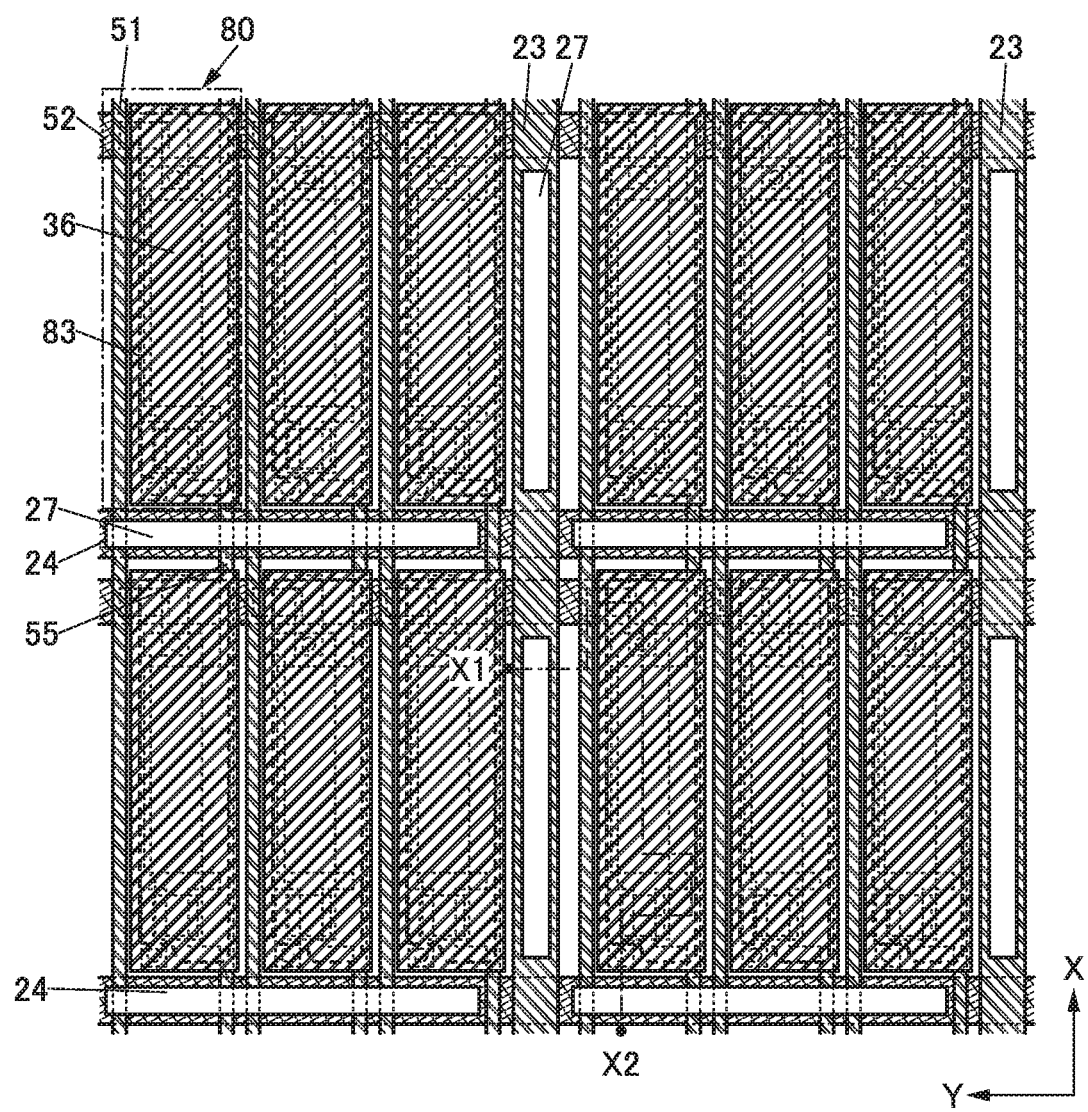
FIG. 17 illustrates a structure example of a touch panel module of an embodiment.

FIG. 17 shows a layout example including the pixel circuit 80 illustrated in FIG. 16B and the wirings 23 and 24.

The pixel circuits 80 are arranged in the X direction and the Y direction in a matrix. The pixel circuit 80 corresponds to one subpixel included in the display portion 32. FIG. 17 shows an example in which the wirings 23 and 24 are arranged so as to surround three subpixels constituting one pixel.

The signal line 51 and the wiring 23 are arranged in the X direction. The scan line 52 and the wiring 24 are arranged in the Y direction. The signal line 51 and the wiring 23 are formed by processing the same conductive film, and the scan line 52 and the wiring 24 are formed by processing the same conductive film. Thus, the wirings 23 and 24 can be formed without an increase in the number of steps.

Such a structure enables the wiring 23 and the wiring 24, the signal line 51 and the wiring 24, and the scan line 52 and the wiring 23 to intersect each other without a special contrivance.

An example in which the power supply line 55 is parallel to the signal line 51 is shown here. Note that the power supply line 55 may be parallel to the scan line 52. In that case, when the power supply line 55 is formed by processing the same conductive film as the scan line 52, the power supply line 55 and the signal line 51 can intersect each other and the power supply line 55 and the wiring 23 can intersect each other without any special contrivance.

The wiring 23 is provided between the two pixel circuits 80 adjacent in the X direction. In other words, the wiring 23 is provided between the two pixel electrodes 36 adjacent in the X direction, between the two signal lines 51 adjacent in the X direction, between the two power supply lines 55 adjacent in the X direction, between the two semiconductor layers 72 adjacent in the X direction, between the two conductive layers 74b adjacent in the X direction, or the like.

Meanwhile, the wiring 24 is provided between the two pixel circuits 80 adjacent in the Y direction. In other words, the wiring 24 is provided between the two pixel electrodes 36 adjacent in the Y direction, between the two scan lines 52 adjacent in the Y direction, between the two semiconductor layers 72 adjacent in the Y direction, between the two conductive layers 74b adjacent in the Y direction, or the like.

The structure bodies 27 are provided over the wirings 23 and 24. The method for arranging the structure bodies 27 is not limited to the example shown here, and the above description can be referred to.

FIG. 17 shows an example in which the width of the wiring 24 is larger than that of the wiring 23. For example, in the case where the wiring 24 is formed using a material with lower conductivity than a material used for the wiring 23, or the case where the wiring 24 is arranged along the long-side direction of the display portion, the width of the wiring 24 is preferably larger than that of the wiring 23 to reduce electrical resistance. Alternatively, the thickness of the wiring 24 may be larger than that of the wiring 23 to reduce the electrical resistance of the wiring 24. Note that the width of the wiring 23 and the width of the wiring 24 are not limited thereto, and that of the wiring 23 may be larger than that of the wiring 24 or those of the wirings 23 and 24 may be substantially the same. The width, thickness, material, and the like of each of the wirings 23 and 24 can be appropriately set so that for example, the time constant of the wiring 23 and that of the wiring 24 are substantially the same or one of the wirings 23 and 24 which is used as a detection-side wiring has a smaller time constant than the other.

Although the three pixel circuits 80 are arranged between the two wirings 23, one embodiment of the present invention is not limited to this example. One, two, or four or more pixel circuits 80 may be arranged between the two wirings 23. Similarly, although the pixel circuit 80 is arranged between the two wirings 24, one embodiment of the present invention is not limited to this example and two or more pixel circuits 80 may be arranged.

[Arrangement Example 1-2 of Wiring]

Figure 18A:
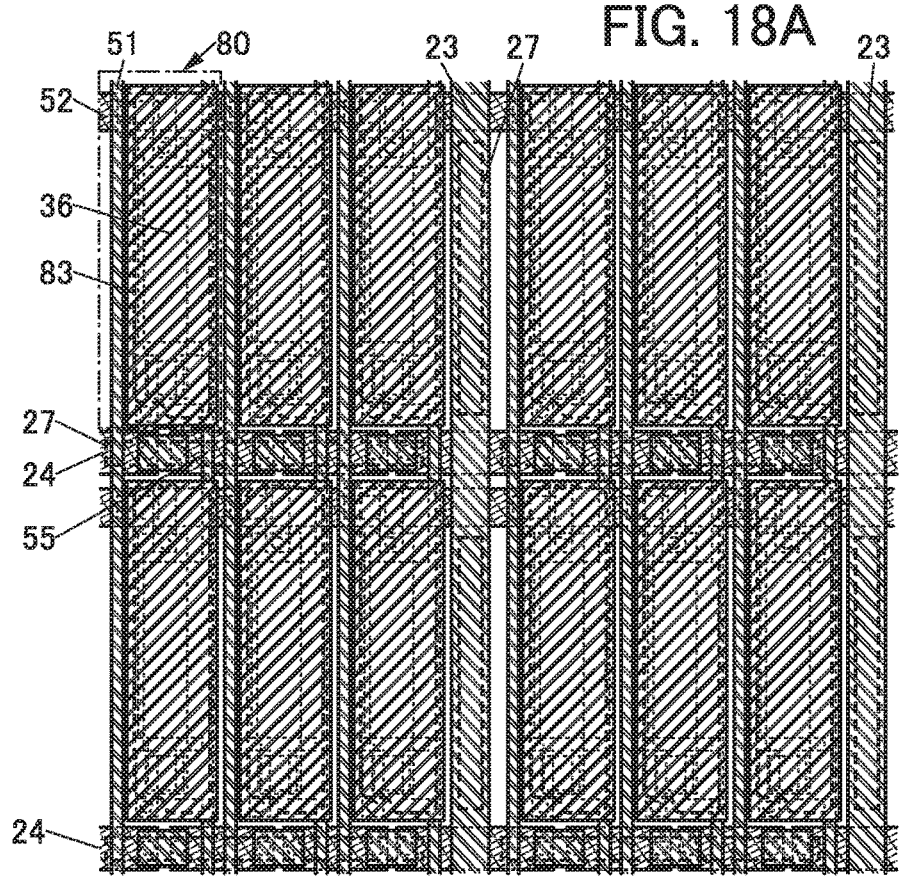
FIGS. 18A and 18B illustrate structure examples of a touch panel module of an embodiment.

FIG. 18A shows an example in which the structure of the wiring 24 is different from that in FIG. 17. Here, the structure bodies 27 are denoted by dashed lines for clearly showing the structures of the wirings 23 and 24.

The wiring 24 has a structure in which a portion formed by processing the same conductive film as the signal line 51 and a portion formed by processing the same conductive film as the scan line 52 are alternately arranged. The two types of portions overlap with each other in regions and are electrically connected to each other through openings in an insulating layer positioned therebetween in the regions.

Each of the portions of the wiring 24 that are formed by processing the same conductive film as the scan line 52 intersects at least one of the signal line 51, the power supply line 55, and the wiring 23.

[Arrangement Example 1-3 of Wiring]

Figure 18B:
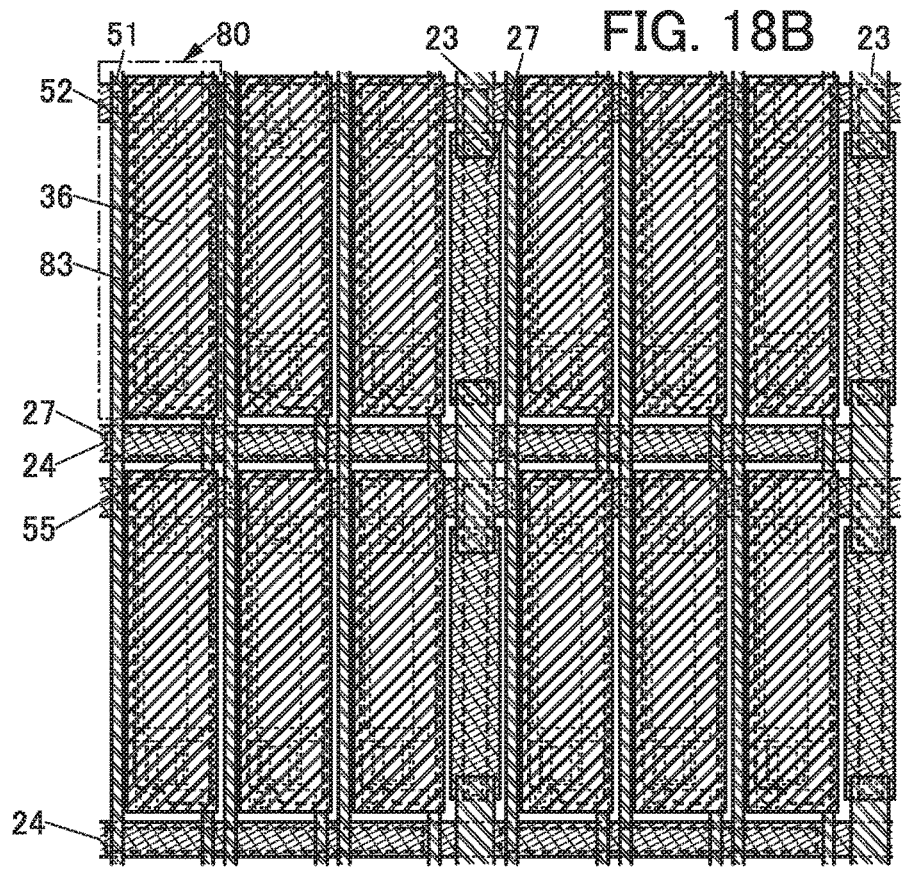

FIG. 18B shows an example in which the structure of the wiring 23 is different from that in FIG. 17. The wiring 23 has a structure in which a portion formed by processing the same conductive film as the signal line 51 and a portion formed by processing the same conductive film as the scan line 52 are alternately arranged. The two types of portions overlap with each other in regions and are electrically connected to each other through openings in an insulating layer positioned therebetween in the regions.

Each of the portions of the wiring 23 that are formed by processing the same conductive film as the signal line 51 intersects the scan line 52.

Arrangement Examples 1-1 to 1-3 are preferably used in the case where the wiring 23 and the wiring 24 have a stripe shape in a portion overlapping with the display portion 32 as illustrated in Example 1 of Wiring Shape (e.g., FIGS. 11A and 11B), for example.

[Arrangement Example 2-1 of Wiring]

Figure 19:
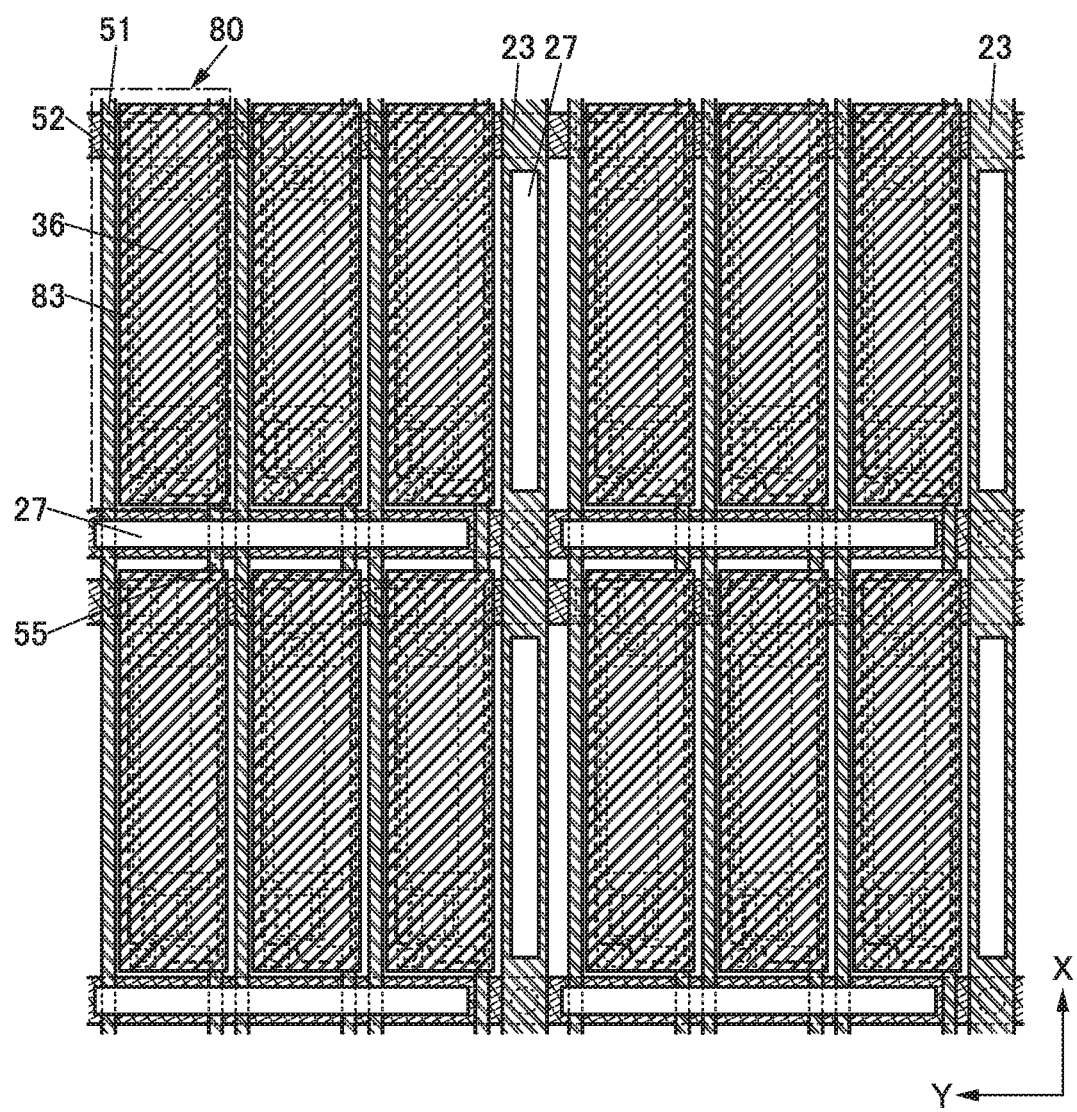
FIG. 19 illustrates a structure example of a touch panel module of an embodiment.

FIG. 19 shows an example in which the wiring 23 includes both of portions parallel in the X direction and portions parallel in the Y direction. Although the wiring 23 is used for the description here, the wiring 24, the conductive layers 26, 26a, 26b, and the like can have similar shapes.

The portions parallel in the X direction in the wiring 23 are formed by processing the same conductive film as the signal line 51. Meanwhile, the portions parallel in the Y direction are formed by processing the same conductive film as the scan line 52. In the wiring 23, the portions parallel in the X direction are electrically connected to the portions parallel in the Y direction through openings in an insulating film positioned between the two types of portions at the intersections of the two types of portions. With such a structure, the wiring 23 can have a mesh shape.

Here, it can be said that the wiring 23 has one opening surrounded by two portions adjacent and parallel in the X direction and two portions adjacent and parallel in the Y direction. Although FIG. 19 illustrates a structure where the three pixel electrodes 36 are provided in the opening, one embodiment of the present invention is not limited thereto, and a structure where one or more pixel electrodes 36 are provided can be employed. When the wiring 23 has a dense mesh shape, the resistance of the wiring 23 can be reduced. Meanwhile, when the wiring 23 has a sparse mesh shape, the parasitic capacitance of the wiring 23 can be reduced.

In FIG. 19, the distance between the two portions parallel and adjacent in the X direction in the wiring 23 and the distance between the two portions parallel and adjacent in the Y direction in the wiring 23 are set to be substantially the same; however, they may be different from each other. For example, the two portions parallel and adjacent in the Y direction may be provided with a distance of two pixels (e.g., with a distance of six subpixels in the case where three subpixels of RGB are provided) therebetween, and the two portions parallel and adjacent in the X direction may be provided with a distance of one pixel therebetween. In that case, the wiring 23 has a mesh shape including a rectangular opening which is long in the Y direction.

[Arrangement Example 2-2 of Wiring]

Figure 20A:
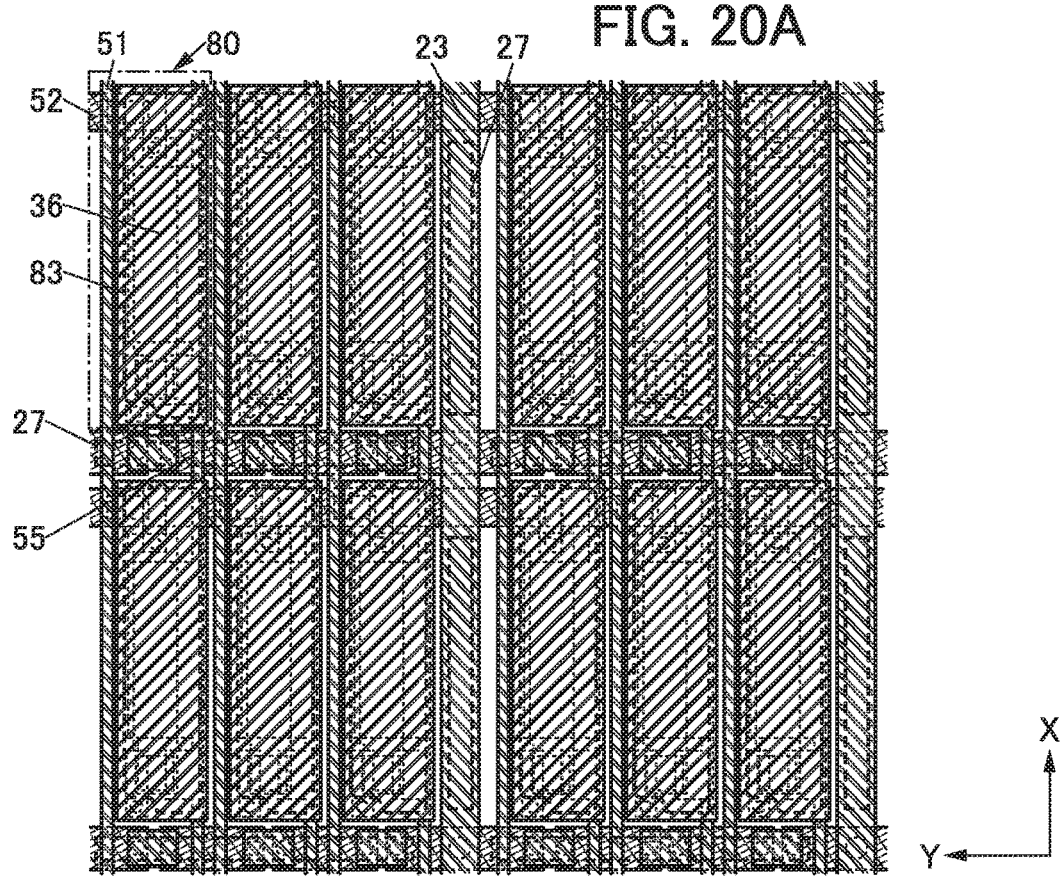
FIGS. 20A and 20B illustrate structure examples of a touch panel module of an embodiment.

FIG. 20A shows an example in which the structure of the wiring 23 is different from that in FIG. 19. In the structure in FIG. 20A, portions parallel in the X direction in the wiring 23 are formed by processing the same conductive film as the signal line 51. Meanwhile, portions parallel in the Y direction in the wiring 23 have a structure in which a portion (conductive layer) obtained by processing the same conductive film as the signal line 51 and a portion (conductive layer) obtained by processing the same conductive film as the scan line 52 are alternately arranged. In the portions parallel in the Y direction, the two different conductive layers overlap with each other in regions and are electrically connected to each other through openings in an insulating layer positioned therebetween in the regions.

In the portions of the wiring 23 which are parallel in the Y direction, the portions obtained by processing the same conductive film as the scan line 52 intersect at least one of the signal line 51 and the power supply line 55.

[Arrangement Example 2-2 of Wiring]

Figure 20B:
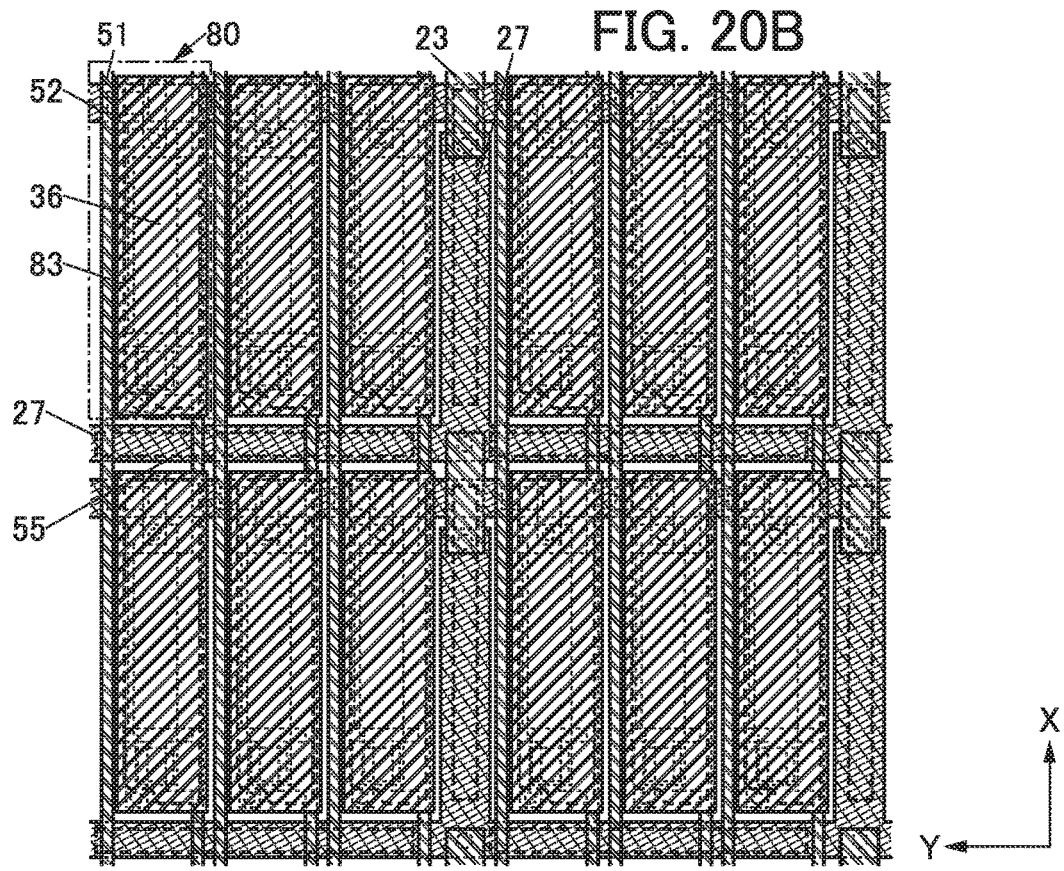

FIG. 20B shows an example in which the structure of the wiring 23 is different from those in FIG. 19 and FIG. 20A. In the structure in FIG. 20B, portions parallel in the Y direction in the wiring 23 are formed by processing the same conductive film as the scan line 52. Meanwhile, portions parallel in the X direction in the wiring 23 have a structure in which a portion (conductive layer) obtained by processing the same conductive film as the scan line 52 and a portion (conductive layer) obtained by processing the same conductive film as the signal line 51 are alternately arranged. In the portions parallel in the X direction, the two different conductive layers overlap with each other in regions and are electrically connected to each other through openings in an insulating layer positioned therebetween in the regions.

In the portions of the wiring 23 which are parallel in the X direction, the portions obtained by processing the same conductive film as the signal line 51 intersect the scan line 52.

Arrangement Example 2-1 to 2-3 of Wiring are preferably used in the case where the wiring 23 and the wiring 24 have a mesh shape as illustrated in Example 2 of Wiring Shape (e.g., FIGS. 12A and 12B), for example.

[Arrangement Example 3-1 of Wiring]

Although the example in which the wiring 23 and the wiring 24 are formed by processing the same conductive films as the signal line 51 and the scan line 52 is described above, one or both of the wirings 23 and 24 may be formed by processing a conductive film different from the signal line 51 and the scan line 52.

FIG. 21A shows an example in which the wiring 23 is formed by processing a conductive film different from the signal line 51 unlike the structure illustrated in FIG. 17.

Here, the wiring 23 may be positioned above the signal line 51 and the scan line 52, between the scan line 52 and the signal line 51, or below the signal line 51 and the scan line 52 (on the substrate 21 side). In that case, the wiring 23, the signal line 51, and the scan line 52 are preferably formed over different insulating layers.

The wiring 23 may be formed by, for example, processing the same conductive film as the pixel electrode 36. In that case, the wiring 23 can be formed through the same steps as the pixel electrode 36.

When the wiring 23 and the wiring 24 are electrically connected to each other through openings in the insulating layer positioned therebetween, a mesh shape can be formed.

[Arrangement Example 3-2 of Wiring]

FIG. 21B shows an example in which the wiring 24 is formed by processing a conductive film different from the scan line 52 unlike the structure illustrated in FIG. 17.

The wiring 24 in FIG. 21B is provided in a position closer to the substrate 21 side than the wiring 23 and the signal line 51 are. However, one embodiment of the present invention is not limited thereto, and the wiring 24 may be provided over an insulating layer different from the signal line 51, the scan line 52, the wiring 23, and the like. Furthermore, the wiring 24 may be formed by processing the same conductive film as the pixel electrode 36.

[Arrangement Example 3-3 of Wiring]

FIG. 22 shows an example in which the wiring 23, the wiring 24, the signal line 51, and the scan line 52 are formed by processing different conductive films. Here, the wiring 23, the wiring 24, the signal line 51, and the scan line 52 may be provided over different insulating layers.

In the example in FIG. 22, the wiring 23 is positioned at least above the wiring 24, the signal line 51, and the scan line 52, and the wiring 24 is positioned at least above the signal line 51 and the scan line 52.

Note that the positions of the wiring 23, the wiring 24, the signal line 51, and the scan line 52 in the height direction are not limited thereto, and a variety of stack structures can be employed.

Although not illustrated here, in of the structure illustrated in FIG. 22, the wiring 23 and the signal line 51 may be provided to at least partly overlap with each other, or the wiring 24 and the scan line 52 may be provided to at least partly overlap with each other.

[Arrangement Example 3-4 of Wiring]

Figure 23:
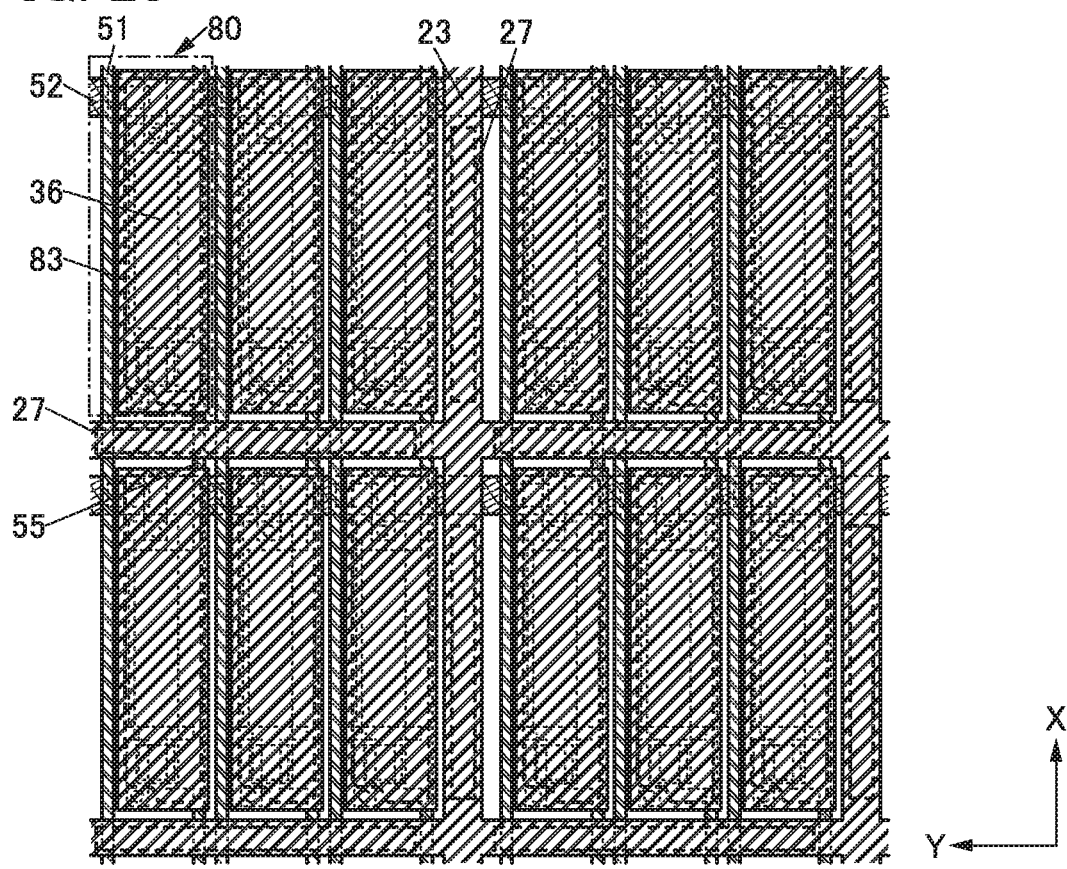
FIG. 23 illustrates a structure example of a touch panel module of an embodiment.

FIG. 23 shows an example in which the wiring 23 having a mesh shape is formed by processing the same conductive film as the pixel electrode 36.

In particular, the pixel electrode 36 is processed into an island shape in many cases; hence, the wirings 23 and 24 with a mesh shape which are arranged to surround the pixel electrode 36 can be easily formed by processing the pixel electrode 36. The pixel electrode 36 and the wirings 23 and 24 are preferably formed at the same time to simplify the manufacturing process.

[Conductive Layer on Counter Substrate]

Described below is the layout of the conductive layer that is closer to the touch surface than the conductive layer 28 over the inverse tapered structure body 27 is.

Figure 24A:
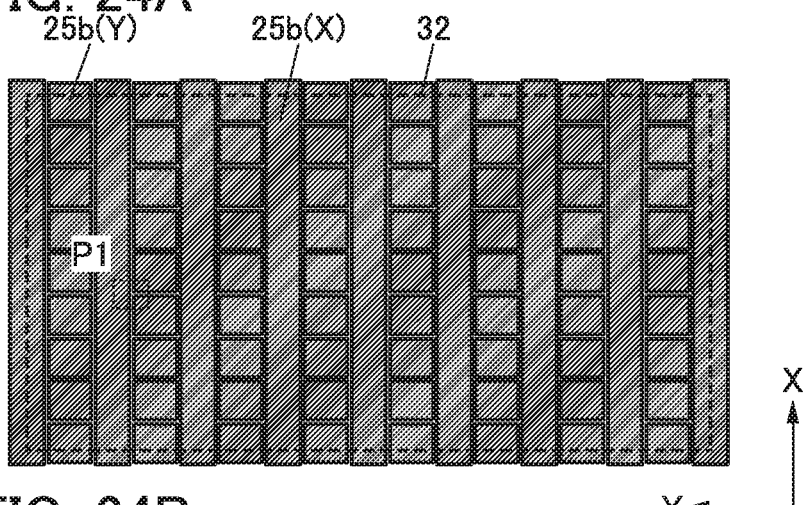
FIGS. 24A to 24C illustrate structure examples of a conductive layer of an embodiment.

FIG. 24A shows a layout example of the conductive layer also serving as a light-blocking layer. FIG. 24A illustrates a plurality of conductive layers 25b(X) extending in the X direction, and island-like conductive layers 25b(Y) positioned between the adjacent conductive layers 25b(X). In FIG. 24A, the display portion 32 is denoted by a dashed line.

Figure 24B:
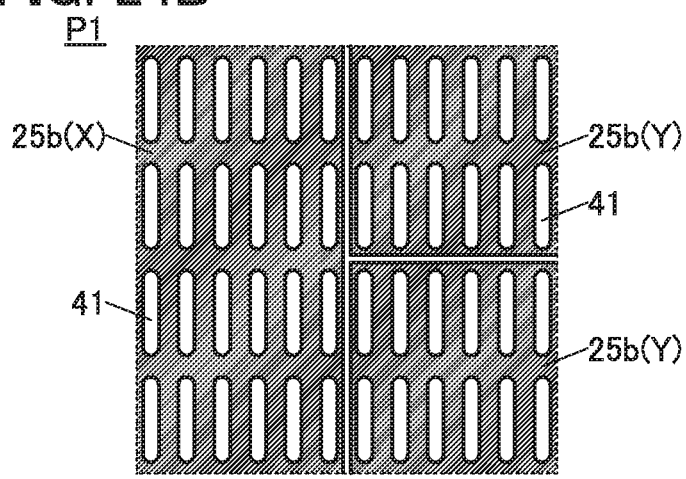

FIG. 24B is an enlarged view of a region P1 in FIG. 24A. The conductive layer 25b(X) and the conductive layer 25b(Y) each include an opening 41 that passes light from the light-emitting element 40.

In this manner, the conductive layer 25b(X) and the conductive layer 25b(Y) are arranged not only to overlap with the structure body 27 or the wiring 23 or 24, but also to be shared with a plurality of pixels. Accordingly, the facing area of an object and the conductive layer 25b(X) or the conductive layer 25b(Y) increases, resulting in improved detection sensitivity.

Note that in FIG. 24B, the light-blocking layer 66 that does not overlap with the structure body 27 may be arranged between the conductive layer 25b(X) and the conductive layer 25b(Y).

Figure 24C:
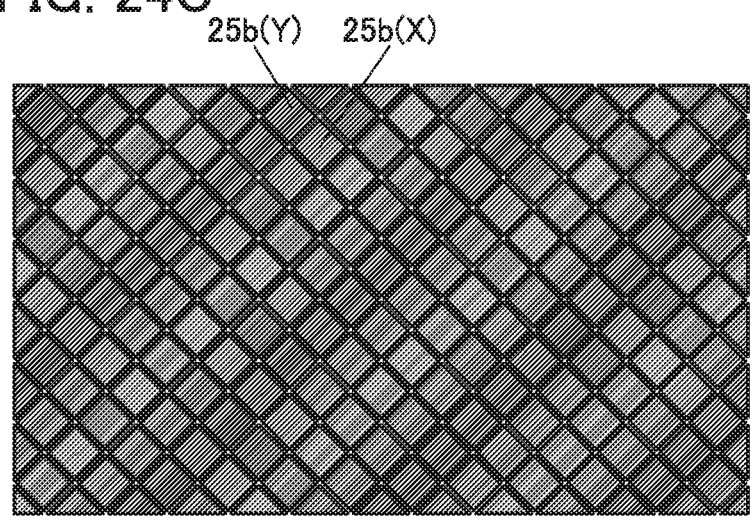

FIG. 24C shows an example in which the conductive layer 25b(X) and the conductive layer 25b(Y) each have a square pattern. Such a structure is particularly effective in the case where the wiring 23 and the wiring 24 have a mesh shape.

Figure 25A:
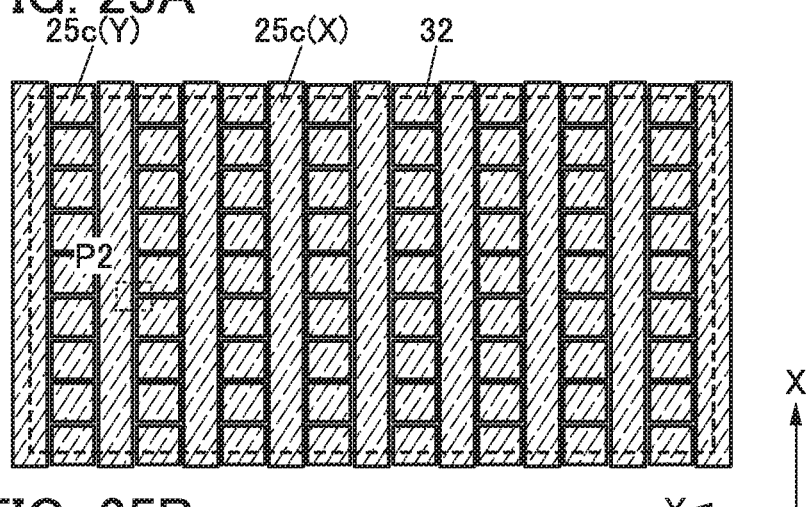
FIGS. 25A to 25C illustrate structure examples of a conductive layer of an embodiment.
Figure 25B:
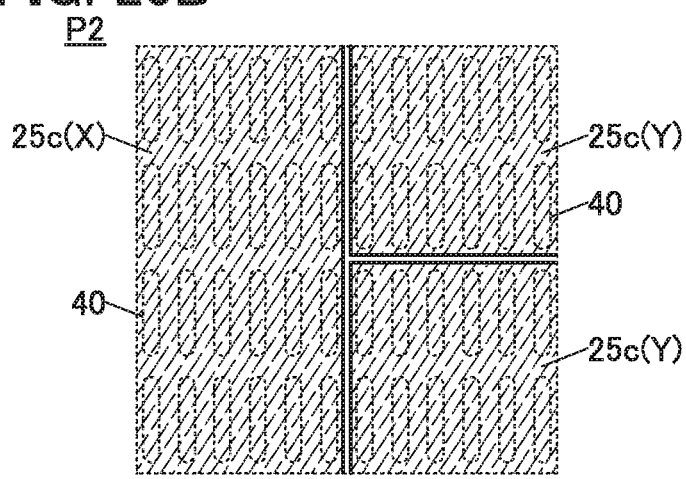
Figure 25C:
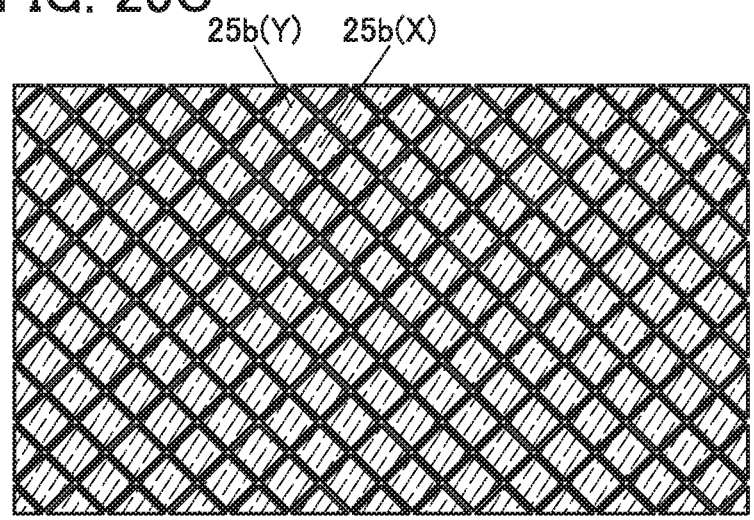

A similar shape can be used for the conductive layer 25c that can be provided on the touch surface side of the substrate 31. FIGS. 25A to 25C show layout examples of a conductive layer 25c(X) and a conductive layer 25c(Y) as examples of the conductive layer 25c.

In the case where a material transmitting visible light is used for the conductive layer 25c(X) and the conductive layer 25c(Y), the conductive layer 25c(X) and the conductive layer 25c(Y) do not necessarily include an opening in a position overlapping with the light-emitting element 40 and can be arranged so as to overlap with the light-emitting element 40 as illustrated in FIG. 25B.

Note that in the case where a material shielding visible light is used for the conductive layer 25c(X) and the conductive layer 25c(Y), the conductive layer 25c(X) and the conductive layer 25c(Y) can be arranged in a manner similar to that of the conductive layer 25b(X) and the conductive layer 25b(Y).

[Configuration Example of Circuit]

Figure 26:
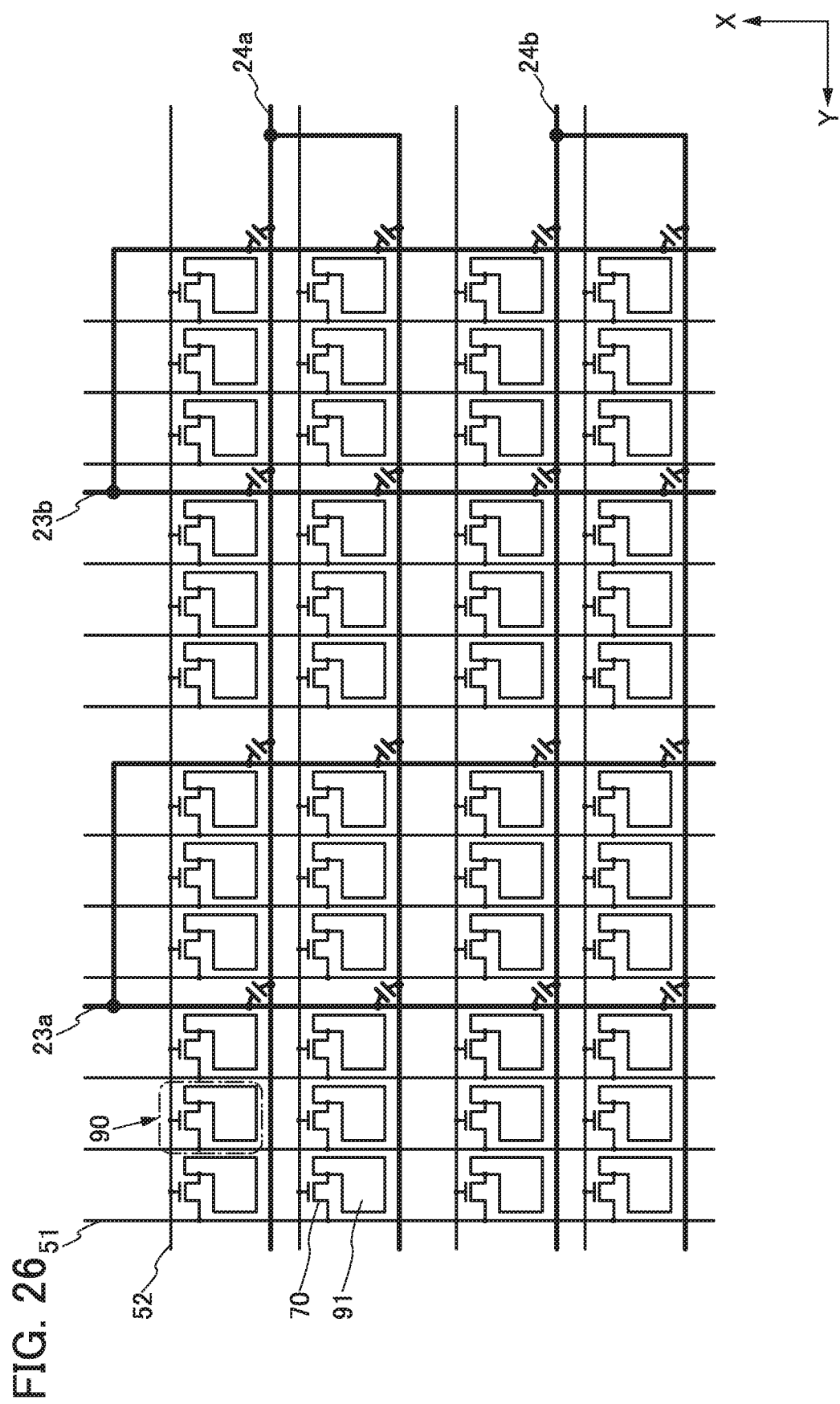
FIG. 26 illustrates a structure example of a circuit of an embodiment.

FIG. 26 illustrates an example of a circuit diagram of a touch panel of one embodiment of the present invention. FIG. 26 illustrates part of a display portion in which two kinds of wirings included in a touch sensor are each provided in a stripe form. The example in FIG. 26 corresponds to the examples in FIGS. 11A and 11B and the like.

Pixels 90 arranged in a matrix each include the transistor 70 and a circuit 91. The circuit 91 includes at least one display element. A variety of display elements can be applied to the display element. Typically, the above-described light-emitting element 40 is preferably used.

A wiring 23a and a wiring 23b each include a plurality of portions extending in a direction parallel to the signal line 51 (the X direction). Furthermore, a wiring 24a and a wiring 24b include a plurality of portions extending in a direction parallel to the scan line 52 (the Y direction). The wiring 23a, the wiring 23b, the wiring 24a, and the wiring 24b have the plurality of portions electrically connected to each other in a region outside the display portion.

As illustrated in FIG. 26, capacitive coupling is formed between the wiring 23 and the wiring 24. In other words, the capacitors are arranged in a matrix to form a touch sensor. The touch sensor can sense an object by utilizing a change in capacitance of the capacitor due to the approach of the object. The capacitor includes, for example, a first capacitance component of a portion where the wiring 23 and the wiring 24 overlap with each other and a second capacitance component formed when the wiring 23 and the wiring 24 are provided close to each other. The second capacitance component is mainly changed owing to the approach of the object.

Note that here, an example in which four wirings (the wiring 23a, the wiring 23b, the wiring 24a, and the wiring 24b) are provided is shown for simplicity. The wirings extending in the X direction (the wirings 23a and 23b) each have two portions parallel in the X direction and the wirings extending in the Y direction (the wirings 24a and 24b) each have two portions parallel in the Y direction; however, one embodiment of the present invention is not limited thereto, and three or more portions parallel in the X direction or three or more portions parallel in the Y direction may be provided. The number of pixels 90 provided between two linear portions of one wiring is not limited to the example in FIG. 26 as long as at least one pixel 90 is provided.

Figure 27:
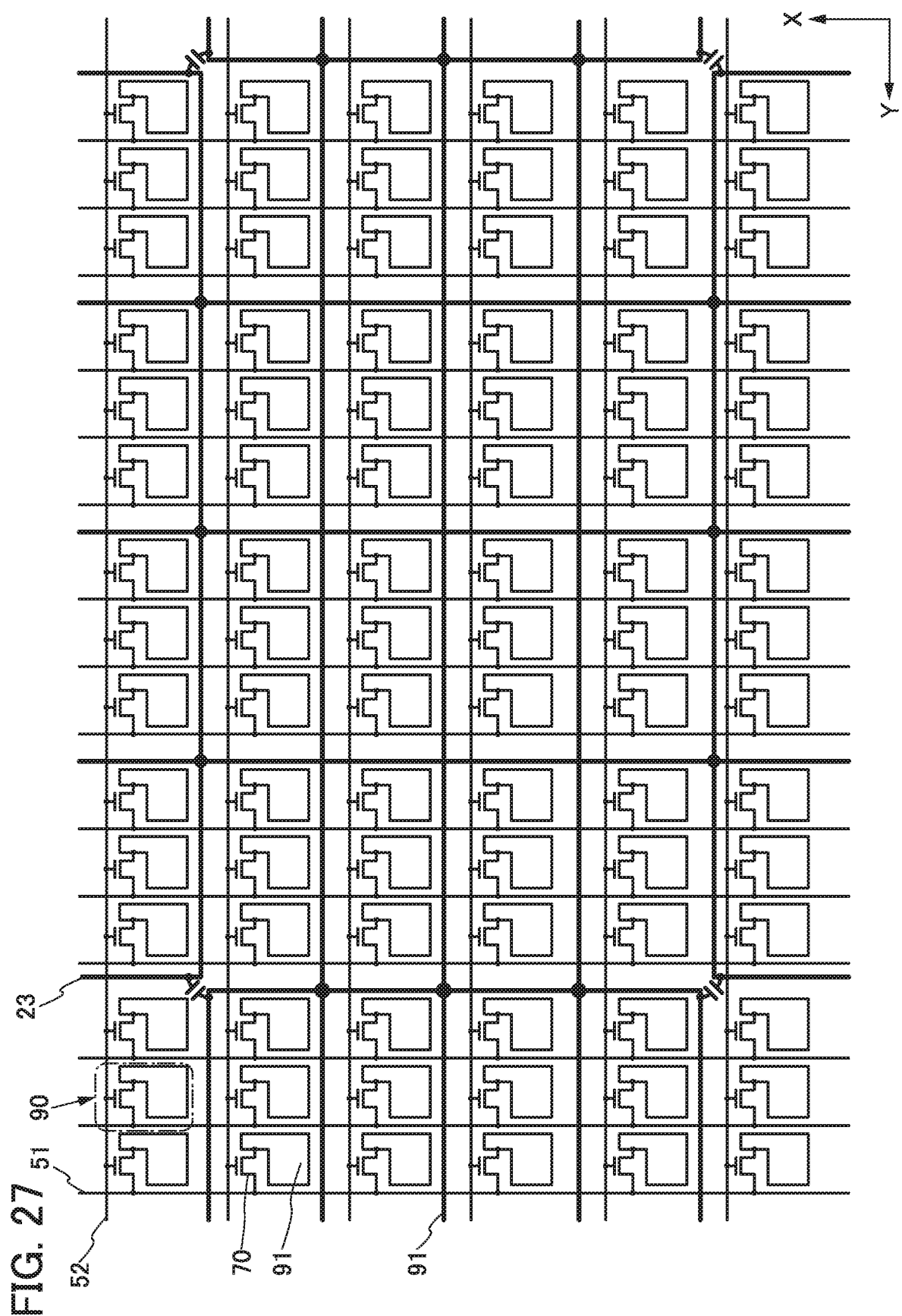
FIG. 27 illustrates a structure example of a circuit of an embodiment.

FIG. 27 illustrates part of a display portion in which two kinds of wirings included in a touch sensor are each have a mesh shape. The example in FIG. 27 corresponds to the examples in FIGS. 12A and 12B and the like. FIG. 27 illustrates an intersection of the wiring 23 and the wiring 24 each having a mesh shape.

Also in the example in FIG. 27, capacitive coupling is formed between the wiring 23 and the wiring 24. Sensing can be performed by utilizing a change in the capacitance of the capacitor.

The above is the description of the configuration example of circuit.

[Cross-Sectional Structure Example 2]

A specific cross-sectional structure example of the touch panel module 10 of one embodiment of the present invention will be described below. Description is particularly made on the case where an organic EL element is used as a display element.

[Cross-Sectional Structure Example 2-1]

Figure 28:
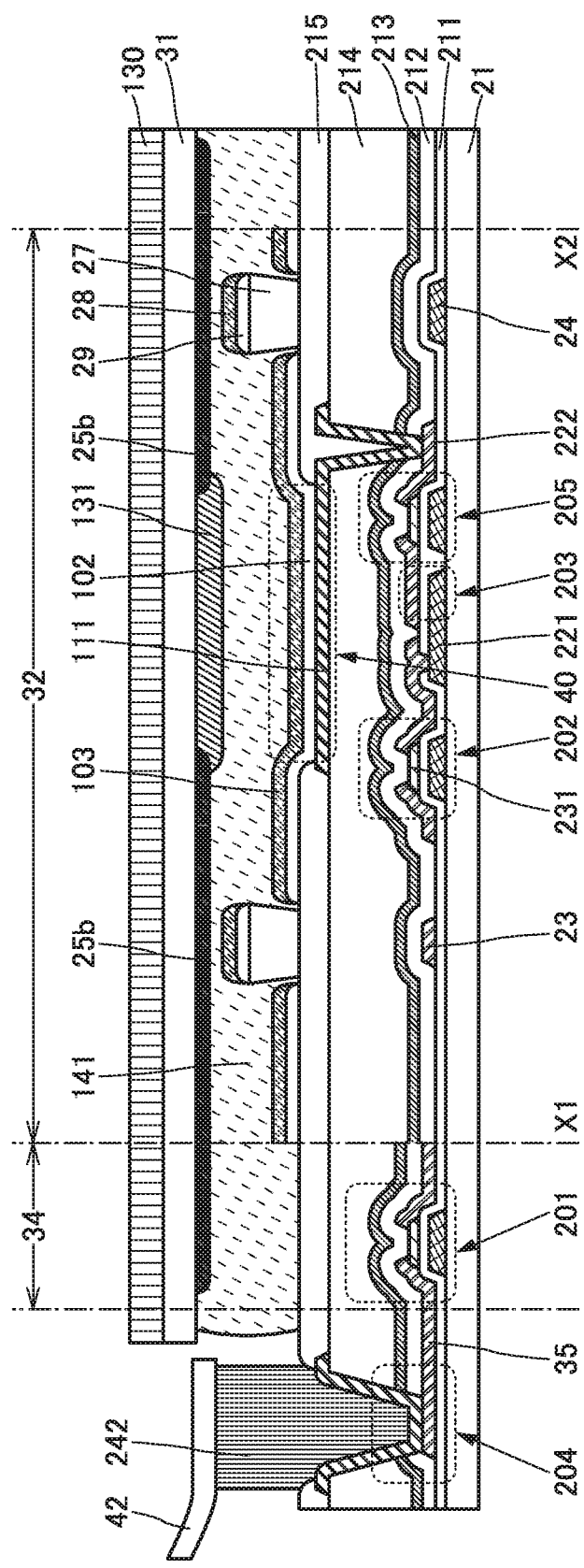
FIG. 28 illustrates a structure example of a touch panel module of an embodiment.

FIG. 28 is a schematic cross-sectional view of the touch panel module 10. FIG. 28 illustrates an example of cross sections of a region including the FPC 42, a region including the circuit 34, a region including the display portion 32, and the like in FIG. 1A. The display portion 32 in FIG. 28 illustrates an example of a cross section taken along line X1-X2 in FIG. 17.

The substrate 21 and the substrate 31 are attached to each other with an adhesive layer 141. Part of the adhesive layer 141 has a function of sealing the light-emitting element 40. The polarizing plate 130 is preferably provided on an outer surface of the substrate 21.

The wiring 23, the wiring 24, the light-emitting element 40, a transistor 201, a transistor 202, a transistor 205, a capacitor 203, a connection portion 204, the wiring 35, and the like are provided over the substrate 21. A coloring layer 131, the conductive layer 25b serving as a light-blocking layer, and the like are provided on the substrate 31. The light-emitting element 40 has a stacked structure of a pixel electrode 111, an EL layer 102, and a common electrode 103. The light-emitting element 40 is a top-emission light-emitting element in which light is emitted to the substrate 31 side. The wirings 23 and 24 form a touch sensor.

Insulating layers such as an insulating layer 211, an insulating layer 212, an insulating layer 213, an insulating layer 214, and an insulating layer 215 are provided over the substrate 21. A portion of the insulating layer 211 serves as a gate insulating layer of each transistor, and another portion thereof serves as a dielectric of the capacitor 203. The insulating layers 212, 213, and 214 are provided to cover each transistor, the capacitor 203, and the like. The insulating layer 214 serves as a planarization layer. Note that an example in which the three insulating layers, the insulating layers 212, 213, and 214, are provided to cover the transistors and the like is described here; however, one embodiment of the present invention is not limited to this example, and four or more insulating layers, a single insulating layer, or two insulating layers may be provided. The insulating layer 214 serving as a planarization layer is not necessarily provided. The insulating layer 215 is provided to cover an end portion of the pixel electrode 111, a contact portion which electrically connects the pixel electrode 111 and the transistor 205, and the like. The insulating layer 215 serves as a planarization layer.

The transistors 201, 202, and 205 each include a conductive layer 221 part of which serves as a gate, a conductive layer 222 part of which serves as a source or a drain electrode, and a semiconductor layer 231. Here, a plurality of layers obtained by processing the same conductive film are shown with the same hatching pattern.

In the example in FIG. 28, the capacitor 203 includes part of the conductive layer 221 serving as a gate electrode of the transistor 205, part of the insulating layer 211, and part of the conductive layer 222 functioning as a source or a drain electrode of the transistor 205. A lower electrode of the capacitor 203 and the gate electrode of the transistor 205 are formed with the conductive layer 221, which is continuous in a region not illustrated.

In the transistor 202, one of the pair of conductive layers 222 that is not electrically connected to the capacitor 203 serves as part of a signal line. The conductive layer 221 serving as a gate electrode of the transistor 202 also serves as part of a scan line.

FIG. 28 shows an example in which the wiring 23 is formed by processing the same conductive film as the conductive layer 222 and the wiring 24 is formed by processing the same conductive film as the conductive layer 221.

FIG. 28 illustrates a cross section of one subpixel as an example of the display portion 32. The subpixel includes, for example, the transistor 202, the capacitor 203, the transistor 205, the light-emitting element 40, and the coloring layer 131. For example, the coloring layers 131 are selectively formed so that a subpixel exhibiting a red color, a subpixel exhibiting a green color, and a subpixel exhibiting a blue color are arranged; thus, full-color display can be achieved. Here, the pixel circuit (subpixel circuit) includes the transistor 202, the capacitor 203, the transistor 205, the pixel electrode 111, a wiring, and the like.

Although the transistors 201 and 202 each include one gate electrode in FIG. 28, the semiconductor layer 231 where a channel is formed may be provided between two gate electrodes. Such a structure enables the control of the threshold voltages of transistors. Alternatively, the two gate electrodes may be connected to each other and supplied with the same signal to operate the transistors. Such transistors can have higher field-effect mobility and thus have higher on-state current than other transistors. Consequently, a circuit capable of high-speed operation can be obtained. Furthermore, the area occupied by a circuit portion can be reduced. The use of the transistor having high on-state current can reduce signal delay in wirings and can reduce display unevenness even in a large-sized or higher-resolution display panel or touch panel which has an increased number of wirings.

Note that the transistor included in the circuit 34 and the transistor included in the display portion 32 may have the same structure. A plurality of transistors included in the circuit 34 may have the same structure or different structures. A plurality of transistors included in the display portion 32 may have the same structure or different structures.

A material through which impurities such as water or hydrogen are not easily diffused is preferably used for at least one of the insulating layers 212 and 213 covering the transistors. That is, the insulating layer 212 or 213 can function as a barrier film. Such a structure can effectively suppress the diffusion of impurities into the transistors from the outside, and a highly reliable touch panel can be provided.

The pixel electrode 111 is provided over the insulating layer 214. The pixel electrode 111 is electrically connected to one of a source and a drain of the transistor 205 through an opening formed in the insulating layers 214, 213, 212, and the like. The other of the source and the drain of the transistor 205 is electrically connected to the capacitor 203.

In the light-emitting element 40, a material reflecting visible light is used for the pixel electrode 111 and a material transmitting visible light is used for the common electrode 103. With such a structure, a top-emission light-emitting element in which light is emitted to the substrate 31 side can be provided. Note that a material transmitting visible light may be used for both of the pixel electrode 111 and the common electrode 103, in which case a dual-emission light-emitting element emitting light to both of the substrate 31 side and the substrate 21 side is obtained.

A light-emitting element exhibiting a white color can be preferably used as the light-emitting element 40. Thus, the light-emitting elements 40 do not need to be separately fabricated in different subpixels; accordingly, a touch panel with an extremely high definition can be provided. In that case, when light from the light-emitting element 40 passes through the coloring layer 131, light out of a specific wavelength range is absorbed by the coloring layer 131. Consequently, red light is extracted, for example.

Alternatively, the light-emitting element 40 may have a microcavity structure by providing an optical adjustment layer between the pixel electrode 111 and the common electrode 103 and using a semi-transmissive or semi-reflective material for the common electrode 103. In that case, the optical adjustment layer preferably has a different thickness in each subpixel corresponding to a different color. A subpixel including the optical adjustment layer may be provided in combination with a subpixel including no optical adjustment layer.

The structure body 27 is provided over the insulating layer 215. Over the structure body 27, the EL layer 29 and the conductive layer 28 are stacked so as to be physically separated from the EL layer 102 and the common electrode 103, respectively.

The coloring layer 131 is provided on the surface of the substrate 31 that faces the substrate 21. The coloring layer 131 is provided to overlap with the light-emitting element 40.

The conductive layer 25b serving as a light-blocking layer is provided on the surface of the substrate 31 that faces the substrate 21. The conductive layer 25b is provided to partly overlap with the structure body 27.

The structure body 27 may have a function of a spacer that adjusts the distance between the substrate 31 and the substrate 21. In that case, the conductive layer 28 over the structure body 27 might be in contact with the conductive layer 25b on the substrate 31 side. However, the conductive layer 28 is preferably electrically connected to the conductive layer 25b to improve the sensitivity.

FIG. 28 shows an example in which a polarizing plate 130 is provided on the surface of the substrate 31 that is opposite to the surface facing the substrate 21. As the polarizing plate 130, a circularly polarizing plate is preferably used. As the circularly polarizing plate, for example, a stack including a linear polarizing plate and a quarter-wave retardation plate can be used. This results in suppression of external light reflection on a reflective member (e.g., the pixel electrode 111) provided in the display portion 32.

FIG. 28 shows an example in which the light-emitting element 40 is sealed with the adhesive layer 141. As a result, the efficiency of extraction of light emitted from the light-emitting element 40 can be increased as compared to the case where a space is made between the light-emitting element 40 and the substrate 31.

Note that the adhesive layer 141 may be arranged on the outer edge of the display portion 32, i.e., a so-called sealed hollow structure may be employed. In that case, a space formed by the substrates 21 and 31 and the adhesive layer 141 may be filled with air; preferably, filled with an inert gas such as a rare gas or a nitrogen gas. When the space in a steady state is under reduced pressure relative to the atmospheric pressure, the following phenomenon can be prevented: the space expands depending on the usage environment (e.g., pressure or temperature) and thus the substrate 31 or the substrate 21 expands. Meanwhile, when the space is under positive pressure relative to the atmospheric pressure, impurities such as moisture can be prevented from being diffused from the substrate 31, the substrate 21, the adhesive layer 141, or a gap therebetween into the space.

The connection portion 204 is provided in a region near an end portion of the substrate 21. The connection portion 204 is electrically connected to the FPC 42 through a connection layer 242. In the structure in FIG. 28, the connection portion 204 is formed by stacking part of the wiring 35 and a conductive layer obtained by processing the same conductive film as the pixel electrode 111.

Figure 29:
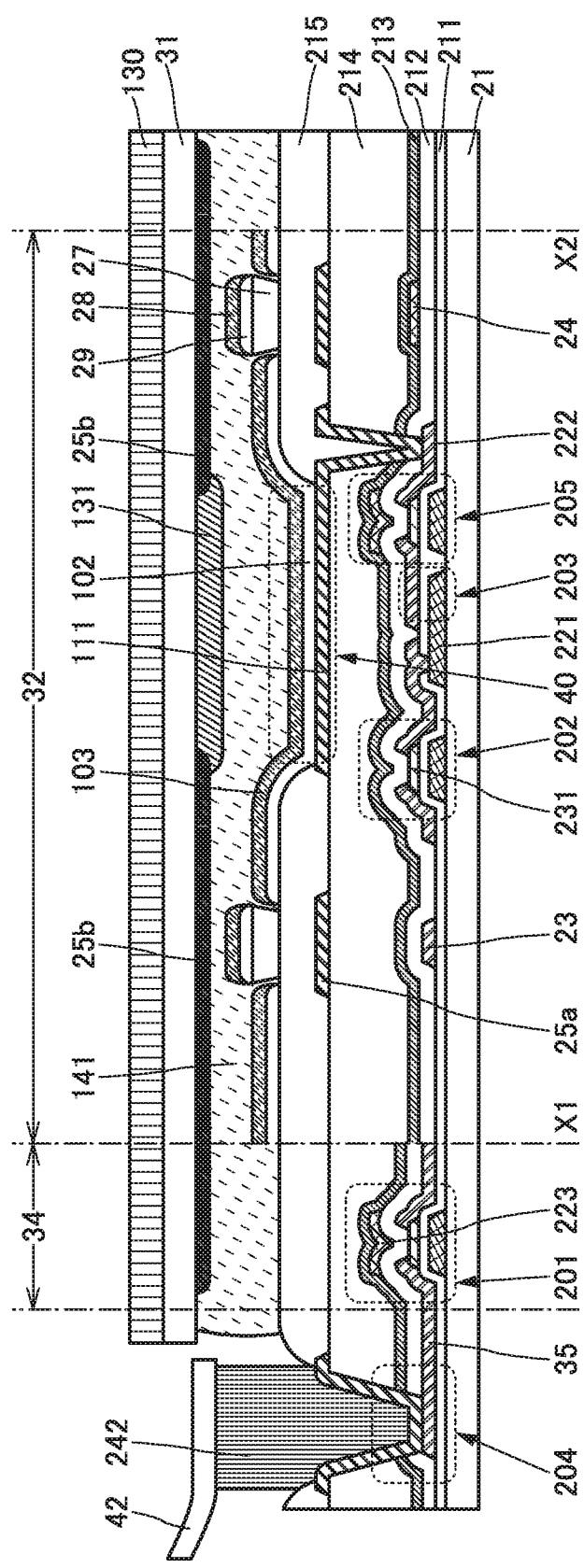
FIG. 29 illustrates a structure example of a touch panel module of an embodiment.

FIG. 29 illustrates a cross-sectional structure example that is partly different from FIG. 28.

In the above structure example, the thickness of the structure body 27 is larger than that of the insulating layer 214; however, the thickness of the structure body 27 only needs to be larger than the thickness of the common electrode 103 or the total thickness of the common electrode 103 and the EL layer 102. FIG. 29 shows an example in which the thickness of the structure body 27 is smaller than that of the insulating layer 215, the insulating layer 214, and the like.

FIG. 29 shows an example in which the transistors 205 and 201 each include two gate electrodes between which the semiconductor layer 231 is interposed. In FIG. 29, a conductive layer 223 is provided between the insulating layers 212 and 213 as the gate electrode over the semiconductor layer 231. The conductive layer 223 can be formed using the same conductive material as the wirings 23 and 24, the pixel electrode 111, and the like.

In the case where an oxide semiconductor is used for the semiconductor layer 231, the conductive layer 223 may include an oxide containing at least one metal element contained in the semiconductor layer 231. In that case, the resistance of the conductive layer 223 is preferably lower than that of a region of the semiconductor layer 231 that serves as a channel (e.g., a region between the source electrode and the drain electrode). To reduce the resistance of the conductive layer 223, plasma treatment, doping treatment, or treatment for supplying hydrogen from a film in contact with the conductive layer 223, or the like may be performed.

In the case where an oxide is used for the conductive layer 223, oxygen can be supplied to the insulating layer 212 when the conductive layer 223 is deposited under the optimized conditions. In addition, when the insulating layer 213 is formed using a material allowing less oxygen to pass therethrough than the material for the insulating layer 212, oxygen can be supplied to the semiconductor layer 231 by heat treatment performed in or after the deposition of the insulating layer 213. As a result, oxygen vacancies in the semiconductor layer 231 can be reduced to achieve a highly reliable transistor. Furthermore, when the insulating layer 213 is formed using a material that is likely to release hydrogen, hydrogen can be supplied to the conductive layer 223 by heat treatment or the like, reducing the resistance of the conductive layer 223.

FIG. 29 shows an example in which the wiring 24 is formed by processing the same conductive film as the conductive layer 223.

FIG. 29 also shows an example in which the conductive layer 25a is provided between the wiring 23 and the structure body 27. The conductive layer 25a is formed by processing the same conductive film as the pixel electrode 111.

[Cross-Sectional Structure Example 2-2]

Figure 30:
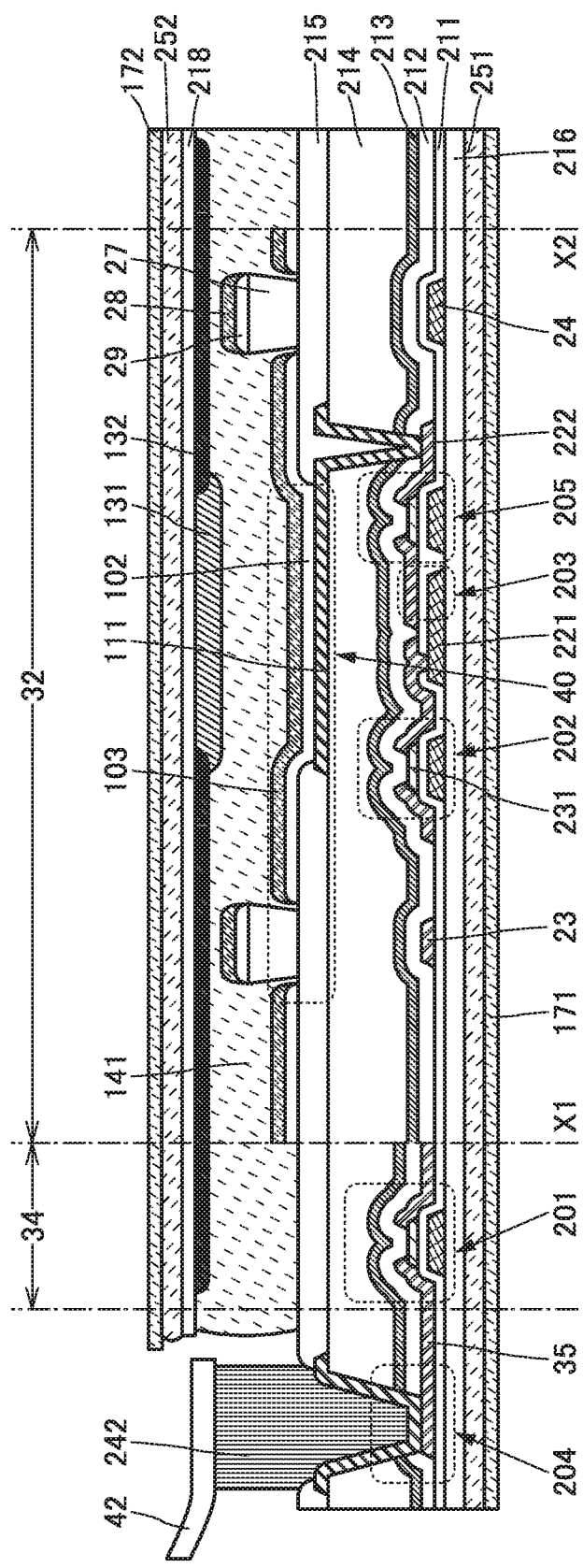
FIG. 30 illustrates a structure example of a touch panel module of an embodiment.

FIG. 30 illustrates a cross-sectional structure example of the touch panel module 10 in which a substrate 171 and a substrate 172 having flexibility are used as a pair of substrates. Part of a display surface of the touch panel module 10 in FIG. 30 is bendable.

In FIG. 30, an insulating layer 218, an adhesive layer 252, and the substrate 172 are provided instead of the substrate 31. Furthermore, the substrate 171, an adhesive layer 251, and an insulating layer 216 are provided instead of the substrate 21.

The conductive layer 221 and the insulating layer 211 are provided on one surface of the insulating layer 216. The substrate 171 is attached to the other surface of the insulating layer 216 with the adhesive layer 251. The coloring layer 131, a light-blocking layer 132, and the like are provided on one surface of the insulating layer 218. The substrate 172 is attached to the other surface of the insulating layer 218 with the adhesive layer 252.

The insulating layers 216 and 218 are preferably formed using a material through which impurities such as water are not easily diffused.

The touch panel module 10 in FIG. 30 has a structure in which each transistor and the light-emitting element 40 are sandwiched between the insulating layer 216 and the insulating layer 217. Thus, even in the case where the substrate 171, the substrate 172, the adhesive layer 251, the adhesive layer 141, or the like is formed using a material through which impurities such as water or hydrogen are easily diffused, the insulating layers 216 and 217 positioned further inward (closer to each transistor or the light-emitting element 40) than these components can suppress impurity diffusion, so that reliability can be increased.

[Example of Manufacturing Method]

Here, a method for manufacturing a flexible touch panel is described.

For convenience, a structure including a pixel and a circuit, a structure including an optical member such as a color filter, a structure including an electrode or a wiring of a touch sensor, or the like is referred to as an element layer. The element layer includes, for example, a display element, and may additionally include a wiring electrically connected to the display element or an element such as a transistor used in a pixel or a circuit.

Here, a substrate refers to a support body (e.g., the substrate 171 or the substrate 172 in FIG. 30) with an insulating surface where an element layer is formed.

As a method for forming an element layer over a flexible substrate provided with an insulating surface, there are a method in which an element layer is formed directly over a substrate, and a method in which an element layer is formed over a supporting base material that is different from the substrate and then the element layer is separated from the supporting base material and transferred to the substrate.

In the case where a material of the substrate can withstand heating temperature in a process for forming the element layer, it is preferable that the element layer be formed directly over the substrate, in which case a manufacturing process can be simplified. At this time, the element layer is preferably formed in a state where the substrate is fixed to a supporting base material, in which case transfer thereof in an apparatus and between apparatuses can be easy.

In the case of employing the method in which the element layer is formed over the supporting base material and then transferred to the substrate, first, a separation layer and an insulating layer are stacked over the supporting base material, and then the element layer is formed over the insulating layer. Next, the element layer is separated from the supporting base material and then transferred to the substrate. At this time, selected is a material with which separation at an interface between the supporting base material and the separation layer, at an interface between the separation layer and the insulating layer, or in the separation layer occurs.

For example, it is preferable that a stacked layer of a layer including a high-melting-point metal material, such as tungsten, and a layer including an oxide of the metal material be used as the separation layer, and a stacked layer of a plurality of layers, such as a silicon nitride layer and a silicon oxynitride layer be used as the insulating layer over the separation layer. The use of the high-melting-point metal material is preferable because the degree of freedom of the process for forming the element layer can be increased.

The separation may be performed by application of mechanical power, by etching of the separation layer, by dripping of a liquid into part of the separation interface to penetrate the entire separation interface, or the like. Alternatively, separation may be performed by heating the separation interface by utilizing a difference in thermal expansion coefficient.

The separation layer is not necessarily provided in the case where separation can occur at an interface between the supporting base material and the insulating layer. For example, glass and an organic resin such as polyimide can be used as the supporting base material and the insulating layer, respectively. In that case, a separation trigger may be formed by, for example, locally heating part of the organic resin with laser light or the like, or by physically cutting part of or making a hole through the organic resin with a sharp tool, so that separation may be performed at an interface between the glass and the insulating layer. Alternatively, a metal layer may be provided between the supporting base material and the insulating layer formed of an organic resin, and separation may be performed at the interface between the metal layer and the insulating layer formed of an organic resin by heating the metal layer by feeding current to the metal layer. A layer of a light-absorbing material (e.g., a metal, a semiconductor, or an insulator) may be provided between the supporting base material and the insulating layer formed of an organic resin and locally heated with laser light or the like to form a separation trigger. In these methods, the insulating layer formed of an organic resin can be used as a substrate.

In the structure illustrated in FIG. 30, for example, a first separation layer and the insulating layer 216 are formed in this order over a first supporting base material, and then components in a layer over the first separation layer and the insulating layer 216 are formed. Separately, a second separation layer and the insulating layer 218 are formed in this order over a second supporting base material, and then components in a layer over the second separation layer and the insulating layer 218 are formed. Next, the first supporting base material and the second supporting base material are attached to each other with the adhesive layer 141. After that, separation at an interface between the second separation layer and the insulating layer 218 is conducted so that the second supporting base material and the second separation layer are removed, and then the substrate 172 is attached to the insulating layer 218 with the adhesive layer 252. Further, separation at an interface between the first separation layer and the insulating layer 216 is conducted so that the first supporting base material and the first separation layer are removed, and then the substrate 171 is attached to the insulating layer 216 with the adhesive layer 251. Note that either side may be subjected to separation and attachment first.

The above is the description of the manufacturing method of a flexible touch panel.

[Components]

The above components will be described below.

[Substrate]

A material having a flat surface can be used as the substrate included in the touch panel. The substrate on the side from which light from the display element is extracted is formed using a material transmitting the light. For example, a material such as glass, quartz, ceramics, sapphire, or an organic resin can be used.

The weight and thickness of the touch panel can be decreased by using a thin substrate. A flexible touch panel can be obtained by using a substrate that is thin enough to have flexibility.

As the glass, for example, non-alkali glass, barium borosilicate glass, aluminoborosilicate glass, or the like can be used.

Since the substrate through which light emission is not extracted does not need to have a light-transmitting property, a metal substrate or the like can be used in addition to the above-mentioned substrates. A metal material, which has high thermal conductivity, is preferable because it can easily conduct heat to the whole substrate and accordingly can prevent a local temperature rise in the touch panel. To obtain flexibility and bendability, the thickness of a metal substrate is preferably greater than or equal to 10 μm and less than or equal to 200 μm, more preferably greater than or equal to 20 μm and less than or equal to 50 μm.

Although there is no particular limitation on a material of a metal substrate, it is favorable to use, for example, a metal such as aluminum, copper, and nickel, an aluminum alloy, or an alloy such as stainless steel.

It is preferable to use a substrate subjected to insulation treatment, e.g., a metal substrate whose surface is oxidized or provided with an insulating film. An insulating film may be formed by, for example, a coating method such as a spin-coating method and a dipping method, an electrodeposition method, an evaporation method, or a sputtering method. An oxide film may be formed over the substrate surface by a known method such as an anodic oxidation method, exposing to or heating in an oxygen atmosphere, or the like.

Examples of the material that has flexibility and transmits visible light include glass that is thin enough to have flexibility, polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE). It is particularly preferable to use a material with a low thermal expansion coefficient, for example, a material with a thermal expansion coefficient lower than or equal to $30\times10^{-6}$/K, such as a polyamide imide resin, a polyimide resin, or PET. A substrate in which a glass fiber is impregnated with an organic resin or a substrate whose thermal expansion coefficient is reduced by mixing an inorganic filler with an organic resin can also be used. A substrate using such a material is lightweight, and thus a touch panel using this substrate can also be lightweight.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, glass fiber using E glass, S glass, D glass, Q glass, or the like can be used. These fibers may be used in a state of a woven or nonwoven fabric, and a structure body in which this fibrous body is impregnated with a resin and the resin is cured may be used as the flexible substrate. The structure body including the fibrous body and the resin is preferably used as the flexible substrate, in which case the reliability against bending or breaking due to local pressure can be increased.

Alternatively, glass, metal, or the like that is thin enough to have flexibility can be used as the substrate. Alternatively, a composite material where glass and a resin material are attached to each other may be used.

A hard coat layer (e.g., a silicon nitride layer) by which a touch panel surface is protected from damage, a layer (e.g., an aramid resin layer) that can disperse pressure, or the like may be stacked over the flexible substrate. Furthermore, to suppress a decrease in the lifetime of the display element due to moisture and the like, an insulating film with low water permeability may be stacked over the flexible substrate. For example, an inorganic insulating material such as silicon nitride, silicon oxynitride, aluminum oxide, or aluminum nitride can be used.

The substrate may be formed by stacking a plurality of layers. When a glass layer is used, a barrier property against water and oxygen can be improved and thus a highly reliable touch panel can be provided.

[Transistor]

The transistor includes a conductive layer serving as the gate electrode, the semiconductor layer, a conductive layer serving as the source electrode, a conductive layer serving as the drain electrode, and an insulating layer serving as the gate insulating layer. In the above, a bottom-gate transistor is used.

Note that there is no particular limitation on the structure of the transistor included in the touch panel of one embodiment of the present invention. For example, a planar transistor, a staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be suppressed.

As a semiconductor material used for the transistor, an element of Group 14 (e.g., silicon or germanium), a compound semiconductor, or an oxide semiconductor can be used, for example. Typically, a semiconductor containing silicon, a semiconductor containing gallium arsenide, an oxide semiconductor containing indium, or the like can be used.

In particular, an oxide semiconductor having a wider band gap than silicon is preferably used. A semiconductor material having a wider band gap and a lower carrier density than silicon is preferably used because the off-state leakage current of the transistor can be reduced.

For the semiconductor layer, it is particularly preferable to use an oxide semiconductor including a plurality of crystal parts whose c-axes are aligned substantially perpendicular to a surface on which the semiconductor layer is formed or the top surface of the semiconductor layer and in which a grain boundary is not observed between adjacent crystal parts.

There is no grain boundary in such an oxide semiconductor; therefore, generation of a crack in an oxide semiconductor film which is caused by stress when a display panel is bent is prevented. Therefore, such an oxide semiconductor can be preferably used for a flexible touch panel which is used in a bent state, or the like.

Moreover, the use of such an oxide semiconductor with crystallinity for the semiconductor layer makes it possible to provide a highly reliable transistor with a small change in electrical characteristics.

A transistor with an oxide semiconductor whose band gap is larger than the band gap of silicon has a low off-state current and therefore can hold charges stored in a capacitor that is series-connected to the transistor for a long time. When such a transistor is used for a pixel, operation of a driver circuit can be stopped while a gray scale of each pixel is maintained. As a result, a display device with extremely low power consumption can be obtained.

The semiconductor layer preferably includes, for example, a film represented by an In-M-Zn-based oxide that contains at least indium, zinc, and M (a metal such as aluminum, titanium, gallium, germanium, yttrium, zirconium, lanthanum, cerium, tin, neodymium, or hafnium). In order to reduce variations in electrical characteristics of the transistor including the oxide semiconductor, the oxide semiconductor preferably contains a stabilizer in addition to indium, zinc, and M.

Examples of the stabilizer, including metals that can be used as M, are gallium, tin, hafnium, aluminum, and zirconium. As another stabilizer, lanthanoid such as lanthanum, cerium, praseodymium, neodymium, samarium, europium, gadolinium, terbium, dysprosium, holmium, erbium, thulium, ytterbium, or lutetium can be given.

As an oxide semiconductor included in the semiconductor layer, any of the following can be used, for example: an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that here, an "In—Ga—Zn-based oxide" means an oxide containing In, Ga, and Zn as its main components, and there is no limitation on the ratio of In: Ga:Zn. The In—Ga—Zn-based oxide may contain another metal element in addition to In, Ga, and Zn.

The semiconductor layer and the conductive layer may include the same metal elements contained in the above oxides. The use of the same metal elements for the semiconductor layer and the conductive layer can reduce the manufacturing cost. For example, when metal oxide targets with the same metal composition are used, the manufacturing cost can be reduced, and the same etching gas or the same etchant can be used in processing the semiconductor layer and the conductive layer. Note that even when the semiconductor layer and the conductive layer include the same metal elements, they have different compositions in some cases. For example, a metal element in a film is released during the manufacturing process of the transistor and the capacitor, which might result in different metal compositions.

The energy gap of the semiconductor layer is 2 eV or more, preferably 2.5 eV or more, and more preferably 3 eV or more. With the use of an oxide semiconductor having such a wide energy gap, the off-state current of the transistor can be reduced.

In the case where the semiconductor layer contains an In-M-Zn oxide, it is preferable that the atomic ratio of metal elements of a sputtering target used for forming a film of the In-M-Zn oxide satisfy In≥M and Zn≥M As the atomic ratio of metal elements of such a sputtering target, In:M:Zn=1:1:1, In:M:Zn=1:1:1.2, In:M:Zn=3:1:2, In:M:Zn=4:2:4.1 and the like are preferable. Note that the atomic ratio of metal elements in the formed semiconductor layer varies from the above atomic ratio of metal elements of the sputtering target within a range of ±40% as an error.

An oxide semiconductor film with low carrier density is used as the semiconductor layer. For example, the semiconductor layer is an oxide semiconductor film whose carrier density is lower than or equal to $1 \times 10^{17}/cm^3$, preferably lower than or equal to $1 \times 10^{15}/cm^3$, more preferably lower than or equal to $1 \times 10^{13}/cm^3$, still more preferably lower than or equal to $1 \times 10^{11}/cm^3$, even more preferably lower than $1 \times 10^{10}/cm^3$, and higher than or equal to $1 \times 10^{-9}/cm^3$. Such an oxide semiconductor is referred to as a highly purified intrinsic or substantially highly purified intrinsic oxide semiconductor. The oxide semiconductor has a low impurity concentration and a low density of defect states and can thus be referred to as an oxide semiconductor having stable characteristics.

Note that, without limitation to those described above, a material with an appropriate composition may be used depending on required semiconductor characteristics and electrical characteristics (e.g., field-effect mobility and threshold voltage) of a transistor. To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon that is one of elements belonging to Group 14 is contained in the semiconductor layer, oxygen vacancies are increased in the semiconductor layer, and the semiconductor layer becomes n-type. Thus, the concentration of silicon or carbon (measured by secondary ion mass spectrometry) in the semiconductor layer is lower than or equal to $2 \times 10^{18}$ atoms/$cm^3$, preferably lower than or equal to $2 \times 10^{17}$ atoms/$cm^3$.

Alkali metal and alkaline earth metal might generate carriers when bonded to an oxide semiconductor, in which case the off-state current of the transistor might be increased. Therefore, the concentration of alkali metal or alkaline earth metal of the semiconductor layer, which is measured by secondary ion mass spectrometry, is lower than or equal to $1 \times 10^{18}$ atoms/$cm^3$, preferably lower than or equal to $2 \times 10^{16}$ atoms/$cm^3$.

When nitrogen is contained in the semiconductor layer, electrons serving as carriers are generated and the carrier density increases, so that the semiconductor layer easily becomes n-type. Thus, a transistor including an oxide semiconductor which contains nitrogen is likely to be normally on. Hence, the concentration of nitrogen which is measured by secondary ion mass spectrometry is preferably set to lower than or equal to $5 \times 10^{18}$ atoms/cm$^3$.

The semiconductor layer may have a non-single-crystal structure, for example. The non-single-crystal structure includes CAAC-OS (c-axis aligned crystalline oxide semiconductor, or c-axis aligned a-b-plane-anchored crystalline oxide semiconductor), a polycrystalline structure, a microcrystalline structure, or an amorphous structure, for example. Among the non-single-crystal structures, an amorphous structure has the highest density of defect states, whereas CAAC-OS has the lowest density of defect states.

An oxide semiconductor film having an amorphous structure has disordered atomic arrangement and no crystalline component, for example. Alternatively, an oxide film having an amorphous structure has, for example, an absolutely amorphous structure and no crystal part.

Note that the semiconductor layer may be a mixed film including two or more of the following: a region having an amorphous structure, a region having a microcrystalline structure, a region having a polycrystalline structure, a region of CAAC-OS, and a region having a single-crystal structure. The mixed film includes, for example, two or more of a region having an amorphous structure, a region having a microcrystalline structure, a region having a polycrystalline structure, a CAAC-OS region, and a region having a single-crystal structure in some cases. Furthermore, the mixed film has a stacked-layer structure of two or more of a region having an amorphous structure, a region having a microcrystalline structure, a region having a polycrystalline structure, a CAAC-OS region, and a region having a single-crystal structure in some cases.

Alternatively, silicon is preferably used as a semiconductor in which a channel of a transistor is formed. Although amorphous silicon may be used as silicon, silicon having crystallinity is particularly preferable. For example, microcrystalline silicon, polycrystalline silicon, single-crystal silicon, or the like is preferably used. In particular, polycrystalline silicon can be formed at a lower temperature than single-crystal silicon and has higher field effect mobility and higher reliability than amorphous silicon. When such a polycrystalline semiconductor is used for a pixel, the aperture ratio of the pixel can be improved. Even in the case where pixels are provided at extremely high resolution, a gate driver circuit and a source driver circuit can be formed over a substrate over which the pixels are formed, and the number of components of an electronic device can be reduced.

The bottom-gate transistor described in this embodiment is preferable because the number of manufacturing steps can be reduced. When amorphous silicon, which can be formed at a lower temperature than polycrystalline silicon, is used for the semiconductor layer, materials with low heat resistance can be used for a wiring, an electrode, or a substrate below the semiconductor layer, resulting in wider choice of materials. For example, an extremely large glass substrate can be favorably used. Meanwhile, the top-gate transistor is preferable because an impurity region is easily formed in a self-aligned manner and variation in characteristics can be reduced. In that case, the use of polycrystalline silicon, single-crystal silicon, or the like is particularly preferable.

[Conductive Layer]

As materials for a gate, a source, and a drain of a transistor, and a wiring or an electrode included in a touch panel, any of metals such as aluminum, titanium, chromium, nickel, copper, yttrium, zirconium, molybdenum, silver, tantalum, and tungsten, or an alloy containing any of these metals as its main component can be used. A single-layer structure or multi-layer structure including a film containing any of these materials can be used. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because controllability of a shape by etching is increased.

As a light-transmitting conductive material, a conductive oxide such as indium oxide, indium tin oxide, indium zinc oxide, zinc oxide, or zinc oxide to which gallium is added, or graphene can be used. Alternatively, a metal material such as gold, silver, platinum, magnesium, nickel, tungsten, chromium, molybdenum, iron, cobalt, copper, palladium, or titanium, or an alloy material containing any of these metal materials can be used. Alternatively, a nitride of the metal material (e.g., titanium nitride) or the like may be used. In the case of using the metal material or the alloy material (or the nitride thereof), the thickness is set small enough to be able to transmit light. Alternatively, a stack of any of the above materials can be used as the conductive layer. For example, a stacked film of indium tin oxide and an alloy of silver and magnesium is preferably used because the conductivity can be increased. They can also be used for conductive layers such as a variety of wirings and electrodes included in a touch panel, and an electrode (e.g., a pixel electrode or a common electrode) included in a display element.

[Insulating Layer]

Examples of an insulating material that can be used for the insulating layers, the overcoat, the spacer, and the like include a resin such as acrylic or epoxy resin, a resin having a siloxane bond, and an inorganic insulating material such as silicon oxide, silicon oxynitride, silicon nitride oxide, silicon nitride, or aluminum oxide.

The light-emitting element is preferably provided between a pair of insulating films with low water permeability, in which case impurities such as water can be prevented from entering the light-emitting element. Thus, a decrease in device reliability can be prevented.

As an insulating film with low water permeability, a film containing nitrogen and silicon (e.g., a silicon nitride film or a silicon nitride oxide film), a film containing nitrogen and aluminum (e.g., an aluminum nitride film), or the like can be used. Alternatively, a silicon oxide film, a silicon oxynitride film, an aluminum oxide film, or the like can be used.

For example, the water vapor transmittance of the insulating film with low water permeability is lower than or equal to 1×10⁻⁵ [g/m²·day], preferably lower than or equal to 1×10⁻⁶ [g/m²·day], further preferably lower than or equal to 1×10⁻⁷ [g/m²·day], and still further preferably lower than or equal to 1×10⁻⁸ [g/m²·day].

[Light-Emitting Element]

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The light-emitting element may be a top emission, bottom emission, or dual emission light-emitting element. A conductive film that transmits visible light is used as the electrode through which light is extracted. A conductive film that reflects visible light is preferably used as the electrode through which light is not extracted.

The EL layer includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

Either a low molecular compound or a high molecular compound can be used for the EL layer, and an inorganic compound may also be used. The layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between the anode and the cathode, holes are injected to the EL layer from the anode side and electrons are injected to the EL layer from the cathode side. The injected electrons and holes are recombined in the EL layer, so that a light-emitting substance contained in the EL layer emits light.

In the case where a light-emitting element emitting white light is used as the light-emitting element, the EL layer preferably contains two or more kinds of light-emitting substances. For example, light-emitting substances are selected so that two or more light-emitting substances emit complementary colors to obtain white light emission. Specifically, it is preferable to contain two or more light-emitting substances selected from light-emitting substances emitting light of red (R), green (G), blue (B), yellow (Y), orange (O), and the like and light-emitting substances emitting light containing two or more of spectral components of R, G, and B. The light-emitting element preferably emits light with a spectrum having two or more peaks in the wavelength range of a visible light region (e.g., 350 nm to 750 nm). An emission spectrum of a material emitting light having a peak in the wavelength range of a yellow light preferably includes spectral components also in the wavelength range of a green light and a red light.

A light-emitting layer containing a light-emitting material emitting light of one color and a light-emitting layer containing a light-emitting material emitting light of another color are preferably stacked in the EL layer. For example, the plurality of light-emitting layers in the EL layer may be stacked in contact with each other or may be stacked with a region not including any light-emitting material therebetween. For example, between a fluorescent layer and a phosphorescent layer, a region containing the same material as one in the fluorescent layer or phosphorescent layer (for example, a host material or an assist material) and no light-emitting element may be provided. This facilitates the manufacture of the light-emitting element and reduces the drive voltage.

The light-emitting element may be a single element including one EL layer or a tandem element in which a plurality of EL layers are stacked with a charge generation layer therebetween.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) can be used when formed thin so as to have a light-transmitting property. Alternatively, a stack of any of the above materials can be used as the conductive layer. For example, a stacked film of indium tin oxide and an alloy of silver and magnesium is preferably used, in which case conductivity can be increased. Further alternatively, graphene or the like may be used.

For the conductive film that reflects visible light, for example, a metal material, such as aluminum, gold, platinum, silver, nickel, tungsten, chromium, molybdenum, iron, cobalt, copper, or palladium or an alloy including any of these metal materials can be used. Lanthanum, neodymium, germanium, or the like may be added to the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy of silver and copper is preferable because of its high heat resistance. Furthermore, when a metal film or a metal oxide film is stacked in contact with an aluminum film or an aluminum alloy film, oxidation can be suppressed. Examples of a material for the metal film or the metal oxide film include titanium and titanium oxide. Alternatively, the conductive film having a property of transmitting visible light and a film containing any of the above metal materials may be stacked. For example, a stack of silver and indium tin oxide, a stack of an alloy of silver and magnesium and indium tin oxide, or the like can be used.

The electrodes may be formed separately by an evaporation method or a sputtering method. Alternatively, a discharging method such as an inkjet method, a printing method such as a screen printing method, or a plating method may be used.

Note that the aforementioned light-emitting layer and layers containing a substance with a high hole-injection property, a substance with a high hole-transport property, a substance with a high electron-transport property, a substance with a high electron-injection property, and a substance with a bipolar property may include an inorganic compound such as a quantum dot or a high molecular compound (e.g., an oligomer, a dendrimer, and a polymer). For example, used for the light-emitting layer, the quantum dot can serve as a light-emitting material.

The quantum dot may be a colloidal quantum dot, an alloyed quantum dot, a core-shell quantum dot, a core quantum dot, or the like. The quantum dot containing elements belonging to Groups 12 and 16, elements belonging to Groups 13 and 15, or elements belonging to Groups 14 and 16, may be used. Alternatively, the quantum dot containing an element such as cadmium, selenium, zinc, sulfur, phosphorus, indium, tellurium, lead, gallium, arsenic, or aluminum may be used.

[Adhesive Layer]

As the adhesive layer, a variety of curable adhesives such as a reactive curable adhesive, a thermosetting adhesive, an anaerobic adhesive, and a photo curable adhesive such as an ultraviolet curable adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, and an ethylene vinyl acetate (EVA) resin. In particular, a material with low moisture permeability, such as an epoxy resin, is preferred. Alternatively, a two-component-mixture-type resin may be used. Further alternatively, an adhesive sheet or the like may be used.

Furthermore, the resin may include a drying agent. For example, a substance that adsorbs water by chemical adsorption, such as oxide of an alkaline earth metal (e.g., calcium oxide or barium oxide), can be used. Alternatively, a substance that adsorbs water by physical adsorption, such as zeolite or silica gel, may be used. The drying agent is preferably included because it can prevent impurities such as water from entering the element, thereby improving the reliability of the display panel.

In addition, it is preferable to mix a filler with a high refractive index or light-scattering member into the resin, in which case light extraction efficiency can be enhanced. For example, titanium oxide, barium oxide, zeolite, zirconium, or the like can be used.

[Connection Layer]

As the connection layers, an anisotropic conductive film (ACF), an anisotropic conductive paste (ACP), or the like can be used.

[Coloring Layer]

Examples of a material that can be used for the coloring layers include a metal material, a resin material, and a resin material containing a pigment or dye.

[Light-Blocking Layer]

Examples of a material that can be used for the light-blocking layer include carbon black, a metal oxide, and a composite oxide containing a solid solution of a plurality of metal oxides. Stacked films containing the material of the coloring layer can also be used for the light-blocking layer. For example, a stacked-layer structure of a film containing a material of a coloring layer which transmits light of a certain color and a film containing a material of a coloring layer which transmits light of another color can be employed. It is preferable that the coloring layer and the light-blocking layer be formed using the same material because the same manufacturing apparatus can be used and the process can be simplified.

The above is the description of each of the components.

This embodiment can be implemented in appropriate combination with any of the other embodiments described in this specification.

Embodiment 2

Described in this embodiment is an example of a driving method of an input device (touch sensor) which can be applied to the touch panel module of one embodiment of the present invention.

Figure 31A:
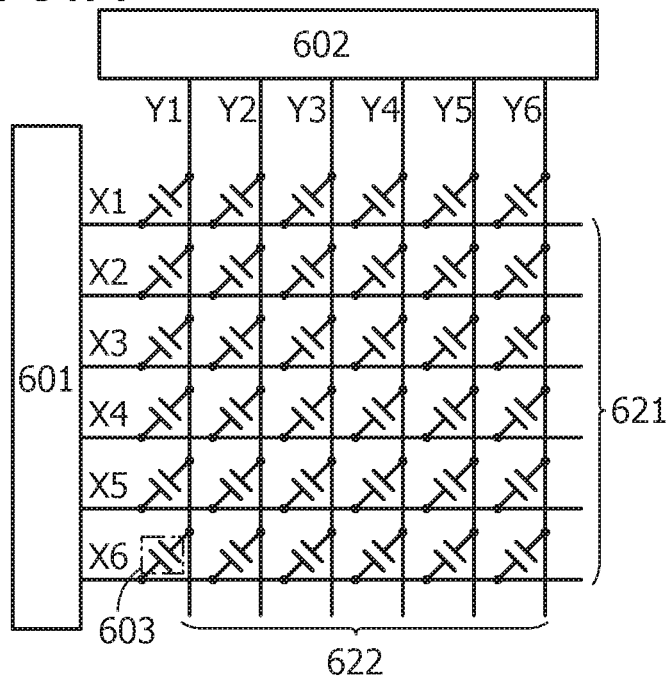
FIGS. 31A and 31B are a block diagram and a timing chart of a touch sensor of an embodiment.

FIG. 31A is a block diagram illustrating the structure of a mutual capacitive touch sensor. FIG. 31A illustrates a pulse voltage output circuit 601 and a current sensing circuit 602. Note that in FIG. 31A, six wirings X1 to X6 represent electrodes 621 to which a pulse voltage is applied, and six wirings Y1 to Y6 represent electrodes 622 that sense changes in current. The number of such electrodes is not limited to those illustrated in this example. FIG. 31A also illustrates a capacitor 603 that is formed with the electrodes 621 and 622 overlapping with each other or being provided close to each other. Note that functional replacement between the electrodes 621 and 622 is possible.

For example, the wiring 23 described in Embodiment 1 corresponds to one of the electrodes 621 and 622, and the wiring 24 described in Embodiment 1 corresponds to the other of the electrodes 621 and 622.

The pulse voltage output circuit 601 is, for example, a circuit for sequentially inputting a pulse voltage to the wirings X1 to X6. The current sensing circuit 602 is, for example, a circuit for sensing current flowing through each of the wirings Y1-Y6.

By application of a pulse voltage to one of the wirings X1 to X6, an electric field is generated between the electrodes 621 and 622 of the capacitor 603, and current flows through the electrode 622. Part of the electric field generated between the electrodes is blocked when an object such a finger or a stylus contacts or approaches the device, so that the electric field intensity between the electrodes is changed. Consequently, the amount of current flowing through the electrode 622 is changed.

For example, in the case where there is no approach or no contact of an object, the amount of current flowing in each of the wirings Y1-Y6 depends on the amount of capacitance of the capacitor 603. In the case where part of an electric field is blocked by the approach or contact of an object, a decrease in the amount of current flowing in the wirings Y1-Y6 is sensed. The approach or contact of an object can be sensed by utilizing this change.

Sensing by the current sensing circuit 602 may be performed using an integral value (time integral value) of current flowing in a wiring. In that case, sensing may be performed with an integrator circuit, for example. Alternatively, the peak current value may be sensed. In that case, for example, current may be converted into voltage, and the peak voltage value may be sensed.

Figure 31B:
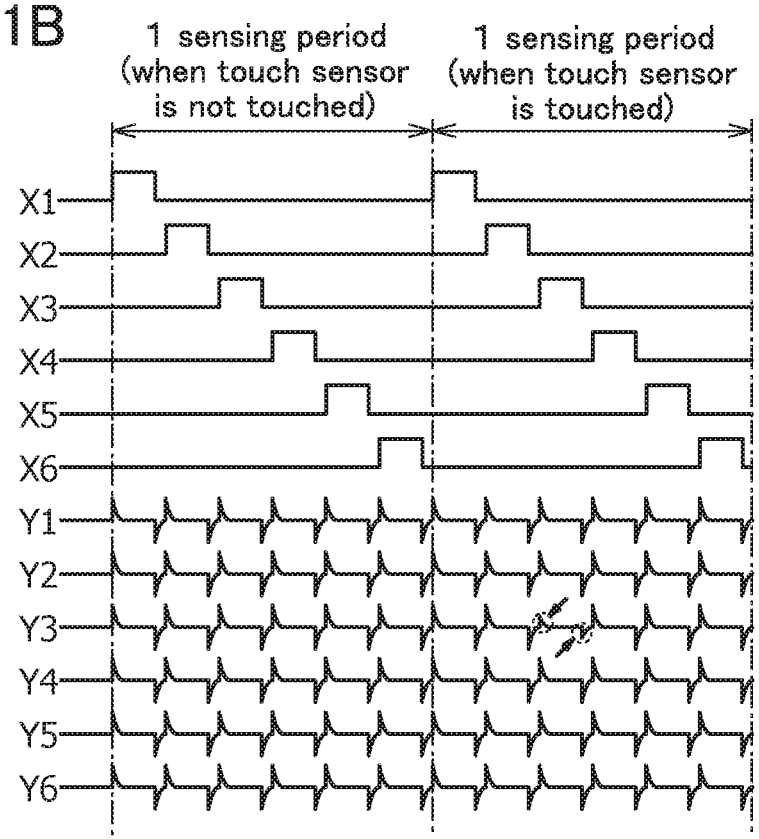

FIG. 31B is an example of a timing chart illustrating input and output waveforms in the mutual capacitive touch sensor in FIG. 31A. In FIG. 31B, sensing in each row and each column is performed in one sensing period. FIG. 31B shows a period when the contact or approach of an object is not sensed (when the touch sensor is not touched) and a period when the contact or approach of an object is sensed (when the touch sensor is touched). Here, the wirings Y1-Y6 each show a waveform of a voltage corresponding to the amount of current to be sensed.

As shown in FIG. 31B, the wirings X1-X6 are sequentially supplied with a pulse voltage. Accordingly, current flows in the wirings Y1-Y6. When the touch sensor is not touched, substantially the same current flows in the wirings Y1-Y6 in accordance with a change in voltages of the wirings X1-X6; thus, the wirings Y1-Y6 have similar output waveforms. Meanwhile, when the touch sensor is touched, current flowing in a wiring in a position which an object contacts or approaches among the wirings Y1-Y6 is reduced; thus, the output waveforms are changed as shown in FIG. 31B.

FIG. 31B shows an example in which an object contacts or approaches the intersection of the wiring X3 and the wiring Y3 or the vicinity thereof.

A change in current due to block of an electric field generated between a pair of electrodes is sensed in this manner in a mutual capacitive touch sensor, so that positional information of an object can be obtained. When the detection sensitivity is high, the coordinates of the object can be determined even when the object is far from a detection surface (e.g., a surface of the touch panel).

By driving a touch panel by a method in which a display period of a display portion and a sensing period of a touch sensor do not overlap with each other, the detection sensitivity of the touch sensor can be increased. For example, a display period and a sensing period may be separately provided in one display frame period. In that case, two or more sensing periods are preferably provided in one frame period. When the frequency of sensing is increased, the detection sensitivity can be increased.

It is preferable that, as an example, the pulse voltage output circuit 601 and the current sensing circuit 602 be formed in an IC. For example, the IC is preferably mounted on a touch panel or a substrate in a housing of an electronic device. In the case where the touch panel has flexibility, parasitic capacitance might be increased in a bent portion of the touch panel, and the influence of noise might be increased. In view of this, it is preferable to use an IC to which a driving method less influenced by noise is applied. For example, it is preferable to use an IC to which a driving method capable of increasing a signal-noise ratio (S/N ratio) is applied.

At least part of this embodiment can be implemented in appropriate combination with any of the other embodiments described in this specification.

Embodiment 3

In this embodiment, an example of a transistor which can be used as the transistor 70, the transistor 70$a$, the transistor 70$b$, the transistor 201, the transistor 202, and the like described in the above embodiments will be described with reference to drawings.

The touch panel module 10 of one embodiment of the present invention can be fabricated by using a transistor with any of various modes, such as a bottom-gate transistor or a top-gate transistor. Therefore, a material for a semiconductor layer or the structure of a transistor can be easily changed depending on the existing production line.

[Bottom-Gate Transistor]

FIG. 32A1 is a cross-sectional view of a transistor 810 that is a channel-protective transistor, which is a type of bottom-gate transistor. In FIG. 32A1, the transistor 810 is formed over a substrate 771. The transistor 810 includes an electrode 746 over the substrate 771 with an insulating layer 772 provided therebetween. The transistor 810 includes a semiconductor layer 742 over the electrode 746 with an insulating layer 726 provided therebetween. The electrode 746 can serve as a gate electrode. The insulating layer 726 can serve as a gate insulating layer.

The transistor 810 includes an insulating layer 741 over a channel formation region in the semiconductor layer 742. The transistor 810 includes an electrode 744$a$ and an electrode 744$b$ which are partly in contact with the semiconductor layer 742 and over the insulating layer 726. The electrode 744$a$ can serve as one of a source electrode and a drain electrode. The electrode 744$b$ can serve as the other of the source electrode and the drain electrode. Part of the electrode 744$a$ and part of the electrode 744$b$ are formed over the insulating layer 741.

The insulating layer 741 can serve a channel protective layer. With the insulating layer 741 provided over the channel formation region, the semiconductor layer 742 can be prevented from being exposed at the time of forming the electrodes 744$a$ and 744$b$. Thus, the channel formation region in the semiconductor layer 742 can be prevented from being etched at the time of forming the electrodes 744$a$ and 744$b$. In accordance with one embodiment of the present invention, a transistor with favorable electrical characteristics can be provided.

The transistor 810 includes an insulating layer 728 over the electrode 744$a$, the electrode 744$b$, and the insulating layer 741 and further includes an insulating layer 729 over the insulating layer 728.

The insulating layer 772 can be formed using a material and a method similar to those of insulating layers 722 and 705. Note that the insulating layer 772 may be formed of a stack of insulating layers. For example, the semiconductor layer 742 can be formed using a material and a method similar to those of the semiconductor layer 708. Note that the semiconductor layer 742 may be formed of a stack of semiconductor layers. For example, the electrode 746 can be formed using a material and a method similar to those of the electrode 706. Note that the electrode 746 may be formed of a stack of conductive layers. The insulating layer 726 can be formed using a material and a method similar to those of the insulating layer 707. Note that the insulating layer 726 may be formed of a stack of insulating layers. For example, the electrodes 744$a$ and 744$b$ can be formed using a material and a method similar to those of the electrode 714 or 715. Note that the electrodes 744$a$ and 744$b$ may be formed of a stack of conductive layers. For example, the insulating layer 741 can be formed using a material and a method similar to those of the insulating layer 726. Note that the insulating layer 741 may be formed of a stack of insulating layers. For example, the insulating layer 728 can be formed using a material and a method similar to those of the insulating layer 710. Note that the insulating layer 728 may be formed of a stack of insulating layers. For example, the insulating layer 729 can be formed using a material and a method similar to those of the insulating layer 711. Note that the insulating layer 729 may be formed of a stack of insulating layers.

The electrode, the semiconductor layer, the insulating layer, and the like used in the transistor disclosed in this embodiment can be formed using a material and a method disclosed in any of the other embodiments.

In the case where an oxide semiconductor is used for the semiconductor layer 742, a material capable of removing oxygen from part of the semiconductor layer 742 to generate oxygen vacancies is preferably used for regions of the electrodes 744$a$ and 744$b$ that are in contact with at least the semiconductor layer 742. The carrier concentration in the regions of the semiconductor layer 742 where oxygen vacancies are generated is increased, so that the regions become n-type regions (n$^+$ layers). Accordingly, the regions can serve as a source region and a drain region. When an oxide semiconductor is used for the semiconductor layer 742, examples of the material capable of removing oxygen from the semiconductor layer 742 to generate oxygen vacancies include tungsten and titanium.

Formation of the source region and the drain region in the semiconductor layer 742 makes it possible to reduce the contact resistance between the semiconductor layer 742 and each of the electrodes 744$a$ and 744$b$. Accordingly, the electric characteristics of the transistor, such as the field-effect mobility and the threshold voltage, can be favorable.

In the case where a semiconductor such as silicon is used for the semiconductor layer 742, a layer that serves as an n-type semiconductor or a p-type semiconductor is preferably provided between the semiconductor layer 742 and the electrode 744a and between the semiconductor layer 742 and the electrode 744b. The layer that serves as an n-type semiconductor or a p-type semiconductor can serve as the source region or the drain region in the transistor.

The insulating layer 729 is preferably formed using a material that can prevent or reduce diffusion of impurities into the transistor from the outside. The insulating layer 729 is not necessarily formed.

When an oxide semiconductor is used for the semiconductor layer 742, heat treatment may be performed before and/or after the insulating layer 729 is formed. The heat treatment can fill oxygen vacancies in the semiconductor layer 742 by diffusing oxygen contained in the insulating layer 729 or other insulating layers into the semiconductor layer 742. Alternatively, the insulating layer 729 may be formed while the heat treatment is performed, so that oxygen vacancies in the semiconductor layer 742 can be filled.

Note that a CVD method can be generally classified into a plasma enhanced CVD (PECVD) method using plasma, a thermal CVD (TCVD) method using heat, and the like. A CVD method can be further classified into a metal CVD (MCVD) method, a metal organic CVD (MOCVD) method, and the like according to a source gas to be used.

Furthermore, an evaporation method can be generally classified into a resistance heating evaporation method, an electron beam evaporation method, a molecular beam epitaxy (MBE) method, a pulsed laser deposition (PLD) method, an ion beam assisted deposition (IBAD) method, an atomic layer deposition (ALD) method, and the like.

By using the PECVD method, a high-quality film can be formed at a relatively low temperature. By using a deposition method that does not use plasma for deposition, such as an MOCVD method or an evaporation method, a film with few defects can be formed because damage is not easily caused on a surface on which the film is deposited.

A sputtering method is generally classified into a DC sputtering method, a magnetron sputtering method, an RF sputtering method, an ion beam sputtering method, an electron cyclotron resonance (ECR) sputtering method, a facing-target sputtering method, and the like.

In the facing-target sputtering method, plasma is confined between targets; thus, plasma damage to a substrate can be reduced. Furthermore, step coverage can be improved because the incident angle of a sputtered particle to a substrate can be made smaller depending on the inclination of a target.

A transistor 811 illustrated in FIG. 32A2 is different from the transistor 810 in that an electrode 723 that can serve as a back gate electrode is provided over the insulating layer 729. The electrode 723 can be formed using a material and a method similar to those of the electrode 746.

In general, the back gate electrode is formed using a conductive layer and positioned so that a channel formation region of a semiconductor layer is positioned between the gate electrode and the back gate electrode. Thus, the back gate electrode can function in a manner similar to that of the gate electrode. The potential of the back gate electrode may be the same as that of the gate electrode or may be a ground (GND) potential or a predetermined potential. By changing the potential of the back gate electrode independently of the potential of the gate electrode, the threshold voltage of the transistor can be changed.

The electrode 746 and the electrode 723 can each serve as a gate electrode. Thus, the insulating layers 726, 728, and 729 can each serve as a gate insulating layer. The electrode 723 may also be provided between the insulating layers 728 and 729.

In the case where one of the electrodes 746 and 723 is referred to as a "gate electrode", the other is referred to as a "back gate electrode". For example, in the transistor 811, in the case where the electrode 723 is referred to as a "gate electrode", the electrode 746 is referred to as a "back gate electrode". In the case where the electrode 723 is used as a "gate electrode", the transistor 811 can be regarded as a kind of top-gate transistor. Alternatively, one of the electrodes 746 and 723 may be referred to as a "first gate electrode", and the other may be referred to as a "second gate electrode".

By providing the electrodes 746 and 723 with the semiconductor layer 742 provided therebetween and setting the potentials of the electrodes 746 and 723 to be the same, a region of the semiconductor layer 742 through which carriers flow is enlarged in the film thickness direction; thus, the number of transferred carriers is increased. As a result, the on-state current and field-effect mobility of the transistor 811 are increased.

Therefore, the transistor 811 has a high on-state current for its area. That is, the area of the transistor 811 can be small for a required on-state current. In accordance with one embodiment of the present invention, the area occupied by a transistor can be reduced. Therefore, in accordance with one embodiment of the present invention, a semiconductor device having a high degree of integration can be provided.

The gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer such that the semiconductor layer is covered with the back gate electrode, the electric field blocking function can be enhanced.

Since the electrodes 746 and 723 each have a function of blocking an electric field generated outside, electric charge of charged particles and the like generated on the insulating layer 772 side or above the electrode 723 do not influence the channel formation region in the semiconductor layer 742. Thus, degradation by a stress test (e.g., a negative gate bias temperature (−GBT) stress test in which negative electric charge is applied to a gate) can be reduced. Furthermore, a change in gate voltage (rising voltage) at which on-state current starts flowing depending on drain voltage can be reduced. Note that this effect is obtained when the electrodes 746 and 723 have the same potential or different potentials.

The BT stress test is one kind of acceleration test and can evaluate, in a short time, a change by long-term use (i.e., a change over time) in characteristics of a transistor. In particular, the amount of change in the threshold voltage of a transistor before and after the BT stress test is an important indicator when examining the reliability of the transistor. As the change in threshold voltage is smaller, the transistor has higher reliability.

By providing the electrodes 746 and 723 and setting the potentials of the electrodes 746 and 723 to be the same, the amount of change in threshold voltage is reduced. Accordingly, variations in electrical characteristics among a plurality of transistors are also reduced.

A transistor including a back gate electrode has a smaller change in threshold voltage before and after a positive GBT stress test, in which positive electric charge is applied to a gate, than a transistor including no back gate electrode.

When the back gate electrode is formed using a light-blocking conductive film, light can be prevented from entering the semiconductor layer from the back gate electrode side. Therefore, photodegradation of the semiconductor layer can be prevented, and deterioration in electrical characteristics of the transistor, such as a shift of the threshold voltage, can be prevented.

In accordance with one embodiment of the present invention, a transistor with high reliability can be provided. Moreover, a semiconductor device with high reliability can be provided.

FIG. 32B1 is a cross-sectional view of a channel-protective transistor 820 that is a type of bottom-gate transistor. The channel-protective transistor 820 has substantially the same structure as the transistor 810 but is different from the transistor 810 in that the insulating layer 741 covers an end portion of the semiconductor layer 742. The semiconductor layer 742 is electrically connected to the electrode 744a through an opening formed by selectively removing part of the insulating layer 741 which overlaps with the semiconductor layer 742. The semiconductor layer 742 is electrically connected to the electrode 744b through another opening formed by selectively removing part of the insulating layer 741 which overlaps with the semiconductor layer 742. A region of the insulating layer 741 which overlaps with the channel formation region can serve as a channel protective layer.

A transistor 821 illustrated in FIG. 32B2 is different from the channel-protective transistor 820 in that the electrode 723 that can serve as a back gate electrode is provided over the insulating layer 729.

With the insulating layer 741, the semiconductor layer 742 can be prevented from being exposed at the time of forming the electrodes 744a and 744b. Thus, the semiconductor layer 742 can be prevented from being reduced in thickness at the time of forming the electrodes 744a and 744b.

The length between the electrode 744a and the electrode 746 and the length between the electrode 744b and the electrode 746 in the transistors 820 and 821 are larger than those in the transistors 810 and 811. Thus, the parasitic capacitance generated between the electrode 744a and the electrode 746 can be reduced. Moreover, the parasitic capacitance generated between the electrode 744b and the electrode 746 can be reduced. In accordance with one embodiment of the present invention, a transistor with favorable electrical characteristics can be provided.

A transistor 825 illustrated in FIG. 32C1 is a channel-etched transistor that is a type of bottom-gate transistor. In the transistor 825, the electrodes 744a and 744b are formed without providing the insulating layer 741. Thus, part of the semiconductor layer 742 that is exposed at the time of forming the electrodes 744a and 744b is etched in some cases. However, since the insulating layer 741 is not provided, the productivity of the transistor can be increased.

A transistor 826 illustrated in FIG. 32C2 is different from the transistor 825 in that the electrode 723 which can serve as a back gate electrode is provided over the insulating layer 729.

[Top-Gate Transistor]

FIG. 33A1 is a cross-sectional view of a transistor 830 that is a type of top-gate transistor. The transistor 830 includes the semiconductor layer 742 over the insulating layer 772, the electrodes 744a and 744b that are over the semiconductor layer 742 and the insulating layer 772 and in contact with part of the semiconductor layer 742, the insulating layer 726 over the semiconductor layer 742 and the electrodes 744a and 744b, and the electrode 746 over the insulating layer 726.

Since the electrode 746 overlaps with neither the electrode 744a nor the electrode 744b in the transistor 830, the parasitic capacitance generated between the electrodes 746 and 744a and the parasitic capacitance generated between the electrodes 746 and 744b can be reduced. After the formation of the electrode 746, an impurity 755 is introduced into the semiconductor layer 742 using the electrode 746 as a mask, so that an impurity region can be formed in the semiconductor layer 742 in a self-aligned manner (see FIG. 33A3). In accordance with one embodiment of the present invention, a transistor with favorable electrical characteristics can be provided.

The introduction of the impurity 755 can be performed with an ion implantation apparatus, an ion doping apparatus, or a plasma treatment apparatus.

As the impurity 755, for example, at least one kind of element of Group 13 elements and Group 15 elements can be used. In the case where an oxide semiconductor is used for the semiconductor layer 742, it is possible to use at least one kind of element of a rare gas, hydrogen, and nitrogen as the impurity 755.

A transistor 831 illustrated in FIG. 33A2 is different from the transistor 830 in that the electrode 723 and the insulating layer 727 are included. The transistor 831 includes the electrode 723 formed over the insulating layer 772 and the insulating layer 727 formed over the electrode 723. The electrode 723 can serve as a back gate electrode. Thus, the insulating layer 727 can serve as a gate insulating layer. The insulating layer 727 can be formed using a material and a method similar to those of the insulating layer 726.

Like the transistor 811, the transistor 831 has a high on-state current for its area. That is, the area of the transistor 831 can be small for a required on-state current. In accordance with one embodiment of the present invention, the area occupied by a transistor can be reduced. Therefore, in accordance with one embodiment of the present invention, a semiconductor device having a high degree of integration can be provided.

A transistor 840 illustrated in FIG. 33B1 is a type of top-gate transistor. The transistor 840 is different from the transistor 830 in that the semiconductor layer 742 is formed after the formation of the electrodes 744a and 744b. A transistor 841 illustrated in FIG. 33B2 is different from the transistor 840 in that the electrode 723 and the insulating layer 727 are included. In the transistors 840 and 841, part of the semiconductor layer 742 is formed over the electrode 744a and another part of the semiconductor layer 742 is formed over the electrode 744b.

Like the transistor 811, the transistor 841 has a high on-state current for its area. That is, the area of the transistor 841 can be small for a required on-state current. In accordance with one embodiment of the present invention, the area occupied by a transistor can be reduced. Therefore, in accordance with one embodiment of the present invention, a semiconductor device having a high degree of integration can be provided.

A transistor 842 illustrated in FIG. 34A1 is a type of top-gate transistor. The transistor 842 is different from the transistor 830 or 840 in that the electrodes 744a and 744b are formed after the formation of the insulating layer 729. The electrodes 744a and 744b are electrically connected to the semiconductor layer 742 through openings formed in the insulating layers 728 and 729.

Part of the insulating layer 726 that does not overlap with the electrode 746 is removed, and the impurity 755 is introduced into the semiconductor layer 742 using the electrode 746 and the insulating layer 726 that is left as a mask, so that an impurity region can be formed in the semiconductor layer 742 in a self-aligned manner (see FIG. 34A3). The transistor 842 includes a region where the insulating layer 726 extends beyond an end portion of the electrode 746. The semiconductor layer 742 in a region into which the impurity 755 is introduced through the insulating layer 726 has a lower impurity concentration than the semiconductor layer 742 in a region into which the impurity 755 is introduced without through the insulating layer 726. Thus, a lightly doped drain (LDD) region is formed in a region adjacent to a portion of the semiconductor layer 742 which overlaps with the electrode 746.

A transistor 843 illustrated in FIG. 34A2 is different from the transistor 842 in that the electrode 723 is included. The transistor 843 includes the electrode 723 that is formed over the substrate 771 and overlaps with the semiconductor layer 742 with the insulating layer 772 provided therebetween. The electrode 723 can serve as a back gate electrode.

As in a transistor 844 illustrated in FIG. 34B1 and a transistor 845 illustrated in FIG. 34B2, the insulating layer 726 in a region that does not overlap with the electrode 746 may be completely removed. Alternatively, as in a transistor 846 illustrated in FIG. 34C1 and a transistor 847 illustrated in FIG. 34C2, the insulating layer 726 may be left.

In the transistors 842 to 847, after the formation of the electrode 746, the impurity 755 is introduced into the semiconductor layer 742 using the electrode 746 as a mask, so that an impurity region can be formed in the semiconductor layer 742 in a self-aligned manner. In accordance with one embodiment of the present invention, a transistor with favorable electrical characteristics can be provided. Furthermore, in accordance with one embodiment of the present invention, a semiconductor device having a high degree of integration can be provided.

At least part of this embodiment can be implemented in appropriate combination with any of the other embodiments described in this specification.

Embodiment 4

In this embodiment, a structure example of a touch panel module including a touch panel of one embodiment of the present invention and an IC will be described with reference to drawings.

Figure 35:
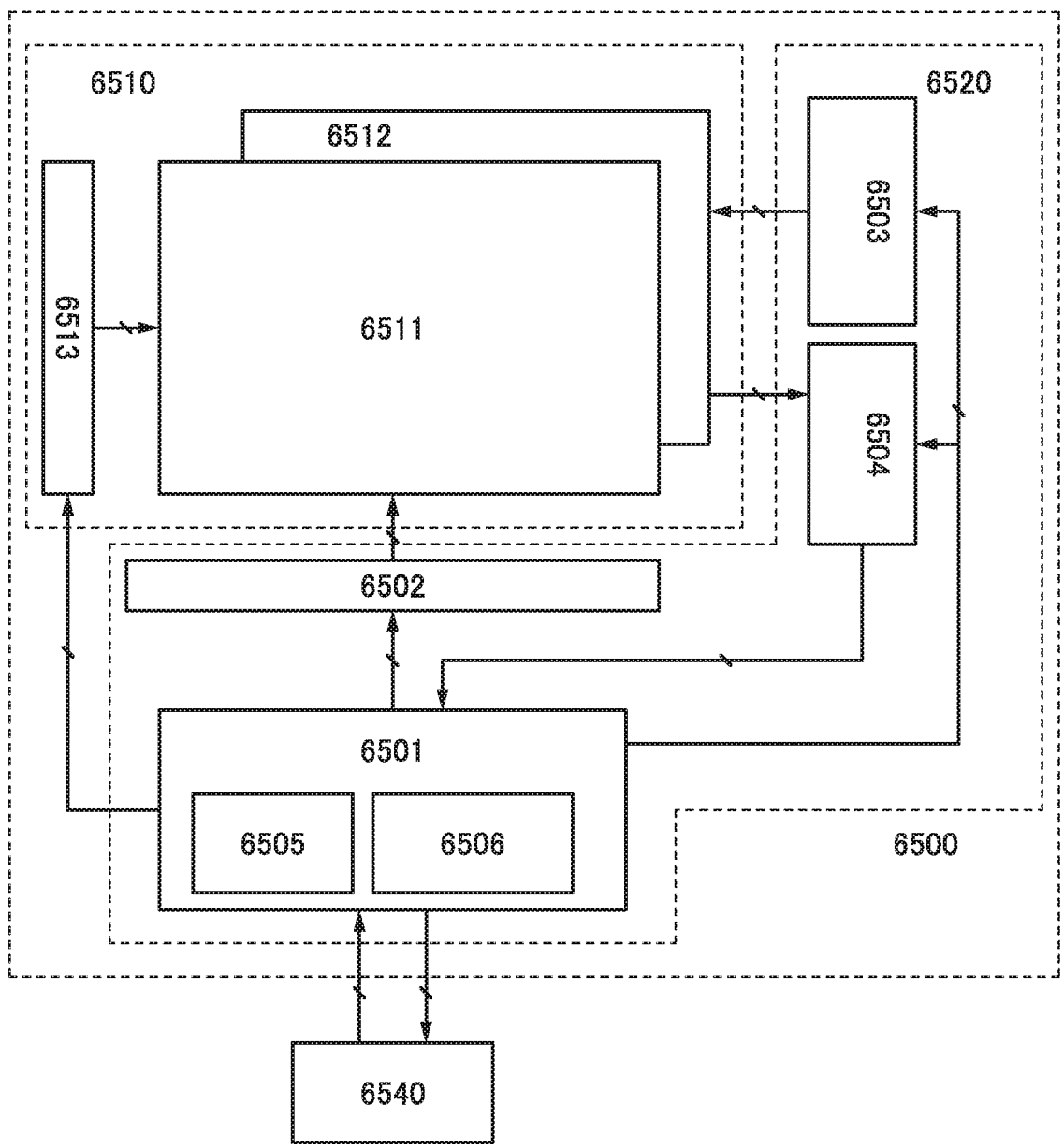
FIG. 35 is a block diagram of a touch panel module of an embodiment.

FIG. 35 is a block diagram of a touch panel module 6500. The touch panel module 6500 includes a touch panel 6510 and an IC 6520.

The touch panel 6510 includes a display portion 6511, an input portion 6512, and a scan line driver circuit 6513. The display portion 6511 includes a plurality of pixels, a plurality of signal lines, and a plurality of scan lines and has a function of displaying an image. The input portion 6512 includes a plurality of sensor elements for sensing the contact or approach of an object to the touch panel 6510 and serve as a touch sensor. The scan line driver circuit 6513 has a function of outputting scan signals to the scan lines included in the display portion 6511.

The display portion 6511 and the input portion 6512 are separately illustrated in the touch panel 6510 for simplicity; however, a so-called integrated touch panel having both a function of displaying an image and a function of a touch sensor is preferable. Examples of the integrated touch panel include an on-cell touch panel and an in-cell touch panel. The integrated touch panel can also be referred to as a display device equipped with a touch sensor. The touch panel 6510 is preferably an in-cell touch panel.

As a touch sensor that can be used for the input portion 6512, a capacitive touch sensor can be used. Examples of the capacitive touch sensor are a surface capacitive touch sensor and a projected capacitive touch sensor. Examples of the projected capacitive touch sensor include a self-capacitive touch sensor and a mutual capacitive touch sensor. The use of a mutual capacitive touch sensor is preferable because multiple points can be sensed simultaneously.

Note that one embodiment of the present invention is not limited thereto, and any of various sensors that can sense the approach or contact of an object such as a finger or a stylus can be used for the input portion 6512. For the touch sensor, in addition to a capacitive type, a variety of types such as a resistive type, a surface acoustic wave type, an infrared type, an optical type, and a pressure-sensitive type can be used, for example.

The on-cell touch panel has a structure in which electrodes and the like of touch sensors are provided on a surface of a substrate that does not support a display element (a counter substrate) that is opposite to the surface facing a substrate supporting the display element.

The in-cell touch panel has a structure in which electrodes and the like of touch sensors are provided between a pair of substrates. Typical examples of the in-cell touch panel includes a semi-in-cell touch panel and a full-in-cell touch panel. The semi-in-cell touch panel has a structure in which electrodes and the like of touch sensors are provided on a substrate that supports a display element and a counter substrate or on the counter substrate. In that case, the electrodes and the like of touch sensors are provided on a surface of the counter substrate that faces the substrate supporting the display element. Meanwhile, the full-in-cell touch panel has a structure in which electrodes and the like of touch sensors are provided on a substrate that supports a display element. The full-in-cell touch panel is preferable because the structure of the counter substrate can be simplified. In particular, the full-in-cell touch sensor preferably has a structure in which an electrode of a display element also serves as an electrode of a touch sensor because a manufacturing process can be simplified and manufacturing cost can be reduced.

The resolution of the display portion 6511 is preferably as high as HD (number of pixels: 1280×720), FHD (number of pixels: 1920×1080), WQHD (number of pixels: 2560× 1440), WQXGA (number of pixels: 2560×1600), 4K (number of pixels: 3840×2160), or 8K (number of pixels: 7680× 4320). In particular, resolution of 4K, 8K, or higher is preferable. The pixel density (definition) of the pixels in the display portion 6511 is higher than or equal to 300 ppi, preferably higher than or equal to 500 ppi, more preferably higher than or equal to 800 ppi, more preferably higher than or equal to 1000 ppi, and more preferably higher than or equal to 1200 ppi. The display portion 6511 with such high resolution and high definition enables an increase in a realistic sensation, sense of depth, and the like in personal use such as portable use and home use.

The IC 6520 includes a circuit unit 6501, a signal line driver circuit 6502, a sensor driver circuit 6503, and a sensing circuit 6504. The circuit unit 6501 includes a timing controller 6505, an image processing circuit 6506, or the like.

The signal line driver circuit 6502 is configured to output a video signal that is an analog signal to a signal line included in the display portion 6511. For example, the signal line driver circuit 6502 can include a shift register circuit and a buffer circuit in combination. The touch panel 6510 may include a demultiplexer circuit connected to a signal line.

The sensor driver circuit 6503 is configured to output a signal for driving a sensor element included in the input portion 6512. As the sensor driver circuit 6503, a shift register circuit and a buffer circuit can be used in combination, for example.

The sensing circuit 6504 is configured to output, to the circuit unit 6501, an output signal from the sensor element included in the input portion 6512. The sensing circuit 6504 can include an amplifier circuit and an analog-digital converter (ADC), for example. In that case, the sensing circuit 6504 converts an analog signal output from the input portion 6512 into a digital signal to be output to the circuit unit 6501.

The image processing circuit 6506 included in the circuit unit 6501 is configured to generate and output a signal for driving the display portion 6511 of the touch panel 6510, generate and output a signal for driving the input portion 6512, and analyze a signal output from the input portion 6512 and output the signal to a CPU 6540.

As more specific examples, the image processing circuit 6506 is configured to: generate a video signal in accordance with an instruction from the CPU 6540; perform signal processing on a video signal in accordance with the specification of the display portion 6511, convert the signal into an analog video signal, and supply the converted signal to the signal line driver circuit 6502; generate a driving signal output to the sensor driver circuit 6503 in accordance with an instruction from the CPU 6540; and analyze a signal input from the sensing circuit 6504 and output the analyzed signal to the CPU 6540 as positional information.

The timing controller 6505 is configured to generate and output a signal (e.g., a clock signal or a start pulse signal) output to the scan line driver circuit 6513 and the sensor driver circuit 6503 on the basis of a synchronization signal included in a video signal or the like on which the image processing circuit 6506 performs processing. Furthermore, the timing controller 6505 may be configured to generate and output a signal for determining the timing when the sensing circuit 6504 outputs a signal. Here, the timing controller 6505 preferably outputs synchronized signals as the signal output to the scan line driver circuit 6513 and the signal output to the sensor driver circuit 6503. In particular, it is preferable that a period in which data in a pixel in the display portion 6511 is rewritten and a period in which sensing is performed with the input portion 6512 be separately provided. For example, the touch panel 6510 can be driven by dividing one frame period into a period in which data in a pixel is rewritten and a period in which sensing is performed. Furthermore, detection sensitivity and detection accuracy can be increased, for example, by providing two or more sensing periods in one frame period.

The image processing circuit 6506 can include a processor, for example. A microprocessor such as a digital signal processor (DSP) or a graphics processing unit (GPU) can be used, for example. Furthermore, such a microprocessor may be obtained with a programmable logic device (PLD) such as a field programmable gate array (FPGA) or a field programmable analog array (FPAA). The image processing circuit 6506 interprets and executes instructions from various programs with the processor to process various kinds of data and control programs. The programs executed by the processor may be stored in a memory region included in the processor or a memory device which is additionally provided.

A transistor which includes an oxide semiconductor in a channel formation region and has an extremely low off-state current can be used in the display portion 6511 or the scan line driver circuit 6513 included in the touch panel 6510, the circuit unit 6501, the signal line driver circuit 6502, the sensor driver circuit 6503, or the sensing circuit 6504 included in the IC 6520, the CPU 6540 provided outside the touch panel module 6500, or the like. With the use of the transistor having an extremely low off-state current as a switch for holding electric charge (data) which flows into a capacitor serving as a memory element, a long data retention period can be ensured. For example, by utilizing the characteristic for a register or a cache memory of the image processing circuit 6506, normally off computing is achieved where the image processing circuit 6506 operates only when needed and data on the previous processing is stored in the memory element in the rest of time; thus, power consumption of the touch panel module 6500 and an electronic device on which the touch panel module 6500 is mounted can be reduced.

Although the structure where the circuit unit 6501 includes the timing controller 6505 and the image processing circuit 6506 is used here, the image processing circuit 6506 itself or a circuit having a function of part of the image processing circuit 6506 may be provided outside the IC 6520. Alternatively, the CPU 6540 may have a function of the image processing circuit 6506 or part thereof. For example, the circuit unit 6501 can include the signal line driver circuit 6502, the sensor driver circuit 6503, the sensing circuit 6504, and the timing controller 6505.

Although the example where the IC 6520 includes the circuit unit 6501 is shown here, the circuit unit 6501 is not necessarily included in the IC 6520. In that case, the IC 6520 can include the signal line driver circuit 6502, the sensor driver circuit 6503, and the sensing circuit 6504. For example, in the case where the touch panel module 6500 includes a plurality of ICs, the circuit unit 6501 may be separately provided and a plurality of ICs 6520 without the circuit unit 6501 may be provided, and alternatively, the IC 6520 and an IC including only the signal line driver circuit 6502 can be provided in combination.

When an IC has a function of driving the display portion 6511 of the touch panel 6510 and a function of driving the input portion 6512 as described above, the number of ICs mounted on the touch panel module 6500 can be reduced, resulting in cost reduction.

Figure 36A:
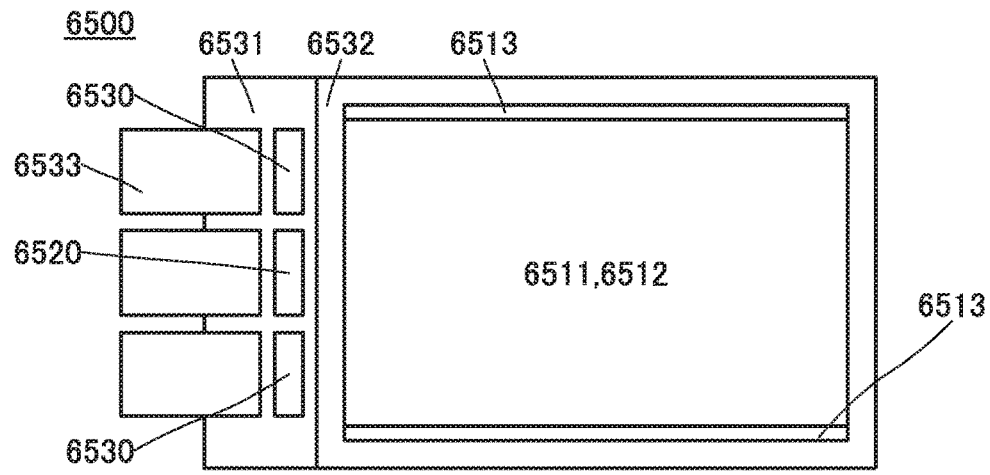
FIGS. 36A to 36C illustrate structure examples of a touch panel module of an embodiment.
Figure 36B:
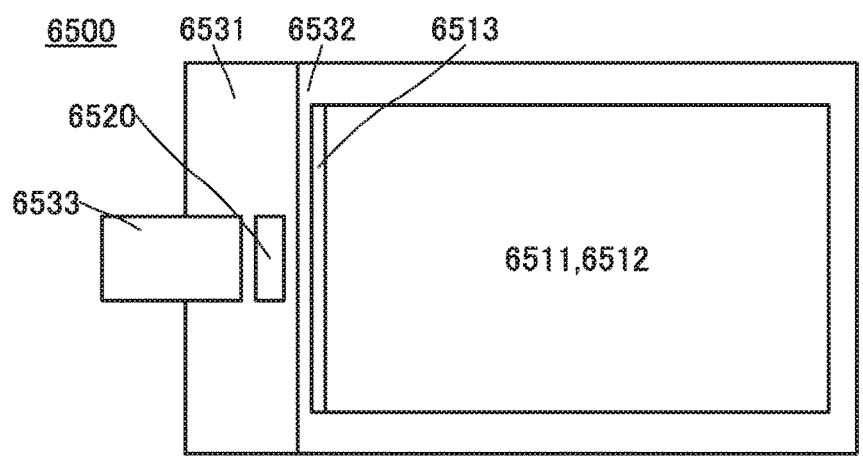
Figure 36C:
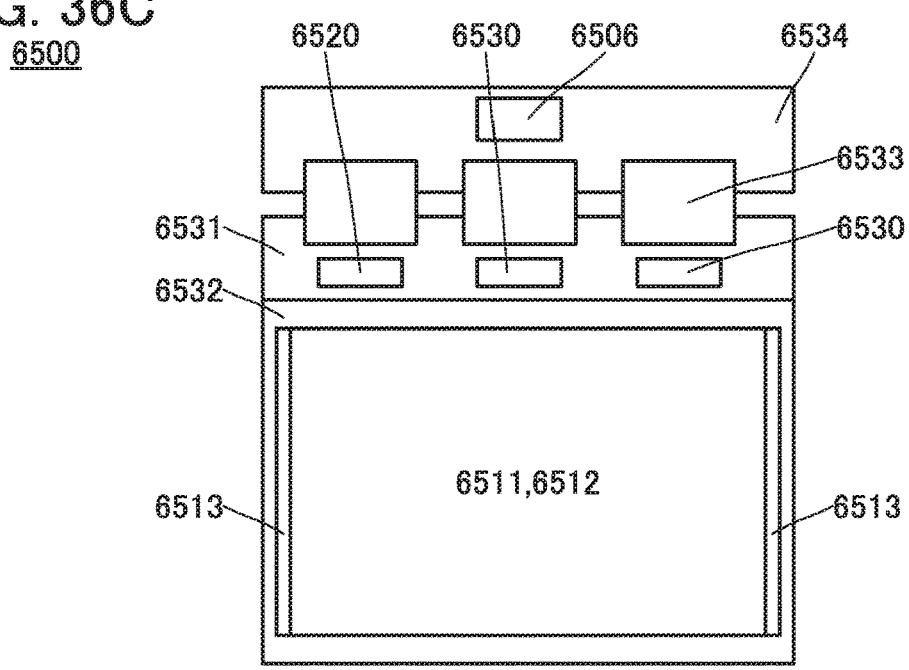

FIGS. 36A to 36C each are a schematic diagram of the touch panel module 6500 on which the IC 6520 is mounted.

In FIG. 36A, the touch panel module 6500 includes a substrate 6531, a counter substrate 6532, a plurality of FPCs 6533, the IC 6520, ICs 6530, and the like. The display portion 6511, the input portion 6512, and the scan line driver circuits 6513 are provided between the substrate 6531 and the counter substrate 6532. The IC 6520 and the ICs 6530 are mounted on the substrate 6531 by a chip on glass (COG) method or the like.

The IC 6530 is an IC in which only the signal line driver circuit 6502 is provided in the above-described IC 6520 or an IC in which the signal line driver circuit 6502 and the circuit unit 6501 are provided in the above-described IC 6520. The IC 6520 and the IC 6530 are supplied with a signal from the outside through the FPCs 6533. Furthermore, a signal can be output to the outside from the IC 6520 or the IC 6530 through the FPC 6533.

FIG. 36A shows an example in which the display portion 6511 is positioned between two scan line driver circuits 6513. The ICs 6530 are provided in addition to the IC 6520. Such a structure is preferable in the case where the display portion 6511 has extremely high resolution.

FIG. 36B shows an example in which one IC 6520 and one FPC 6533 are provided. It is preferable to bring functions into one IC 6520 in this manner because the number of components can be reduced. In the example in FIG. 36B, the scan line driver circuit 6513 is provided along a side close to the FPC 6533 among two short sides of the display portion 6511.

FIG. 36C shows an example of including a printed circuit board (PCB) 6534 on which the image processing circuit 6506 and the like are mounted. The ICs 6520 and 6530 over the substrate 6531 are electrically connected to the PCB 6534 through the FPCs 6533. The above-described structure without the image processing circuit 6506 can be applied to the IC 6520.

In each of FIGS. 36A to 36C, the IC 6520 or the IC 6530 may be mounted on the FPC 6533, not on the substrate 6531. For example, the IC 6520 or the IC 6530 may be mounted on the FPC 6533 by a chip on film (COF) method, a tape automated bonding (TAB) method, or the like.

When the FPC 6533, the IC 6520 (and the IC 6530), or the like is provided on a short side of the display portion 6511 as illustrated in FIGS. 36A and 36B, the frame of the display device can be narrowed, which is preferable for electronic devices such as smartphones, mobile phones, and tablet terminals, for example. The structure with the PCB 6534 illustrated in FIG. 36C can be preferably used for television devices, monitors, tablet terminals, or laptop personal computers, for example.

At least part of this embodiment can be implemented in appropriate combination with any of the other embodiments described in this specification.

Embodiment 5

In this embodiment, a display module and electronic devices that include the display device of one embodiment of the present invention or a display system will be described with reference to FIG. 37 to FIG. 42E.

Figure 37:
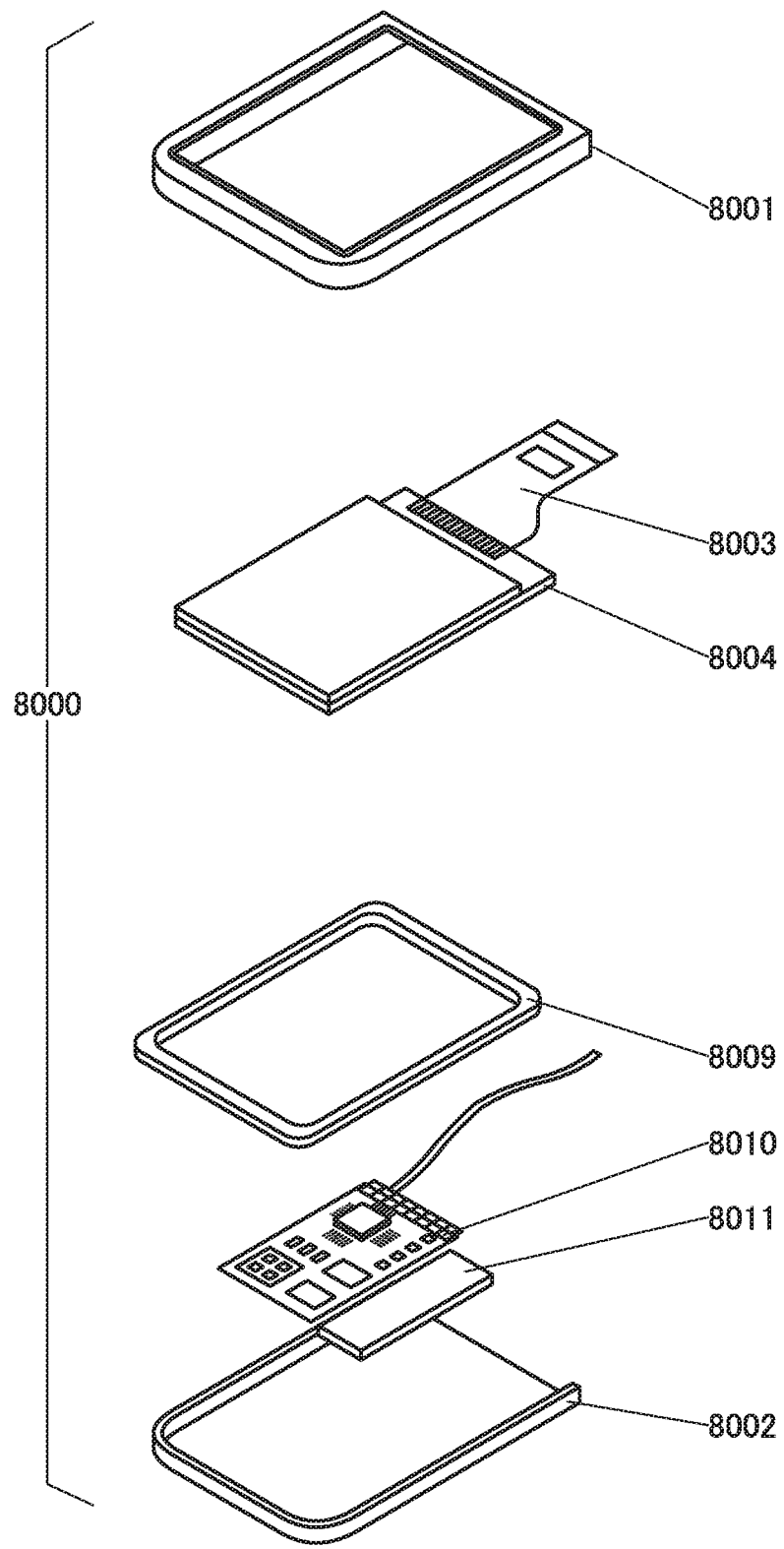
FIG. 37 illustrates a display module of an embodiment.

In a display module 8000 illustrated in FIG. 37, a touch panel 8004 connected to an FPC 8003, a frame 8009, a printed board 8010, and a battery 8011 are provided between an upper cover 8001 and a lower cover 8002.

The display panel, the touch panel, or the touch panel module of one embodiment of the present invention can be used for the touch panel 8004, for example.

The shapes and sizes of the upper cover 8001 and the lower cover 8002 can be changed as appropriate in accordance with the size of the touch panel 8004.

The touch panel 8004 can be a resistive touch panel or a capacitive touch panel and may be formed so as to overlap with a display panel. A counter substrate (sealing substrate) of the touch panel 8004 can have a touch panel function. A photosensor may be provided in each pixel of the touch panel 8004 so that an optical touch panel can be obtained.

In the case where a transmissive or a semi-transmissive liquid crystal element is used, a backlight may be provided between the touch panel 8004 and the frame 8009. The backlight includes a light source. Note that the light source may be provided over the backlight; alternatively, the light source may be provided at an end portion of the backlight and a light diffusion plate may be further provided. Note that the backlight need not be provided in the case where a self-luminous light-emitting element such as an organic EL element is used or in the case where a reflective panel or the like is employed.

The frame 8009 protects the touch panel 8004 and also serves as an electromagnetic shield for blocking electromagnetic waves generated by the operation of the printed board 8010. The frame 8009 can also serve as a radiator plate.

The printed board 8010 is provided with a power supply circuit and a signal processing circuit for outputting a video signal and a clock signal. As a power source for supplying electric power to the power supply circuit, an external commercial power source or a power source using the battery 8011 provided separately may be used. The battery 8011 can be omitted in the case of using a commercial power source.

The touch panel 8004 can be additionally provided with a component such as a polarizing plate, a retardation plate, or a prism sheet.

Electronic devices and lighting devices can be manufactured by using the display panel, the light-emitting panel, the sensor panel, the touch panel, the touch panel module, the input device, the display device, or the input/output device of one embodiment of the present invention. Highly reliable electronic devices and lighting devices with curved surfaces can be manufactured by using the input device, the display device, or the input/output device of one embodiment of the present invention. In addition, flexible and highly reliable electronic devices and lighting devices can be manufactured by using the input device, the display device, or the input/output device of one embodiment of the present invention. Furthermore, electronic devices and lighting devices including touch sensors with improved sensitivity can be manufactured by using the input device or the input/output device of one embodiment of the present invention.

Examples of electronic devices include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, a large game machine such as a pachinko machine, and the like.

In the case of having flexibility, the electronic device or the lighting device of one embodiment of the present invention can be incorporated along a curved inside/outside wall surface of a house or a building or a curved interior/exterior surface of a car.

Furthermore, the electronic device of one embodiment of the present invention may include a secondary battery. Preferably, the secondary battery is capable of being charged by contactless power transmission.

Examples of the secondary battery include a lithium ion secondary battery such as a lithium polymer battery (lithium ion polymer battery) using a gel electrolyte, a lithium ion battery, a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, an image, data, or the like can be displayed on a display portion. When the electronic device includes a secondary battery, the antenna may be used for contactless power transmission.

FIGS. 38A to 38H and FIGS. 39A and 39B illustrate electronic devices. These electronic devices can each include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone 5008, and the like.

Figure 38A:
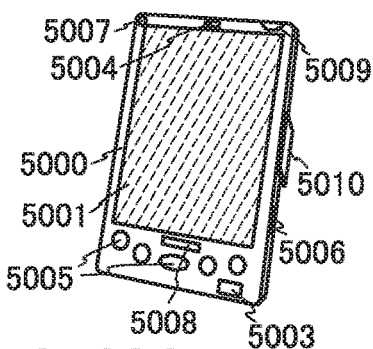
FIGS. 38A to 38H illustrate electronic devices of an embodiment.

FIG. 38A illustrates a mobile computer, which can include a switch 5009, an infrared port 5010, and the like in addition to the above components.

Figure 38B:
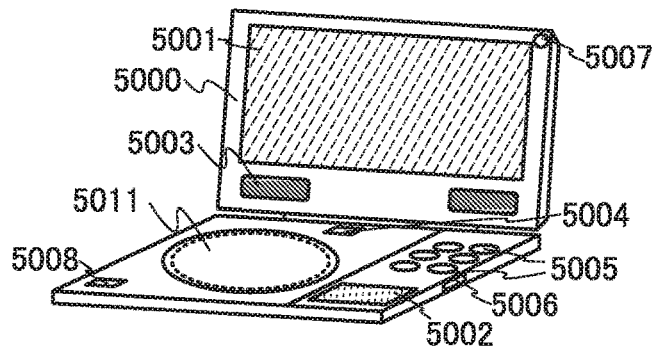

FIG. 38B illustrates a portable image reproducing device provided with a recording medium (e.g., a DVD reproducing device), which can include a second display portion 5002, a recording medium reading portion 5011, and the like in addition to the above components.

Figure 38C:
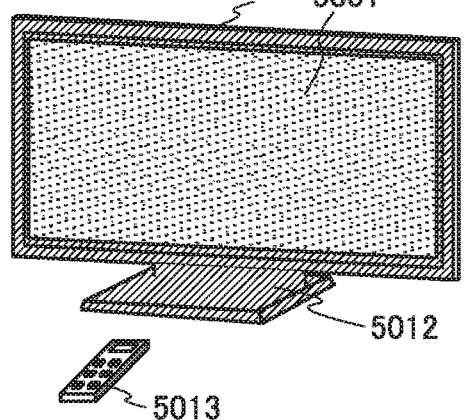

FIG. 38C illustrates a television device, which can include a stand 5012 and the like in addition to the above components. The television device can be operated by an operation switch of the housing 5000 or a separate remote controller 5013. With operation keys of the remote controller 5013, channels and volume can be controlled, and images displayed on the display portion 5001 can be controlled. The remote controller 5013 may be provided with a display portion for displaying data output from the remote controller 5013.

Figure 38D:
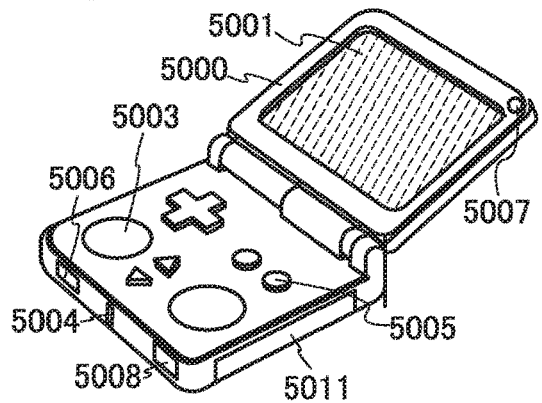

FIG. 38D illustrates a portable game machine, which can include the recording medium reading portion 5011 and the like in addition to the above components.

Figure 38E:
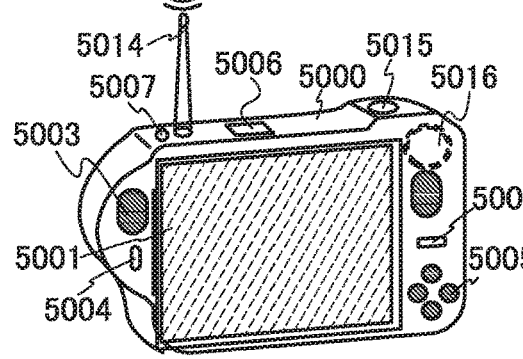

FIG. 38E illustrates a digital camera that has a television reception function and can include an antenna 5014, a shutter button 5015, an image receiving portion 5016, and the like in addition to the above components.

Figure 38F:
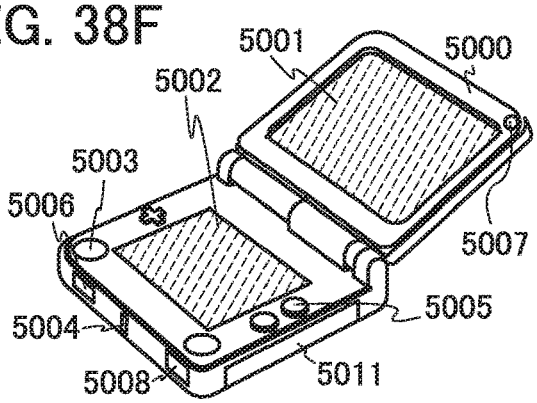

FIG. 38F illustrates a portable game machine, which can include the second display portion 5002, the recording medium reading portion 5011, and the like in addition to the above components.

Figure 38G:
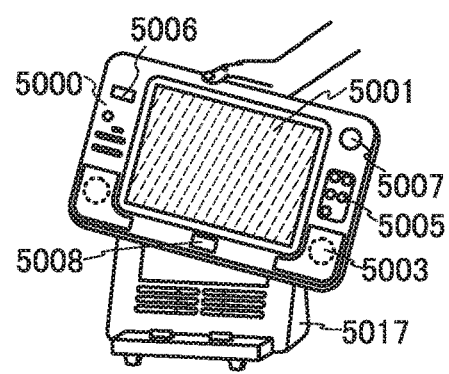

FIG. 38G illustrates a portable television receiver, which can include a charger 5017 capable of transmitting and receiving signals, and the like in addition to the above components.

Figure 38H:
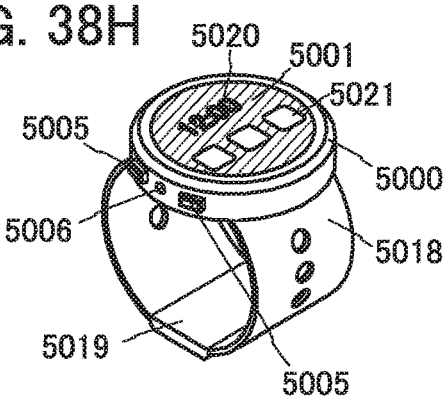

FIG. 38H illustrates a wrist-watch-type information terminal, which can include a band 5018, a clasp 5019, and the like in addition to the above components. The display portion 5001 mounted in the housing 5000 also serving as a bezel includes a non-rectangular display region. The display portion 5001 can display an icon 5020 indicating time, another icon 5021, and the like.

Figure 39A:
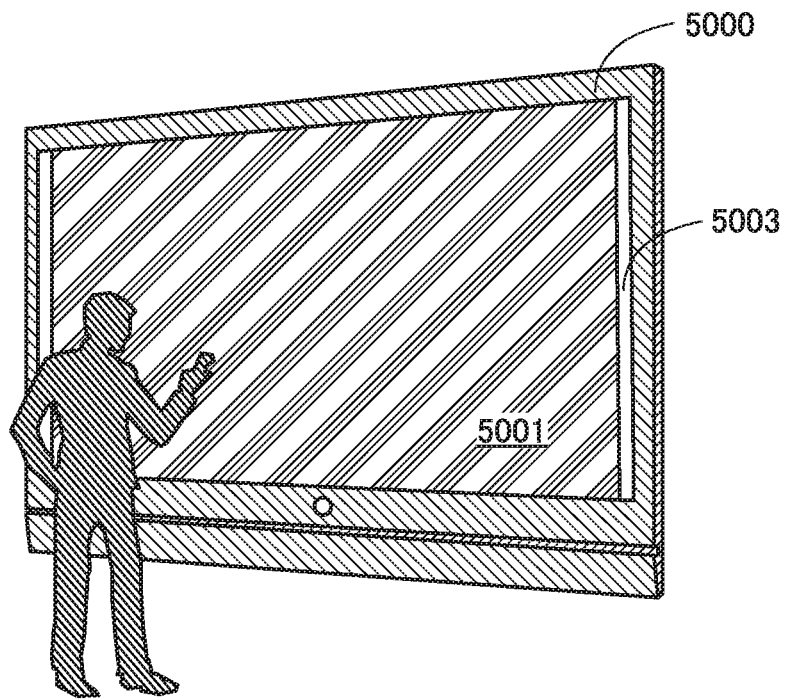
FIGS. 39A and 39B illustrate electronic devices of an embodiment.
Figure 39B:
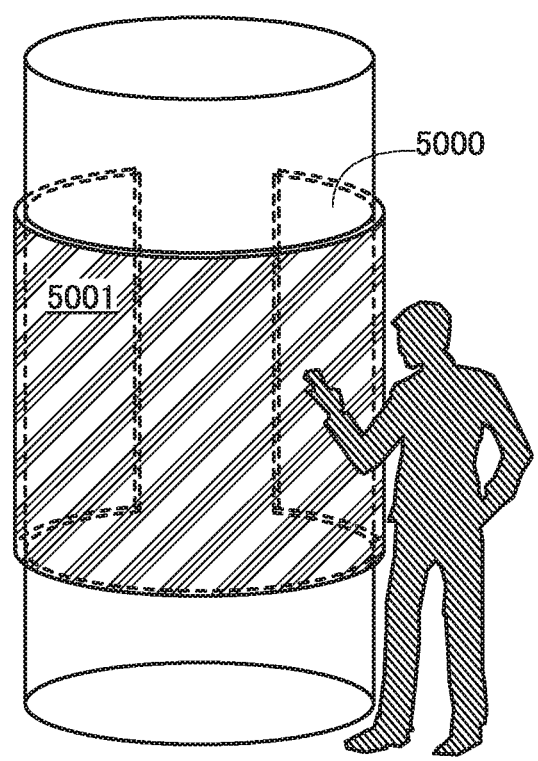

FIG. 39A illustrates a digital signage. FIG. 39B illustrates a digital signage mounted on a cylindrical pillar.

The electronic devices illustrated in FIGS. 38A to 38H and FIGS. 39A and 39B can have a variety of functions, for example, a function of displaying a variety of information (e.g., a still image, a moving image, and a text image) on a display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading a program or data stored in a recording medium and displaying the program or data on a display portion. Furthermore, the electronic device including a plurality of display portions can have a function of displaying image information mainly on one display portion while displaying text information mainly on another display portion, a function of displaying a three-dimensional image by displaying images where parallax is considered on a plurality of display portions, or the like. Furthermore, the electronic device including an image receiving portion can have a function of photographing a still image, a function of photographing a moving image, a function of automatically or manually correcting a photographed image, a function of storing a photographed image in a recording medium (an external recording medium or a recording medium incorporated in the camera), a function of displaying a photographed image on a display portion, or the like. Note that the functions of the electronic devices illustrated in FIGS. 38A to 38H and FIGS. 39A and 39B are not limited thereto, and the electronic devices can have a variety of functions.

FIGS. 40A, 40B, 40C1, 40C2, 40D, and 40E illustrate examples of an electronic device including a display portion 7000 with a curved surface. The display surface of the display portion 7000 is bent, and images can be displayed on the bent display surface. The display portion 7000 may be flexible.

The display portion 7000 can be formed using the functional panel, the display panel, the light-emitting panel, the sensor panel, the touch panel, the display device, the input/output device, or the like of one embodiment of the present invention. One embodiment of the present invention makes it possible to provide a highly reliable electronic device having a curved display portion.

FIG. 40A illustrates an example of a mobile phone. A mobile phone 7100 includes a housing 7101, the display portion 7000, operation buttons 7103, an external connection port 7104, a speaker 7105, a microphone 7106, and the like.

The mobile phone 7100 illustrated in FIG. 40A includes a touch sensor in the display portion 7000. Operations such as making a call and inputting a letter can be performed by touch on the display portion 7000 with a finger, a stylus, or the like.

With the operation buttons 7103, power ON or OFF can be switched. In addition, types of images displayed on the display portion 7000 can be switched; for example, switching from a mail creation screen to a main menu screen can be performed.

FIG. 40B illustrates an example of a television set. In a television set 7200, the display portion 7000 is incorporated into a housing 7201. Here, the housing 7201 is supported by a stand 7203.

The television set 7200 illustrated in FIG. 40B can be operated with an operation switch of the housing 7201 or a separate remote controller 7211. The display portion 7000 may include a touch sensor, and can be operated by touch on the display portion with a finger or the like. The remote controller 7211 may be provided with a display portion for displaying data output from the remote controller 7211. With operation keys or a touch panel of the remote controller 7211, channels and volume can be controlled and images displayed on the display portion 7000 can be controlled.

The television set 7200 is provided with a receiver, a modem, and the like. A general television broadcast can be received with the receiver. When the television set is connected to a communication network with or without wires via the modem, one-way (from a transmitter to a receiver) or two-way (between a transmitter and a receiver or between receivers) data communication can be performed.

FIGS. 40C1, 40C2, 40D, and 40E illustrate examples of a portable information terminal. Each of the portable information terminals includes a housing 7301 and the display portion 7000. Each of the portable information terminals may also include an operation button, an external connection port, a speaker, a microphone, an antenna, a battery, or the like. The display portion 7000 is provided with a touch sensor. An operation of the portable information terminal can be performed by touch on the display portion 7000 with a finger, a stylus, or the like.

FIG. 40C1 is a perspective view of a portable information terminal 7300. FIG. 40C2 is a top view of the portable information terminal 7300. FIG. 40D is a perspective view of a portable information terminal 7310. FIG. 40E is a perspective view of a portable information terminal 7320.

Each of the portable information terminals illustrated in this embodiment functions as, for example, one or more of a telephone set, a notebook, and an information browsing system. Specifically, the portable information terminals each can be used as a smartphone. Each of the portable information terminals illustrated in this embodiment is capable of executing a variety of applications such as mobile phone calls, e-mailing, reading and editing texts, music reproduction, Internet communication, and a computer game, for example.

The portable information terminals 7300, 7310, and 7320 can display characters and image information on its plurality of surfaces. For example, as illustrated in FIGS. 40C1 and 40D, three operation buttons 7302 can be displayed on one surface, and information 7303 indicated by a rectangle can be displayed on another surface. FIGS. 40C1 and 40C2 illustrate an example in which information is displayed at the top of the portable information terminal. FIG. 40D illustrates an example in which information is displayed on the side of the portable information terminal. Information may be displayed on three or more surfaces of the portable information terminal. FIG. 40E shows an example in which information 7304, information 7305, and information 7306 are displayed on different surfaces.

Examples of the information include notification from a social networking service (SNS), display indicating reception of an e-mail or an incoming call, the title of an e-mail or the like, the sender of an e-mail or the like, the date, the time, remaining battery, and the reception strength of an antenna. Alternatively, the operation button, an icon, or the like may be displayed instead of the information.

For example, a user of the portable information terminal 7300 can see the display (here, the information 7303) on the portable information terminal 7300 put in a breast pocket of his/her clothes.

Specifically, a caller's phone number, name, or the like of an incoming call is displayed in a position that can be seen from above the portable information terminal 7300. Thus, the user can see the display without taking out the portable information terminal 7300 from the pocket and decide whether to answer the call.

FIGS. 40F to 40H each illustrate an example of a lighting device having a curved light-emitting portion.

The light-emitting portion included in each of the lighting devices illustrated in FIGS. 40F to 40H can be manufactured using the functional panel, the display panel, the light-emitting panel, the sensor panel, the touch panel, the display device, the input/output device, or the like of one embodiment of the present invention. According to one embodiment of the present invention, a highly reliable lighting device having a curved light-emitting portion can be provided.

A lighting device 7400 illustrated in FIG. 40F includes a light-emitting portion 7402 with a wave-shaped light-emitting surface and thus is a good-design lighting device.

A light-emitting portion 7412 included in a lighting device 7410 illustrated in FIG. 40G has two convex-curved light-emitting portions symmetrically placed. Thus, all directions can be illuminated with the lighting device 7410 as a center.

A lighting device 7420 illustrated in FIG. 40H includes a concave-curved light-emitting portion 7422. This is suitable for illuminating a specific range because light emitted from the concave-curved light-emitting portion 7422 is collected to the front of the lighting device 7420. In addition, with this structure, a shadow is less likely to be produced.

The light-emitting portion included in each of the lighting devices 7400, 7410 and 7420 may be flexible. The light-emitting portion may be fixed on a plastic member, a movable frame, or the like so that a light-emitting surface of the light-emitting portion can be bent freely depending on the intended use.

The lighting devices 7400, 7410, and 7420 each include a stage 7401 provided with an operation switch 7403 and the light-emitting portion supported by the stage 7401.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface is curved to have a concave shape, whereby a particular region can be brightly illuminated, or the light-emitting surface is curved to have a convex shape, whereby a whole room can be brightly illuminated.

FIGS. 41A1, 41A2, and 41B to 41I each illustrate an example of a portable information terminal including a display portion 7001 having flexibility.

The display portion 7001 is manufactured using the functional panel, the display panel, the light-emitting panel, the sensor panel, the touch panel, the display device, the input/output device, or the like of one embodiment of the present invention. For example, a display device or an input/output device that can be bent with a radius of curvature of greater than or equal to 0.01 mm and less than or equal to 150 mm can be used. The display portion 7001 may include a touch sensor so that the portable information terminal can be operated by touch on the display portion 7001 with a finger or the like. One embodiment of the present invention makes it possible to provide a highly reliable electronic device including a display portion having flexibility.

FIGS. 41A1 and 41A2 are a perspective view and a side view illustrating an example of the portable information terminal, respectively. A portable information terminal 7500 includes a housing 7501, the display portion 7001, a display portion tab 7502, operation buttons 7503, and the like.

The portable information terminal 7500 includes a rolled flexible display portion 7001 in the housing 7501.

The portable information terminal 7500 can receive a video signal with a control portion incorporated therein and can display the received video on the display portion 7001. The portable information terminal 7500 incorporates a battery. A terminal portion for connecting a connector may be included in the housing 7501 so that a video signal or power can be directly supplied from the outside with a wiring.

By pressing the operation buttons 7503, power ON/OFF, switching of displayed videos, and the like can be performed. Although FIGS. 41A1, 41A2, and 41B shows an example in which the operation buttons 7503 are positioned on a side surface of the portable information terminal 7500, one embodiment of the present invention is not limited thereto. The operation buttons 7503 may be placed on a display surface (a front surface) or a rear surface of the portable information terminal 7500.

FIG. 41B illustrates the portable information terminal 7500 in a state where the display portion 7001 is pulled out with the display portion tab 7502. Videos can be displayed on the display portion 7001 in this state. In addition, the portable information terminal 7500 may perform different displays in the state where part of the display portion 7001 is rolled as shown in FIG. 41A1 and in the state where the display portion 7001 is pulled out with the display portion tab 7502 as shown in FIG. 41B. For example, in the state shown in FIG. 41A1, the rolled portion of the display portion 7001 is put in a non-display state, reducing the power consumption of the portable information terminal 7500.

A reinforcement frame may be provided for a side portion of the display portion 7001 so that the display portion 7001 has a flat display surface when pulled out.

Note that in addition to this structure, a speaker may be provided for the housing so that sound is output with an audio signal received together with a video signal.

FIGS. 41C to 41E illustrate an example of a foldable portable information terminal. FIG. 41C illustrates a portable information terminal 7600 that is opened. FIG. 41D illustrates the portable information terminal 7600 that is being opened or being folded. FIG. 41E illustrates the portable information terminal 7600 that is folded. The portable information terminal 7600 is highly portable when folded, and is highly browsable when opened because of a seamless large display area.

The display portion 7001 is supported by three housings 7601 joined together by hinges 7602. By folding the portable information terminal 7600 at a connection portion between two housings 7601 with the hinges 7602, the portable information terminal 7600 can be reversibly changed in shape from an opened state to a folded state.

FIGS. 41F and 41G illustrate an example of a foldable portable information terminal. FIG. 41F illustrates a portable information terminal 7650 that is folded so that the display portion 7001 is on the inside. FIG. 41G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated or damaged.

FIG. 41H illustrates an example of a flexible portable information terminal. A portable information terminal 7700 includes a housing 7701 and the display portion 7001. The portable information terminal 7700 may include buttons 7703a and 7703b which serve as input means, speakers 7704a and 7704b which serve as sound output means, an external connection port 7705, a microphone 7706, or the like. A flexible battery 7709 can be included in the portable information terminal 7700. The flexible battery 7709 may be arranged to overlap with the display portion 7001, for example.

The housing 7701, the display portion 7001, the flexible battery 7709 are flexible. Thus, it is easy to curve the portable information terminal 7700 into a desired shape or to twist the portable information terminal 7700. For example, the portable information terminal 7700 can be folded so that the display portion 7001 is on the inside or on the outside. The portable information terminal 7700 can be used in a rolled state. Since the housing 7701 and the display portion 7001 can be transformed freely in this manner, the portable information terminal 7700 is less likely to be broken even when the portable information terminal 7700 falls down or external stress is applied to the portable information terminal 7700.

The portable information terminal 7700 is lightweight and therefore can be used conveniently in various situations. For example, the portable information terminal 7700 can be used in the state where the upper portion of the housing 7701 is suspended by a clip or the like, or in the state where the housing 7701 is fixed to a wall by magnets or the like.

FIG. 41I illustrates an example of a wrist-watch-type portable information terminal. The portable information terminal 7800 includes a band 7801, the display portion 7001, an input-output terminal 7802, operation buttons 7803, and the like. The band 7801 has a function of a housing. A flexible battery 7805 can be included in the portable information terminal 7800. The flexible battery 7805 may overlap with the display portion 7001 and the band 7801, for example.

The band 7801, the display portion 7001, and the flexible battery 7805 have flexibility. Thus, the portable information terminal 7800 can be easily curved to have a desired shape.

With the operation buttons 7803, a variety of functions such as time setting, ON/OFF of the power, ON/OFF of wireless communication, setting and cancellation of silent mode, and setting and cancellation of power saving mode can be performed. For example, the functions of the operation buttons 7803 can be set freely by the operating system incorporated in the portable information terminal 7800.

By touch on an icon 7804 displayed on the display portion 7001 with a finger or the like, application can be started.

The portable information terminal 7800 can employ near field communication conformable to a communication standard. For example, mutual communication between the portable information terminal and a headset capable of wireless communication can be performed, and thus hands-free calling is possible.

The portable information terminal 7800 may include the input-output terminal 7802. In the case where the input-output terminal 7802 is included in the portable information terminal 7800, data can be directly transmitted to and received from another information terminal via a connector. Charging through the input-output terminal 7802 is also possible. Note that charging of the portable information terminal described as an example in this embodiment can be performed by contactless power transmission without using the input-output terminal.

Figure 42A:
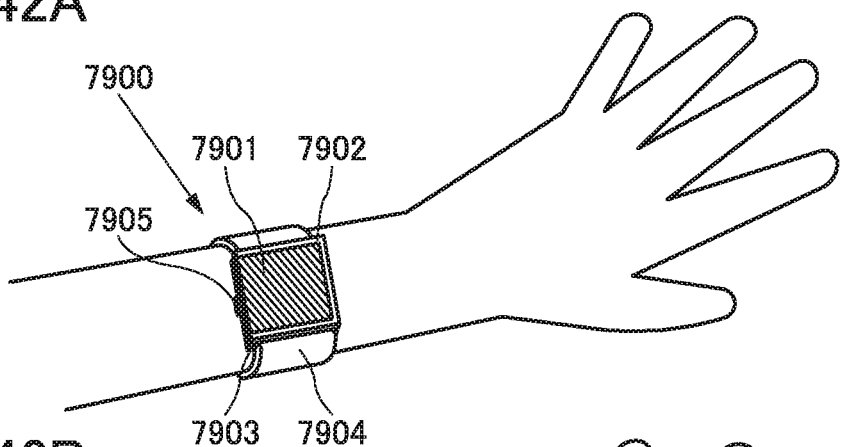
FIGS. 42A to 42E illustrate electronic devices of an embodiment.
Figure 42B:
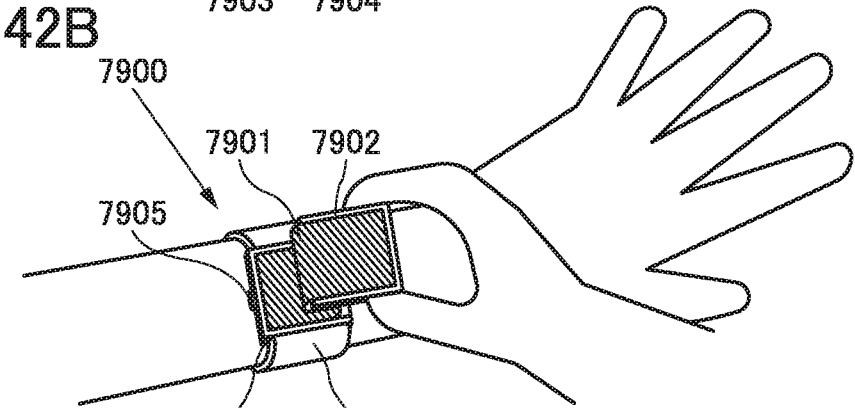
Figure 42C:
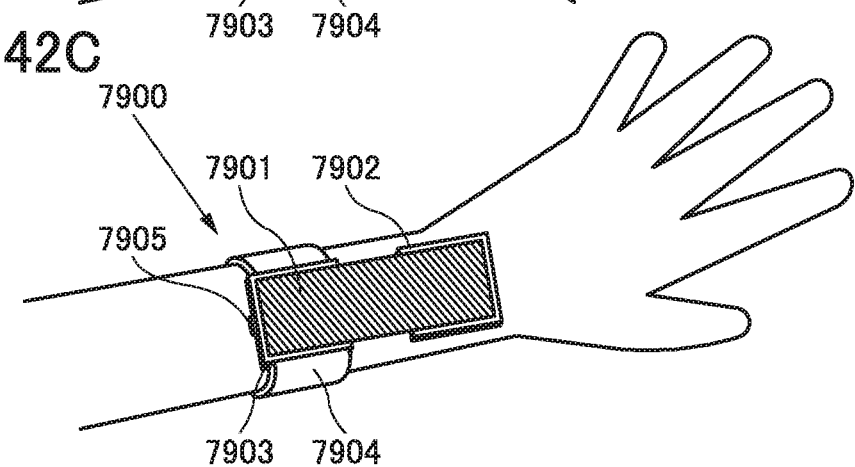

FIGS. 42A to 42C illustrate an example of a watch-type foldable portable information terminal. A portable information terminal 7900 includes a display portion 7901, a housing 7902, a housing 7903, a band 7904, an operation button 7905, and the like.

The portable information terminal 7900 can be reversibly changed in shape from a state in which the housing 7902 overlaps with the housing 7903 as illustrated in FIG. 42A into a state in which the display portion 7901 is opened as illustrated in FIG. 42C by lifting the housing 7902 as illustrated in FIG. 42B. Therefore, the portable information terminal 7900 can be generally used in a state where the display portion 7901 is folded and can be used in a wide display region by developing the display portion 7901.

When the display portion 7901 functions as a touch panel, the portable information terminal 7900 can be operated by touch on the display portion 7901. The portable information terminal 7900 can be operated by pushing, turning, or sliding the operation button 7905 vertically, forward, or backward.

A lock mechanism is preferably provided so that the housing 7902 and the housing 7903 are not detached from each other accidentally when overlapping with each other as illustrated in FIG. 42A. In that case, it is preferable that the lock state can be canceled by pushing the operation button 7905, for example. Alternatively, the lock state may be canceled by utilizing restoring force of a spring or the like as a mechanism in which the portable information terminal is automatically changed in form from the state illustrated in FIG. 42A into the state illustrated in FIG. 42C. Alternatively, the position of the housing 7902 relative to the housing 7903 may be fixed by utilizing magnetic force instead of the lock mechanism. By utilizing magnetic force, the housing 7902 and the housing 7903 can be easily attached or detached. For example, one of the housing 7902 and the housing 7903 is provided with a ferromagnet, and the other thereof is provided with a magnet such as a ferromagnet or a paramagnet so that the latter magnet overlaps with the former ferromagnet when the two housings overlap with each other.

Figure 42D:
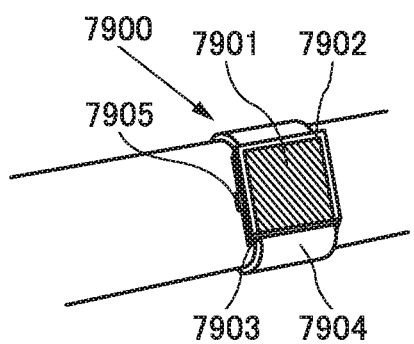
Figure 42E:
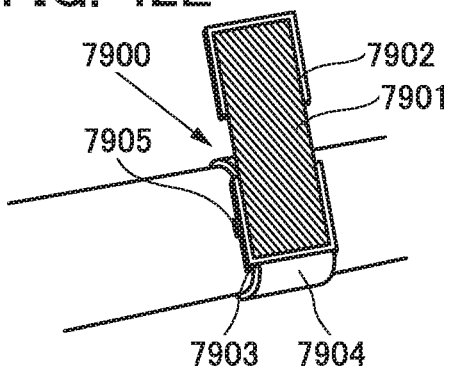

Although the display portion 7901 can be opened in a direction substantially perpendicular to the bending direction of the band 7904 in FIGS. 42A to 42C, the display portion 7901 may be opened in a direction substantially parallel to the bending direction of the band 7904 as illustrated in FIGS. 42D and 42E. In that case, the display portion 7901 may be used in a bent state to be wound to the band 7904.

The electronic devices in this embodiment each include a display portion for displaying some kind of information. The display panel, the touch panel, the touch panel module, or the like of one embodiment of the present invention can be used for the display portion.

At least part of this embodiment can be implemented in combination with any of the other embodiments described in this specification as appropriate.

This application is based on Japanese Patent Application serial No. 2015-135999 filed with Japan Patent Office on Jul. 7, 2015, the entire contents of which are hereby incorporated by reference.

What is claimed is:

1. A touch sensor comprising:
a first wiring and a second wiring;
a structure body above the first wiring;
a conductive layer above the structure body; and
a light-emitting element comprising a first electrode, an EL layer above the first electrode, and a second electrode above the EL layer,
wherein the structure body has an inverse tapered shape,
wherein the conductive layer overlaps with the structure body and the first wiring,
wherein the conductive layer, the first wiring, and the second wiring have capacitive coupling, and
wherein the first wiring and the second wiring function as a pair of electrodes of the touch sensor.

2. The touch panel according to claim 1,
wherein the conductive layer is in a floating state.

3. The touch panel according to claim 1,
wherein a taper angle of a side surface of the structure body is greater than 90 degrees.

4. The touch panel according to claim 1,
wherein the structure body has an insulating property.

5. The touch panel according to claim 1,
wherein the structure body has conductivity.

6. A touch sensor comprising:
a first wiring;
a second wiring;
a first structure body over the first wiring;
a second structure body over the second wiring;
a first conductive layer above the first structure body;
a second conductive layer above the second structure body; and
a light-emitting element comprising a first electrode, an EL layer over the first electrode, and a second electrode over the EL layer,
wherein the first structure body has a portion overlapping with the first wiring and has an inverse tapered shape,
wherein the second structure body has a portion overlapping with the second wiring and has an inverse tapered shape,
wherein the first conductive layer has a portion overlapping with the first structure body and the first wiring and is in a floating state,
wherein the second conductive layer has a portion overlapping with the second structure body and the second wiring and is in a floating state,
wherein the first conductive layer and the first wiring have capacitive coupling, the second conductive layer and the second wiring have capacitive coupling, and the first conductive layer and the second conductive layer have capacitive coupling,
wherein the first conductive layer, the second conductive layer, and the second electrode are formed from a same layer,
wherein the second electrode is between the first structure body and the second structure body, and
wherein the first wiring and the second wiring function as a pair of electrodes of the touch sensor.

7. The touch panel according to claim 6,
wherein a taper angle of a side surface of the first structure body and a taper angle of a side surface of the second structure body are greater than 90 degrees.

8. The touch panel according to claim 6,
wherein the first structure body and the second structure body have an insulating property.

9. The touch panel according to claim 6,
wherein the first structure body and the second structure body have conductivity.

* * * * *